(12) United States Patent
Dearden et al.

(10) Patent No.: US 12,294,227 B2
(45) Date of Patent: *May 6, 2025

(54) METHOD AND APPARATUS FOR PRE-ALIGNMENT OF AN AUTOMATICALLY ALIGNING MAGNETIC FIELD SYSTEM

(71) Applicant: THE ALFRED E. MANN FOUNDATION FOR SCIENTIFIC RESEARCH, Valencia, CA (US)

(72) Inventors: Brian Dearden, Pasadena, CA (US); Brian Shelton, Ventura, CA (US); Leslie G. Farkas, Ventura, CA (US)

(73) Assignee: The Alfred Mann Foundation for Scientific Research, Valencia, CA (US)

( * ) Notice: Subject to any disclaimer, the term of this patent is extended or adjusted under 35 U.S.C. 154(b) by 3 days.

This patent is subject to a terminal disclaimer.

(21) Appl. No.: 18/153,991

(22) Filed: Jan. 12, 2023

(65) Prior Publication Data

US 2023/0238833 A1 Jul. 27, 2023

Related U.S. Application Data

(60) Provisional application No. 63/299,165, filed on Jan. 13, 2022.

(51) Int. Cl.
*H02J 50/40* (2016.01)
*G01P 15/02* (2013.01)
(Continued)

(52) U.S. Cl.
CPC ............ *H02J 50/402* (2020.01); *G01P 15/02* (2013.01); *G01R 19/0092* (2013.01);
(Continued)

(58) Field of Classification Search
CPC ... A61N 1/37223; A61N 1/3787; G01P 15/02; G01R 19/0092; H02J 50/10; H02J 50/12;
(Continued)

(56) References Cited

U.S. PATENT DOCUMENTS 6,504,369 B1 1/2003 Varjo et al.
7,126,450 B2 10/2006 Baarman et al.
(Continued)

FOREIGN PATENT DOCUMENTS

EP 3 018 797 A1 5/2016
KR 10-2014-0129930 A 11/2014
(Continued)

OTHER PUBLICATIONS

International Search Report and Written Opinion issued in related International Application No. PCT/US2021/057772, mailed Feb. 8, 2022, 12 pages.
(Continued)

*Primary Examiner* — Levi Gannon
(74) *Attorney, Agent, or Firm* — Womble Bond Dickinson (US) LLP

(57) ABSTRACT

A wireless power transfer system includes a wireless power transfer device configured to determine a magnetic field, from among a plurality of directionally different potential magnetic fields that the wireless power transfer device is configured to generate, that has, at a receiver coil of an electronic device, a direction aligned with the receiver coil.

32 Claims, 33 Drawing Sheets

(51) Int. Cl.
*G01R 19/00* (2006.01)
*H02J 50/12* (2016.01)
*H02J 50/80* (2016.01)
*H02J 50/90* (2016.01)

(52) U.S. Cl.
CPC .............. *H02J 50/12* (2016.02); *H02J 50/80* (2016.02); *H02J 50/90* (2016.02)

(58) Field of Classification Search
CPC .......... H02J 50/40; H02J 50/402; H02J 50/80; H02J 50/90
See application file for complete search history.

(56) References Cited

U.S. PATENT DOCUMENTS

| | | | |
|---|---|---|---|
| 7,286,881 B2 | 10/2007 | Schommer et al. | |
| 7,525,283 B2 | 4/2009 | Cheng et al. | |
| 8,138,875 B2 | 3/2012 | Baarman et al. | |
| 8,460,816 B2 | 6/2013 | Julstrom et al. | |
| 9,855,436 B2 | 1/2018 | Dearden et al. | |
| 9,962,085 B2 | 5/2018 | Griffith | |
| 10,348,116 B2 | 7/2019 | Arendarik | |
| 10,374,460 B2* | 8/2019 | Oshima | H02J 50/005 |
| 10,403,979 B2* | 9/2019 | Ryu | H01Q 7/00 |
| 10,566,853 B2 | 2/2020 | Chen | |
| 10,650,963 B2 | 5/2020 | Hanabusa et al. | |
| 10,811,186 B2 | 10/2020 | Hanabusa et al. | |
| 10,960,219 B2 | 3/2021 | Aghassian et al. | |
| 11,192,276 B2 | 12/2021 | Lopatin et al. | |
| 2003/0090434 A1 | 5/2003 | Masudaya | |
| 2011/0046438 A1* | 2/2011 | Iwaisako | H02J 50/402 600/101 |
| 2011/0084654 A1 | 4/2011 | Julstrom et al. | |
| 2012/0153893 A1 | 6/2012 | Schatz et al. | |
| 2012/0169139 A1* | 7/2012 | Kudo | H02J 50/12 307/104 |
| 2012/0235501 A1 | 9/2012 | Kesler et al. | |
| 2012/0306282 A1 | 12/2012 | Tan et al. | |
| 2013/0093253 A1 | 4/2013 | Norconk et al. | |
| 2013/0241308 A1 | 9/2013 | Bilbrey et al. | |
| 2014/0232330 A1 | 8/2014 | Robertson et al. | |
| 2015/0188365 A1 | 7/2015 | Wang et al. | |
| 2016/0134126 A1* | 5/2016 | Tillotson | H04B 5/263 307/104 |
| 2016/0365737 A1 | 12/2016 | Vladan | |
| 2017/0018971 A1 | 1/2017 | Oshima et al. | |
| 2017/0202467 A1* | 7/2017 | Zitnik | A61N 1/3787 |
| 2017/0222483 A1 | 8/2017 | Feng et al. | |
| 2017/0352475 A1 | 12/2017 | Ishida | |
| 2017/0354344 A1 | 12/2017 | Schmale et al. | |
| 2018/0019624 A1 | 1/2018 | Chen | |
| 2018/0048177 A1 | 2/2018 | Huang et al. | |
| 2018/0212451 A1 | 7/2018 | Schmidt et al. | |
| 2018/0254671 A1 | 9/2018 | Murata et al. | |
| 2018/0262037 A1* | 9/2018 | Meskens | H02J 50/10 |
| 2018/0286578 A1 | 10/2018 | Hanabusa et al. | |
| 2018/0287435 A1* | 10/2018 | Wilson | H02J 50/90 |
| 2018/0358815 A1 | 12/2018 | Li et al. | |
| 2019/0089187 A1 | 3/2019 | Konomi | |
| 2019/0214851 A1* | 7/2019 | Sasaki | H01F 38/14 |
| 2019/0247669 A1 | 8/2019 | Nielsen et al. | |
| 2019/0263057 A1 | 8/2019 | Beetz | |
| 2019/0308514 A1* | 10/2019 | Parimi | H02J 50/40 |
| 2019/0311848 A1* | 10/2019 | Chen | H01F 38/14 |
| 2019/0331937 A1 | 10/2019 | Owens et al. | |
| 2019/0331938 A1 | 10/2019 | Owens et al. | |
| 2019/0348863 A1 | 11/2019 | De Masi et al. | |
| 2019/0393710 A1 | 12/2019 | Kim et al. | |
| 2020/0027653 A1 | 1/2020 | Terauchi et al. | |
| 2020/0076241 A1 | 3/2020 | Tandai et al. | |
| 2020/0136435 A1 | 4/2020 | Mitomo et al. | |
| 2020/0204013 A1 | 6/2020 | Chen | |
| 2021/0001131 A1 | 1/2021 | Lyer et al. | |
| 2021/0027928 A1 | 1/2021 | Patel | |
| 2021/0083634 A1* | 3/2021 | Aldhaher | H02J 50/10 |
| 2021/0152027 A1 | 5/2021 | Kanakasabai et al. | |
| 2022/0060057 A1* | 2/2022 | Hao | H02J 50/005 |
| 2023/0077596 A1 | 3/2023 | Hurwitz et al. | |

FOREIGN PATENT DOCUMENTS

| | | |
|---|---|---|
| KR | 2014 0129930 A | 11/2014 |
| WO | WO 2012/166126 A1 | 12/2012 |
| WO | WO 2021/031444 A1 | 2/2021 |
| WO | WO 2023/177996 A1 | 9/2023 |

OTHER PUBLICATIONS

Finkenzeller, Klaus, "Battery powered tags for ISO/IEC 14443, actively emulating load Modulation", *RFID SysTech 2011 7th European Workshop on Smart Objects: Systems, Technologies and Applications*(2011), retrieved from http://www.rfid-handbook.de/downloads/Active-load-modulation_Finkenzeller_20110413_final.pdf (retrieved on Mar. 7, 2022), 8 pages.
Written Opinion issued in related International Application No. PCT/US2021/057772, date of mailing Jun. 30, 2022, 6 pages.
Zhangwei Chen et al., 3D printing of ceramics: A review, Journal of the European Ceramic Society, Nov. 6, 2018, 27 pages.
Thomas Hanemann et al., 3D Printing of ABS Barium Ferrite Composites, Materials, Mar. 24, 2020, 13 pages.
Lanbing Liu et al., UV-curable Ferrite Paste for Additive Manufacturing of Power Magnetics, IEEE Magnetics Letters, 2018, 5 pages.
Maria Väätäjä et al., 3D printed dielectric ceramic without a sintering stage, Scientific Reports, Oct. 29, 2018, 8 pages.
Yunqi Wang et al., 3D Printing of NiZn ferrite/ABS Magnetic Composites for Electromagnetic Devices, Cambridge University Press, Jul. 1, 2015, 5 pages.
International Preliminary Report on Patentability issued in related International Application No. PCT/US2021/057772, date of mailing Mar. 6, 2023, 6 pages.
International search Report and Written Opinion issued in related International Application No. PCT/US2023/060586, Apr. 21, 2023 (15 pages).
International Search Report and Written Opinion from related International Application PCT/US2023/063871, dated Jun. 21, 2023, 17 pages.

* cited by examiner

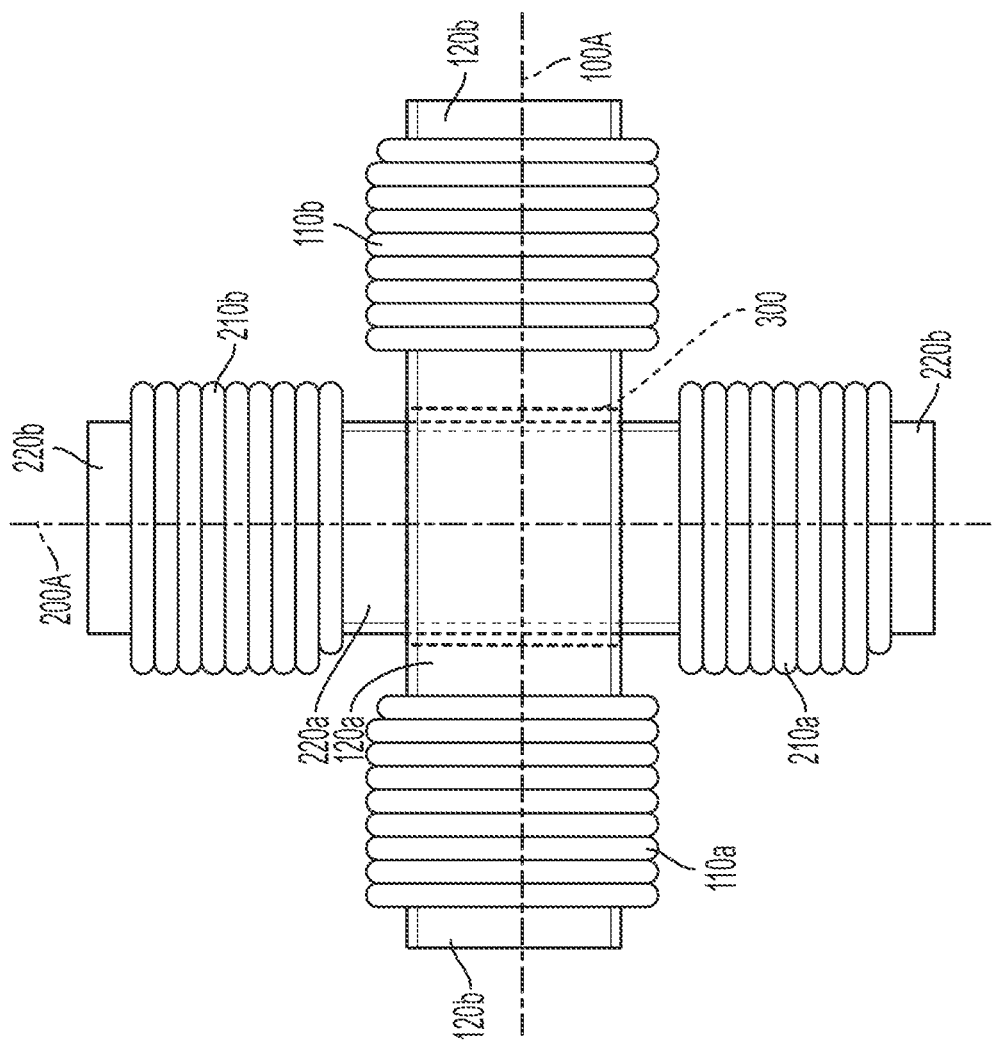
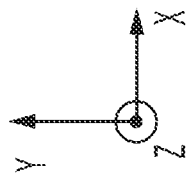
FIG. 3

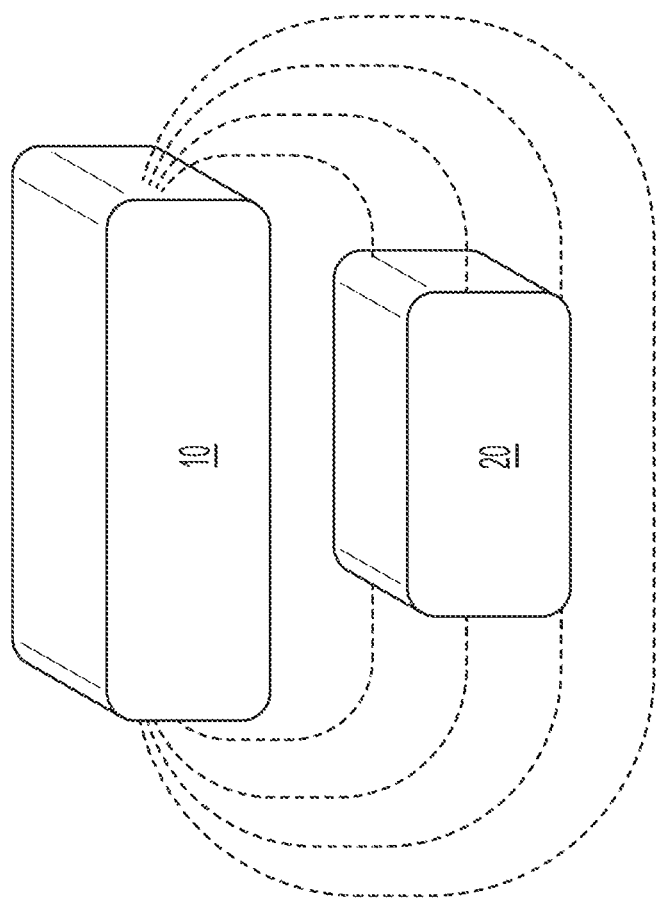

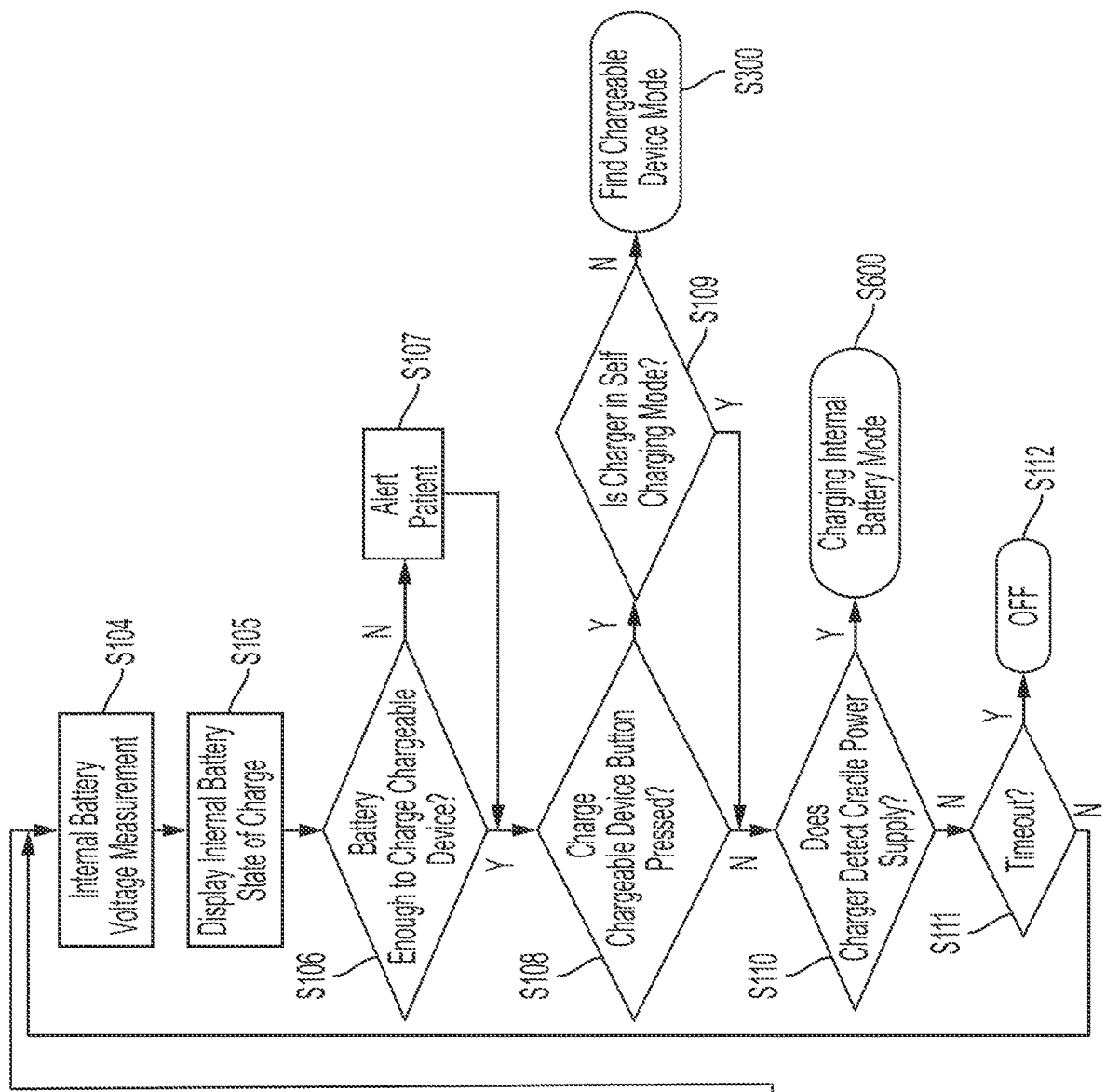
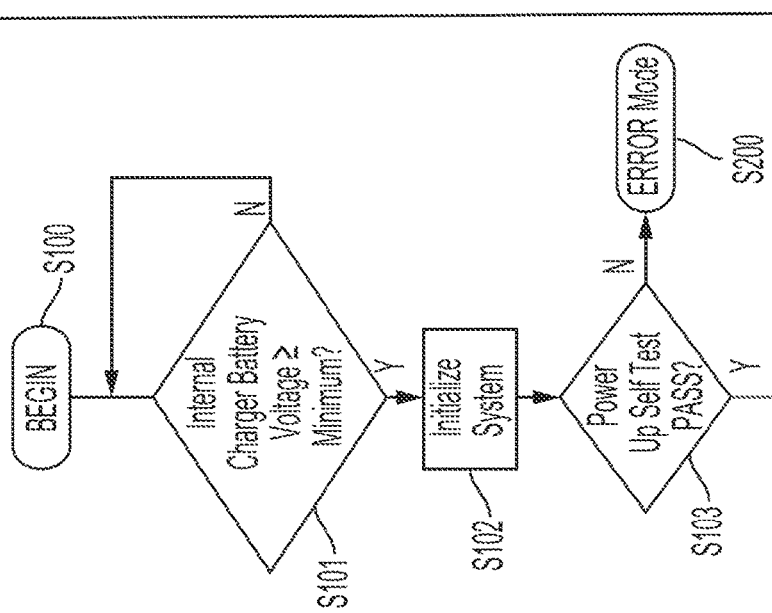
FIG. 8

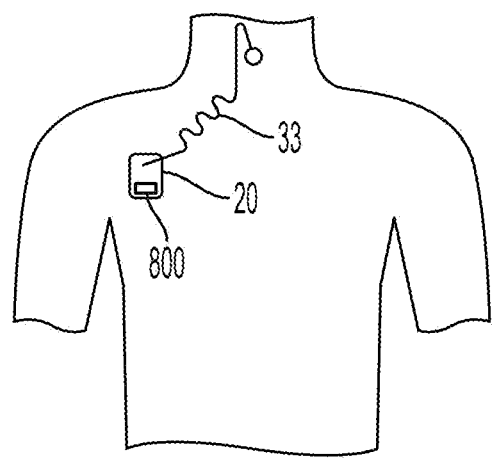 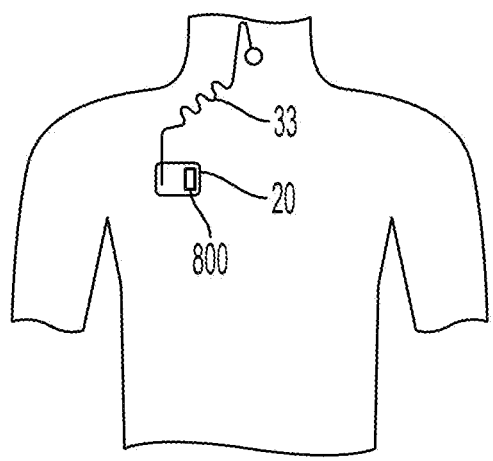
FIG. 31   FIG. 32
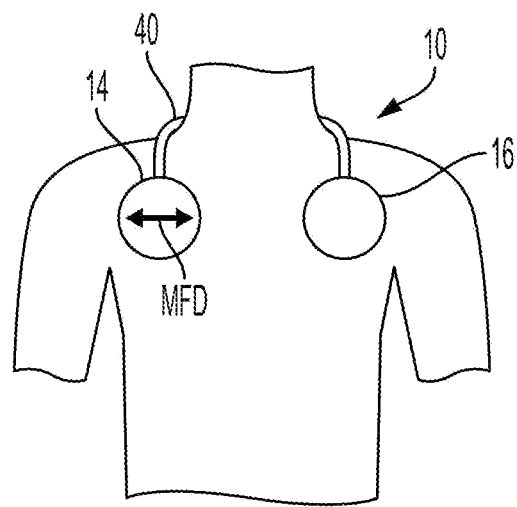 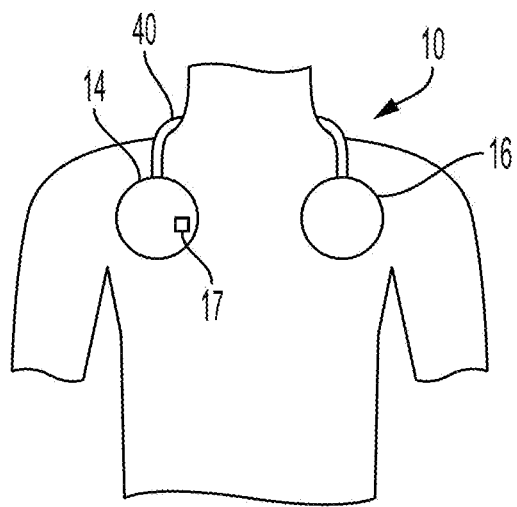
FIG. 33   FIG. 34

METHOD AND APPARATUS FOR PRE-ALIGNMENT OF AN AUTOMATICALLY ALIGNING MAGNETIC FIELD SYSTEM

CROSS-REFERENCE TO RELATED APPLICATIONS

This application claims priority to and the benefit of U.S. Provisional Application No. 63/299,165, filed Jan. 13, 2022, the entire content of which is hereby incorporated by reference.

This application is related to U.S. Non-provisional application Ser. No. 17/517,518, filed on Nov. 2, 2021, and to U.S. Provisional Application No. 63/321,554, filed Mar. 18, 2022, the entire content of each of which is hereby incorporated by reference.

BACKGROUND

1. Field

The present disclosure relates to a wireless power transfer device configured to generate a magnetic field and control a direction of the magnetic field.

2. Description of the Related Art

A primary coil may be driven with AC current to generate an oscillating magnetic field, and the magnetic field can generate a current in a secondary coil in proximity to the primary coil via electromagnetic induction. Electromagnetic induction can be utilized to wirelessly transfer energy and is utilized in one or more suitable industries and devices such as electric vehicles, medical devices, and electronic devices. The magnitude of the current generated in the secondary coil, and thus the effectiveness of the primary coil in transferring energy to the secondary coil, depends on how aligned the magnetic field is with the secondary coil. However, in related art devices, the primary coil cannot control the direction of the magnetic field, and improving alignment between the magnetic field with the secondary coil requires physically moving and/or orientating the primary coil or the secondary coil, which may be inconvenient and cumbersome. Additionally, improving the speed of aligning the magnetic field with the secondary coil is beneficial to improve efficiency, reduce the likelihood of errors during operation, and avoid frustrating a user. The primary coil in related art devices also generates a magnetic field that generates eddy currents in electronic components in the proximity of the primary coil, thereby reducing the efficiency of the primary coil to transfer energy to the secondary coil.

SUMMARY

The present disclosure relates to one or more suitable embodiments of a wireless power transfer system including a wireless power transfer device. In one embodiment, the wireless power transfer system includes: a wireless power transfer device, the wireless power transfer device including: a first transmitting coil oriented along a first axis, a second transmitting coil on the first transmitting coil, oriented along a second axis different from the first axis, and magnetically decoupled from the first transmitting coil in an area of overlap between the first and second transmitting coils, and a controller configured to differentially control driving of the first and second transmitting coils, wherein the controller is configured to determine an amplitude ratio such that, in response to the first transmitting coil being driven with a first current having a first amplitude, the second transmitting coil being driven with a second current having a second amplitude, and a ratio of the first amplitude to the second amplitude is the amplitude ratio, the wireless power transfer device generates a magnetic field having a direction, at a receiver coil of an electronic device, that is aligned with the receiver coil.

The present disclosure relates to one or more suitable embodiments of a wireless power transfer system include a wireless power transfer device. In one embodiment, the wireless power transfer system, includes: a wireless power transfer device configured: to determine a magnetic field, from among a plurality of directionally different potential magnetic fields that the wireless power transfer device is configured to generate, that has, at a receiver coil of an electronic device, a direction aligned with the receiver coil, and to selectively generate the magnetic field.

The present disclosure relates to one or more suitable embodiments method of transferring power from a wireless power transfer device to an electronic device. In one embodiment, the method includes: determining, by a wireless power transfer device, a magnetic field from among a plurality of directionally different potential magnetic fields that the wireless power transfer device is configured to generate that has, at a receiver coil of an electronic device, a direction aligned with the receiver coil; and selectively generating, by the wireless power transfer device, the magnetic field to wirelessly transfer power to the electronic device via the magnetic field.

This summary is provided to introduce a selection of features and concepts of embodiments of the present disclosure that are further described below in the detailed description. This summary is not intended to identify key or essential features of the claimed subject matter, nor is it intended to be utilized in limiting the scope of the claimed subject matter.

BRIEF DESCRIPTION OF THE DRAWINGS

The accompanying drawings, together with the specification, illustrate example embodiments of the present disclosure. These drawings, together with the description, serve to better explain aspects and principles of the present disclosure.

FIG. 3 shows a plan view of the first and second transmitting coils of FIG. 2.

FIG. 6B shows a schematic side view of the wireless power transfer system of FIG. 6A with the wireless power transfer device above the electronic device.

FIG. 8 shows a method flow chart for an initialization mode according to some embodiments.

FIG. 31 shows an electronic device implanted in a body according to an embodiment.

FIG. 32 shows an electronic device implanted in a body according to another embodiment.

FIG. 33 shows a wireless power transfer device coupled to a body according to an embodiment.

FIG. 34 shows a wireless power transfer device coupled to a body according to another embodiment.

DETAILED DESCRIPTION

Figure 1:
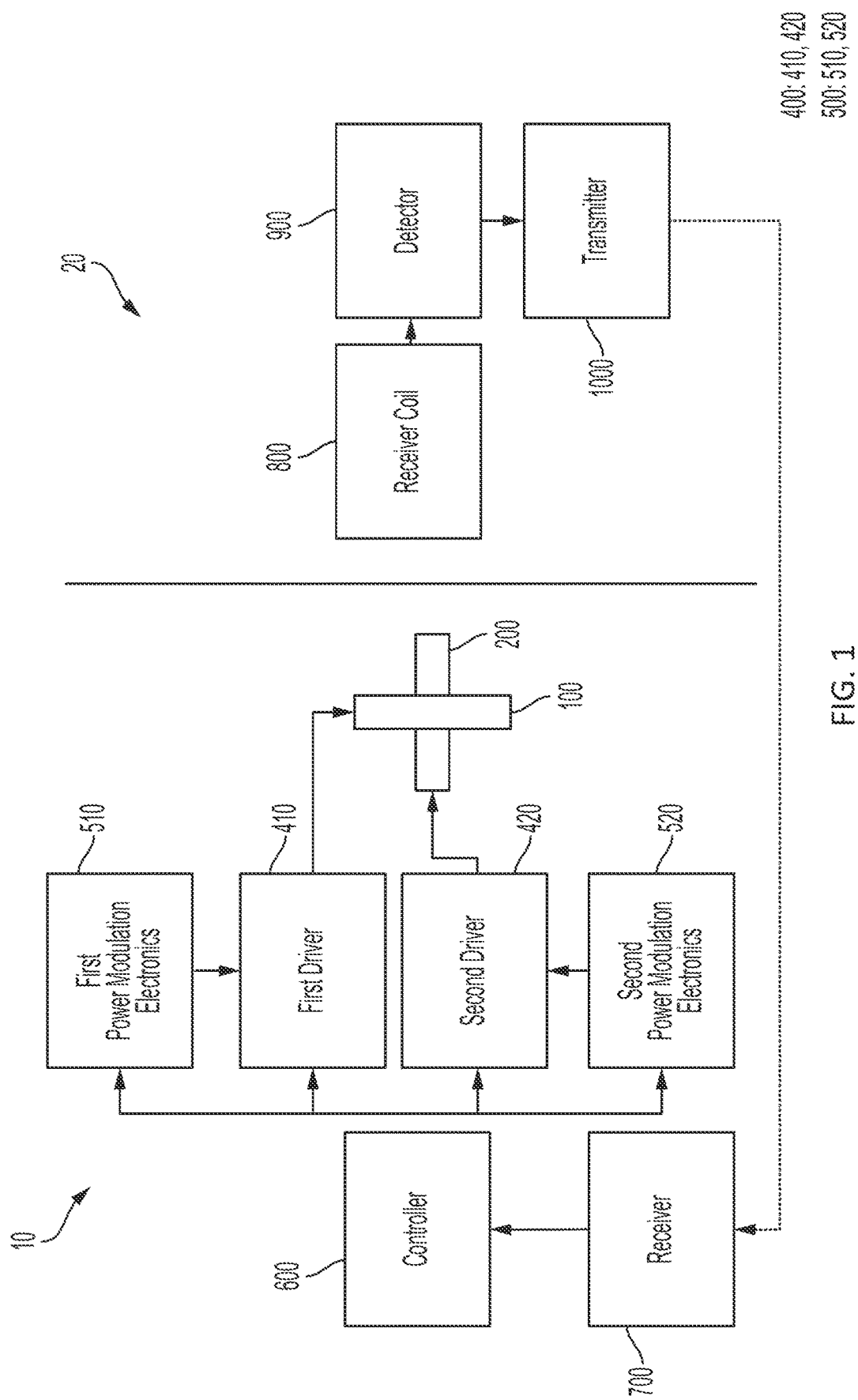
FIG. 1 shows a schematic view of a wireless power transfer system according to some embodiments.

The terminology utilized herein is for the purpose of describing particular embodiments only and is not intended to be limiting of the present disclosure. As utilized herein, the singular forms "a", "an" and "the" are intended to include the plural forms as well, unless the context clearly indicates otherwise. As utilized herein, the term "and/or" includes any and all combinations of one or more of the associated listed items.

It will be understood that, although the terms "first", "second", "third", etc., may be utilized herein to describe various elements, components, regions, layers and/or sections, these elements, components, regions, layers and/or sections should not be limited by these terms. These terms are only utilized to distinguish one element, component, region, layer or section from another element, component, region, layer or section. Thus, a first element, component, region, layer or section discussed below could be termed a second element, component, region, layer or section, without departing from the spirit and scope of the present disclosure.

It will be understood that when an element or layer is referred to as being "on", "connected to", "coupled to", or "adjacent to" another element or layer, it can be directly on, connected to, coupled to, or adjacent to the other element or layer, or one or more intervening element(s) or layer(s) may be present. In contrast, when an element or layer is referred to as being "directly on," "directly connected to", "directly coupled to", or "immediately adjacent to" another element or layer, there are no intervening elements or layers present.

As utilized herein, the term "substantially" and similar terms are utilized as terms of approximation and not as terms of degree, and are intended to account for the inherent deviations in measured or calculated values that would be recognized by those of ordinary skill in the art. Also, the terms "about," "approximately," and similar terms, when utilized herein in connection with a numerical value or a numerical range, are inclusive of the stated value and mean within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Example embodiments of the present disclosure will now be described with reference to the accompanying drawings. In the drawings, the same or similar reference numerals refer to the same or similar elements throughout. As utilized herein, the use of the term "may," when describing embodiments of the present disclosure, refers to "one or more embodiments of the present disclosure."

FIG. 1 schematically illustrates a wireless power transfer system according to some embodiments. The wireless power transfer system may include a wireless power transfer device 10 and an electronic device 20.

The wireless power transfer device 10 may include a first transmitting coil 100, a second transmitting coil 200 on (e.g., positioned on) the first transmitting coil 100, a driver 400 configured to drive the first transmitting coil 100 with a first AC current and the second transmitting coil 200 with a second AC current, power modulation electronics 500 configured to modulate the first and second AC currents provided by the driver 400, a controller 600 (e.g., a microcontroller) configured to control the operations of the driver 400 and the power modulation electronics 500, and a receiver 700 for receiving information (e.g., information transmitted by the electronic device 20).

The electronic device 20 may include a receiver coil 800, a detector 900 configured to detect information about power received in the receiver coil 800, and a transmitter 1000 configured to transmit information (e.g., transmit information to the wireless power transfer device 10). In some embodiments, the transmitter 1000 may be a radio or an RF transmitter.

The wireless power transfer device 10 may be configured to generate an oscillating magnetic field by driving the first and second transmitting coils 100 and 200 with the first and second AC currents, respectively, and to rotate the direction of the magnetic field by controlling (e.g., setting or adjusting) a first magnitude of the first AC current, a second magnitude of the second AC current, and a phase difference between the first and second AC currents (e.g., the wireless power transfer device 10 is configured to rotate the direction of the magnetic field by differentially driving the first and second transmitting coils 100 and 200). When the wireless power transfer device 10 generates the magnetic field and the electronic device 20 is in the proximity to the wireless power transfer device 10, a current may be generated in the receiver coil 800 by electromagnetic induction (e.g., wireless resonant induction). The detector 900 may be configured to detect information (e.g., power, amplitude, etc.) about the current generated in the receiver coil 800, and the transmitter 1000 may be to transmit (e.g., wirelessly transmit) the detected information to outside of the electronic device 20, for example, to the receiver 700 of the wireless power transfer device 10. The controller 600 may control the driver 400 and the power modulation electronics 500 based on the information received by the receiver 700 to control the direction of the magnetic field at the receiver coil 800.

Figure 2:
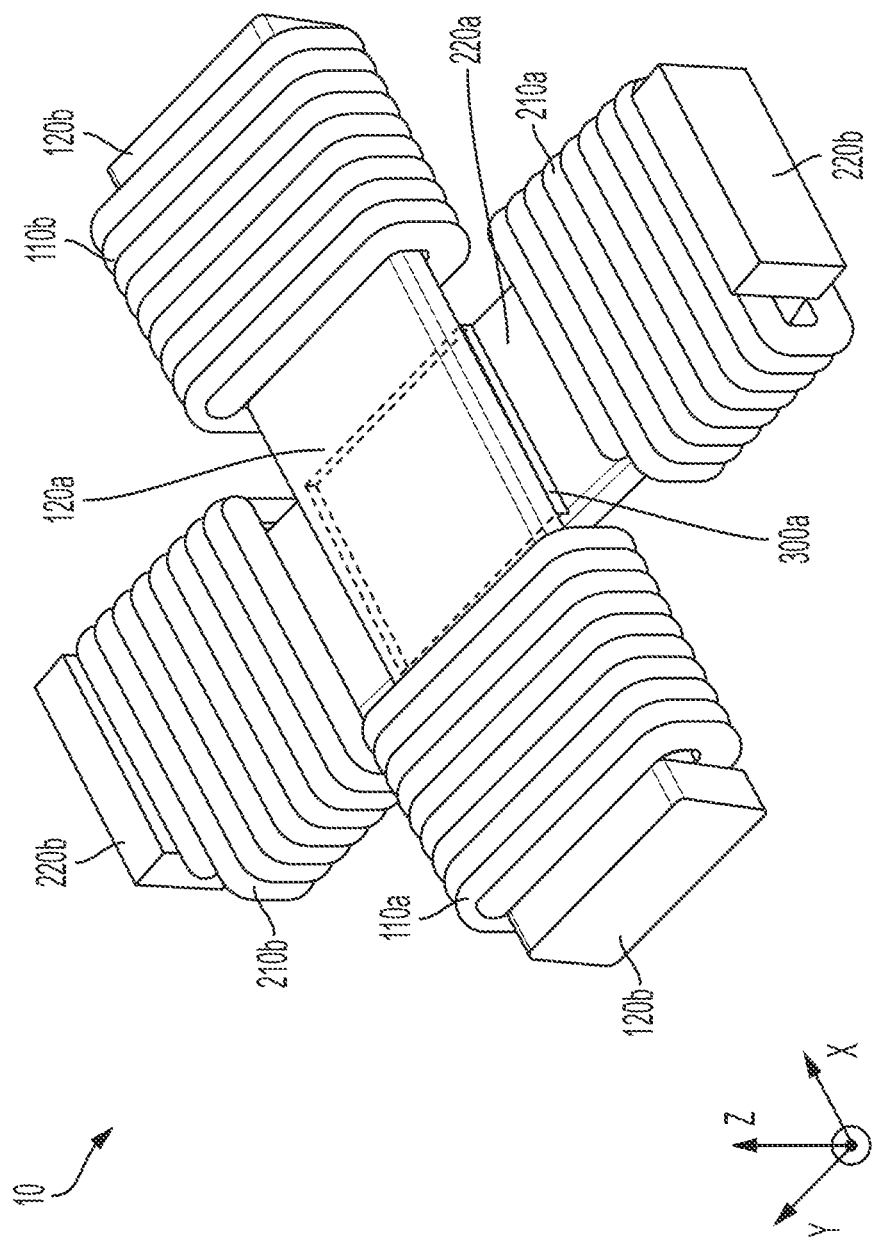
FIG. 2 shows a perspective view of first and second transmitting coils of a wireless power transfer device according to some embodiments.
Figure 4:
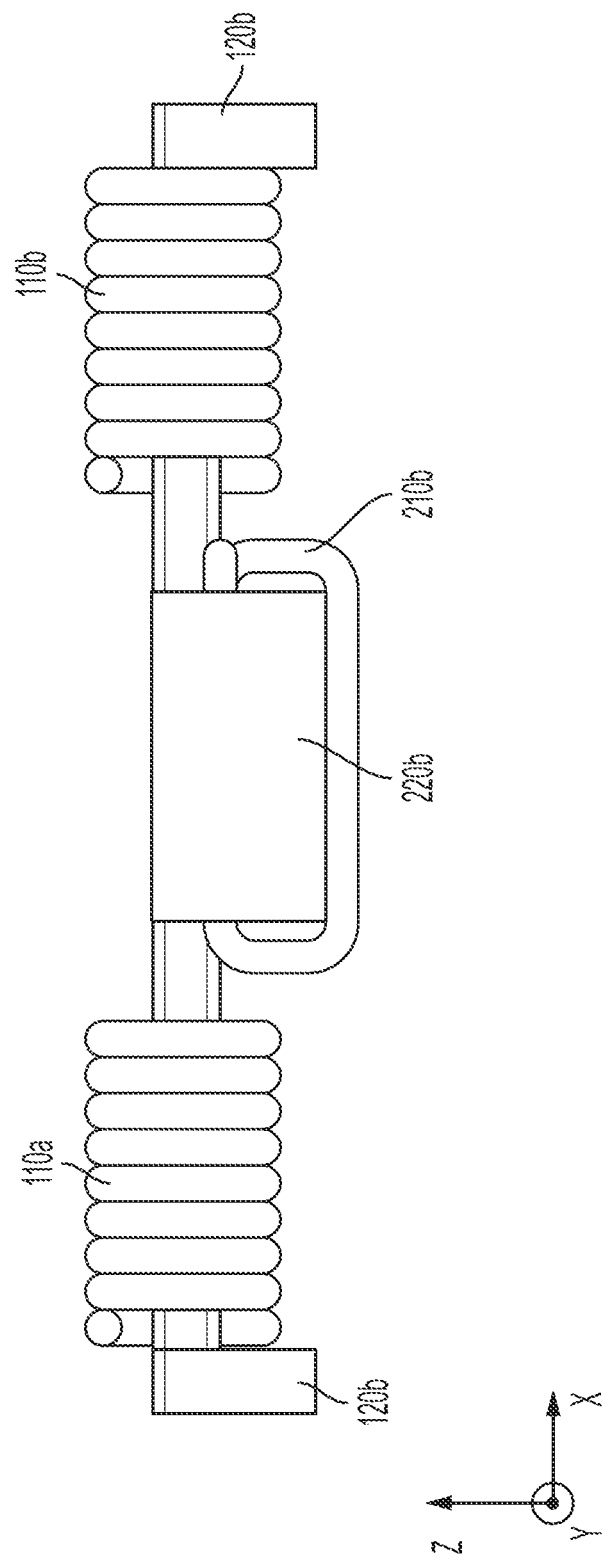
FIG. 4 shows a side view of the first and second transmitting coils of FIG. 2.

The first and second transmitting coils 100 and 200 will now be described in more detail with reference to FIGS. 2-4. FIG. 2 shows a perspective view of the first and second transmitting coils 100 and 200 according to some embodiments, FIG. 3 shows a plan view of the first and second transmitting coils 100 and 200 of FIG. 2, and FIG. 4 shows a side view of the first and second transmitting coils 100 and 200 of FIG. 2.

The first transmitting coil 100 may include a first rod 120 and a first wire 110 wound around the first rod 120, and the second transmitting coil 200 may include a second rod 220 and a second wire 210 wound around the second rod 220.

The first transmitting coil 100 may be aligned along a first axis 100A, and the second transmitting coil 200 may be aligned along a second axis 200A different from the first axis 100A. In some embodiments, the second axis 200A is perpendicular (or substantially perpendicular) to the first axis 100A. For example, an angle between the second axis 200A and the first axis 100A may be approximately (about) 90°. When the first and second axes 100A and 200A are perpendicular, coupling between the first and second transmitting coils 100 and 200 may be reduced or substantially prevented. Coupling between the first and second transmitting coils 100 and 200 may be at a maximum when the first and second axes 100A and 200A are parallel, and coupling between the first and second transmitting coils 100 and 200 may decrease as an angle between the first and second axes 100A and 200A increases towards 90°, at which point coupling is at a minimum. However, the angle between the first axis 100A and the second axis 200A may be any suitable angle, for example, within the range of about 45° to about 90°. In FIGS. 2-4, the first axis 100A is shown as being aligned along an X-axis, and the second axis 200A is shown as being aligned along a Y-axis.

The second transmitting coil 200 may be on (e.g., above) the first transmitting coil 100 and may overlap the first transmitting coil 100 in a plan view (shown in FIG. 3) at an area of overlap 300. In some embodiments, the area of overlap 300 corresponds to a center region of the first transmitting coil 100 and a center region of the second transmitting coil 200. The second transmitting coil 200 may be spaced apart (e.g., separated) from the first transmitting coil 100 in a thickness direction (e.g., a Z-axis direction) at the area of overlap 300.

An intermediate space 300a between the first and second transmitting coils 100 and 200 in the area of overlap 300 may include (e.g., be filled or at least partially filled with) a nonmagnetic material having a low permeability, for example, air, plastic, foam, one or more non-ferrimagnetic materials, one or more low permeability metals (e.g., aluminum and/or copper), etc. In some embodiments, when the intermediate space 300a is filled with air, a frame or housing may be utilized to hold the first and second transmitting coils 100 and 200 and/or to maintain the relative positions of the first and second transmitting coils 100 and 200 with respect to each other. In some embodiments, the material in the intermediate space 300a has a relative permeability of equal to or less than about 5, for example, in the range of about 1 to about 1.5. In some embodiments, the material in the intermediate space 300a may be diamagnetic (e.g., a material having a relative permeability in the range of about 0 to about 1). Therefore, in some embodiments, the second transmitting coil 200 does not contact the first transmitting coil 100, and the first and second transmitting coils 100 and 200 are magnetically independent (e.g., magnetically decoupled and/or magnetically isolated from each other) and/or electrically independent (e.g., electrically decoupled and/or electrically isolated) from each other. Because the first and second transmitting coils 100 and 200 are not in contact, coupling between the first and second transmitting coils 100 and 200 may be reduced or substantially prevented. For example, the first transmitting coil 100 may generate a first magnetic field without being significantly influenced by the presence of the second transmitting coil 200, and the second transmitting coil 200 may generate a second magnetic field without being significantly influenced by the presence of the first transmitting coil 100. A magnetic field generated by the wireless power transfer device 10 may be a superposition of the first and second magnetic fields generated by the first and second transmitting coils 100 and 200, respectively.

The first rod 120 may include a magnetic material having a high permeability, such as a ferrimagnetic material (e.g., soft ferrite material), such as nickel- or manganese-based ferrites (e.g., MnZn, NiZn, and/or the like). The magnetic material may increase the intensity of a magnetic field generated by the first transmitting coil 100 compared to an otherwise comparable coil without the magnetic rod. In some embodiments, the material of the first rod 120 may have a relative permeability equal to or greater than about 5, for example, in the range of about 10 to about 10,000. The second rod 220 may include any material that the first rod 120 may include, and the second rod 220 may include a material that is the same as, or different from, a material included in the first rod 120. In some embodiments, a ratio of the permeability of a material in the first rod 120 to the permeability of the material in the intermediate space 300a may be equal to or greater than approximately (about) 5. When the permeability of the materials of the first and second rods 120 and 220 are significantly larger than the permeability of the material in the intermediate space 300a, coupling between the first and second transmitting coils 100 and 200 may be reduced or substantially prevented. For example, a magnetic field flowing through the first rod 120 may be blocked (by the material in the intermediate space 300a) from permeating through the intermediate space 300a and into the magnetic material of the second rod 220. Thus, the presence of the second transmitting coil 200 may not substantially affect the first magnetic field generated by the first transmitting coil 100, and vice versa.

The first rod 120 may include a material based on a frequency of an AC current to be driven through the first wire 110 (e.g., the designed or intended operational frequency of the first and/or second coils 100 and 200). In some embodiments, the first rod 120 may include a material (e.g., MnZn ferrite) having a relative permeability within the range of about 1000 to about 4000 when the frequency of the AC current to be driven through the first wire 110 is within the range of about 100 kHz to about 1 MHz. In some embodiments, the first rod 120 may include a material (e.g., NiZn ferrite) having a relative permeability within the range of about 10 to about 200 when the frequency of the AC current to be driven through the first wire 110 is above about 1 MHz.

In some embodiments, the first rod 120 may include a material having a relative permeability within the range of about 2300 to about 4000. In some embodiments, the first rod 120 may include a material having low resistive, low eddy currents, low hysteresis, and/or low flux losses at the operation frequency.

In some embodiments, the wireless power transfer device 10 is to be operated (e.g., operated at normal operating conditions) so that the flux density within the first and second rods 120 and 220 is operated or controlled (e.g., set) to be within the substantially linear region of a BH curve of the material included in the first rod 120 and/or the second rod 220. When the wireless power transfer device 10 is operated above this region, losses may increase, system efficiency may be reduced, and a desired intensity of the magnetic field may not be generated due to nonlinear increases in losses in the first rod 120 and/or the second rod 220 lowering the first coil 100 and/or the second coil's 200 quality factor. This will distort the directionality of the combined magnetic field of the first and second coils 100 and 200.

Because the first and second rods 120 and 220, and a rod of the receiver coil 800, may be rods rather than closed magnetic cores, such as in transformers, the effective permeability of the rods may be far lower than the manufacturer specified initial permeability of the material(s) of the rods. A rod with a low length to width (e.g., diameter) ratio may have a very low effective permeability. In some embodiments, the first rod 120 and/or the second rod 220 may have an effective permeability (e.g., relative effective permeability) between about 20 and about 50. However, the present disclosure is not limited thereto.

The first rod 120 may include a first main rod 120a and first thick portion (e.g., a tab or a flange) 120b at an end (e.g., both ends) of the first main rod 120a, and the second rod 220 may include a second main rod 220a and a second thick portion (e.g., a tab or a flange) 220b at an end (e.g., both ends) of the second main rod 220a. The first main rod 120a may have any suitable shape. The second main rod 220a may have any shape that the first main rod 120a may have, and the shape of the second main rod 220a may be the same as, or different from, the shape of the first main rod 120a. In some embodiments, the first main rod 120a has a cylindrical shape. In other embodiments, the first main rod 120a has a rectangular shape having a length along the X-axis, a width along the Y-axis, and a thickness along the Z-axis. The width of the first main rod 120a may be less than the length of the first main rod 120a, and the thickness of the first main rod 120a may be less than the width of the first main rod 120a, but the present disclosure is not limited thereto.

A thickness of the intermediate space 300a may be relatively small compared to the dimensions of the first and second transmitting coils 100 and 200. For example, the thickness of the intermediate space 300a may be less than the length, the width, and/or the thickness of the first main rod 120a. Because the first and second magnetic fields generated by the first and second transmitting coils 100 and 200 will each generally decrease in magnitude as respective distances from the first and second transmitting coils 100 and 200 increase, it is advantageous for the thickness of the intermediate space 300a to be small in order to minimize or at least reduce a disparity between a distance between the electronic device 20 and the first transmitting coil 100 and a distance between the electronic device 20 and the second transmitting coil 200. When the disparity is large, one of the first and second transmitting coils 100 and 200 may have an unintended disproportionate effect on the electronic device 20 compared to the other one of the first and second transmitting coils 100 and 200. Accordingly, in one or more embodiments, the thickness of the intermediate space 300a may be sufficiently small such that the first and second transmitting coils 100 and 200 are substantially coplanar to advantageously minimize or at least reduce the disproportionate effect of one of the first and second transmitting coils 100 and 200 on the electronic device 20.

In some embodiments, a thickness of the first main rod 120*a* at the area of overlap 300 is less than a thickness of the first main rod 120*a* at an area outside of the area of overlap 300. For example, the first main rod 120*a* may have an indent or recess (e.g., a step) at the area of overlap 300 that faces the second main rod 220*a*. When one or both of the first and second main rods 120*a* and 220*a* have such an indent or recess, the distance between the first and second transmitting coils 100 and 200 may be reduced. In some embodiments, the indent or recess in one or both of the first and second main rods 120*a* and 220*a* may allow the first and second wires 110 and 210 to be coplanar (or substantially coplanar).

The first thick portion 120*b* may be at an end (or end portion) of the first main rod 120*a*, and a thickness of the first thick portion 120*b* may be greater than a thickness of the first main rod 120*a*. For example, as shown in FIG. 3, the first thick portion 120*b* may protrude toward the second transmitting coil 200 (e.g., in the negative Z-axis direction). Similarly, the second thick portion 220*b* may be at an end (or end portion) of the second main rod 220*a*, and a thickness of the second thick portion 220*b* may be greater than a thickness of the second main rod 220*a*. For example, the second thick portion 220*b* may protrude toward the first transmitting coil 100 (e.g., in the Z-axis direction). For example, the second thick portion 220*b* of the second transmitting coil 200 may protrude in a direction opposite to a protruding direction of the first thick portion 120*b* of the first transmitting coil 100. Because the first and second thick portions 120*b* and 220*b* of the first and second transmitting coils 100 and 200 may protrude toward the second and first transmitting coils 200 and 100, respectively, the distance along the Z-axis direction between the ends of the first rod 120 and the ends of the second rod 220 may be reduced or eliminated, and thus, the ends of the first and second rods 120 and 220 may be substantially coplanar.

The first wire 110 may be wound around the first rod 120 in any suitable configuration. The second wire 210 may be wound around the second rod 220 in any configuration that the first wire 110 may be wound around the first rod 120. In some embodiments, the first wire 110 is wound around the first main rod 120*a* and is not wound around the first thick portion 120*b*. The first wire 110 may be wound around substantially the entire length of the first main rod 120*a*. For example, the first wire 110 and the first main rod 120*a* may form a solenoid. In some embodiments, the first wire 110 is wound around two ends (or two end portions) of the first main rod 120*a* to form first and second sub-coils 110*a* and 110*b* at the two ends (or two end portions) of the first main rod 120*a*, and the first wire 110 exposes, and is not wound around, a portion (e.g., an exposed intermediate or central portion) of the first main rod 120*a* between the first and second sub-coils 110*a* and 110*b*. The exposed portion of the first main rod 120*a* may include a portion of the first main rod 120*a* corresponding to the area of overlap 300 between the first and second transmitting coils 100 and 200. When the first wire 110 is not wound around the first main rod 120*a* at the area of overlap 300, the thickness of the first transmitting coil 100 at the area of overlap 300 may be reduced.

The first sub-coil 110*a* may be electrically coupled (e.g., electrically connected) to the second sub-coil 110*b* in series or in parallel. When the first sub-coil 110*a* is electrically coupled (e.g., electrically connected) to the second sub-coil 110*b* in series, the first wire 110 may electrically couple (e.g., electrically connect) the first sub-coil 110*a* to the second sub-coil 110*b* by extending across the area of overlap 300 on the first main rod 120*a* and on a side of the first main rod 120*a* facing away from the second transmitting coil 200.

In some embodiments, the first sub-coil 110*a* is not electrically coupled (e.g., electrically connected) to the second sub-coil 110*b*, and the first and second sub-coils 110*a* and 110*b* are separately driven. In such embodiments, the first and second sub-coils 110*a* and 110*b* may be synchronously driven so that the magnetic fields generated by the first and second sub-coils coils 110*a* and 110*b* oscillate in phase.

The wireless power transfer device 10 may generate a magnetic field by driving the first AC current through the first wire 110 and/or driving the second AC current through the second wire 210. The first and second AC currents may be driven in phase (i.e., with about 0° phase difference between the first and second AC currents) or about 180° out of phase. A direction of the magnetic field generated by the wireless power transfer device 10 may be controlled or selected by controlling (e.g., setting or changing) a first amplitude of the first AC current, a second amplitude of the second AC current, and a phase difference between the first and second AC currents (e.g., the wireless power transfer device 10 is configured to rotate the direction of the magnetic field by differentially driving the first and second transmitting coils 100 and 200). Accordingly, the direction of the magnetic field can be rotated by changing these parameters.

Figure 5A:
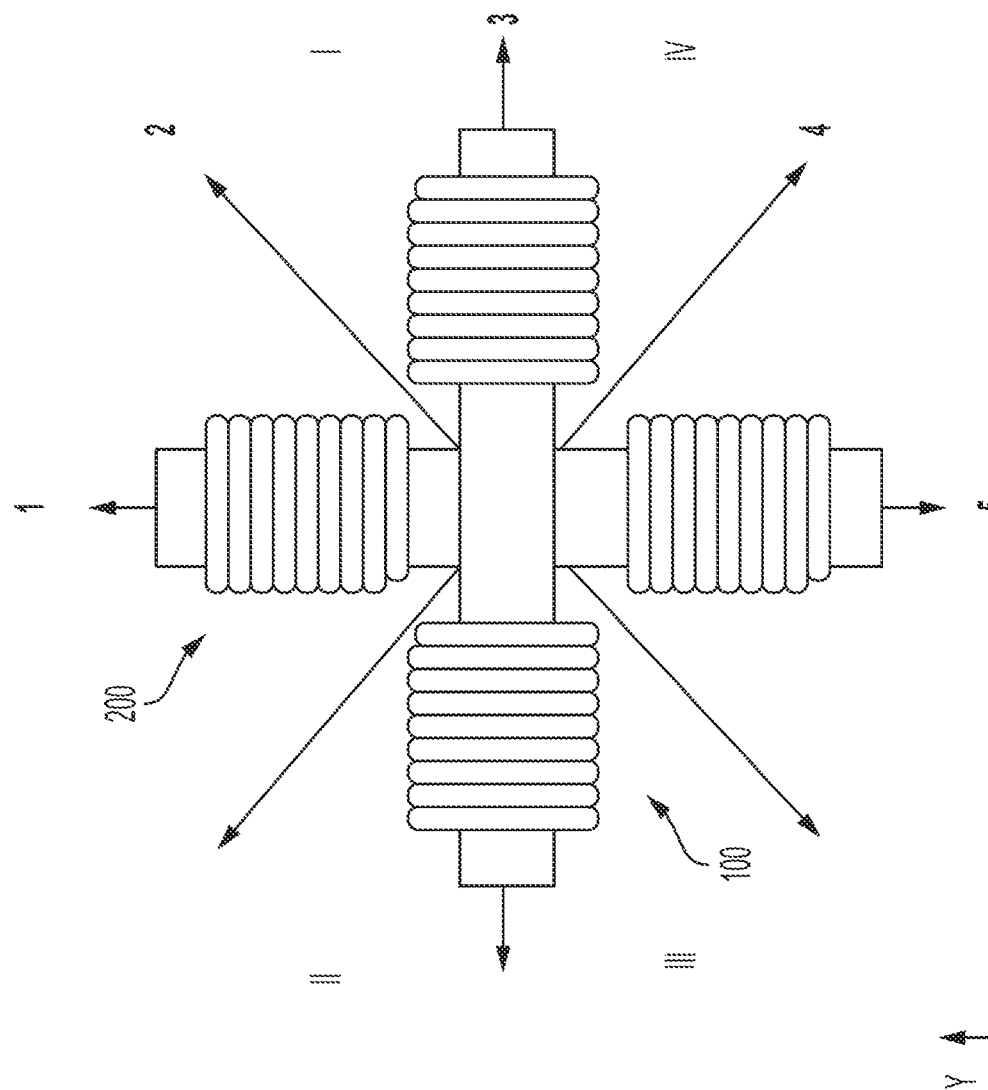
FIG. 5A shows a plan view of first and second transmitting coils of a wireless power transfer device according to some embodiments and the direction of a magnetic field generated by the first and second transmitting coils pursuant to five states in which the first and second transmitting coils may be driven.
Figure 5B:
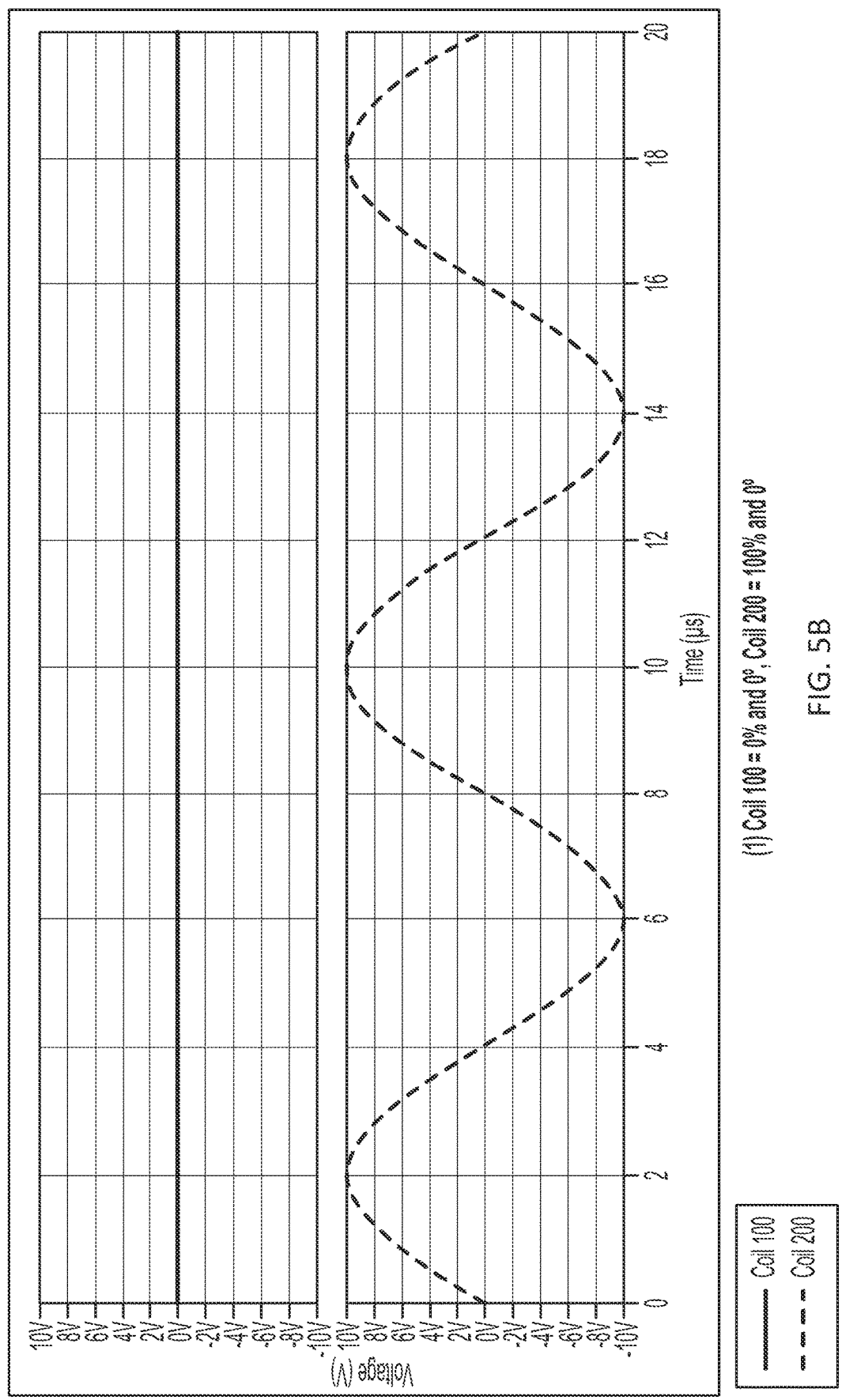
FIGS. 5B-5F show graphs of the voltages applied to the first and second transmitting coils as a function of time for the five states of FIG. 5A.

FIG. 5A shows how the direction of a magnetic field generated by the wireless power transfer device 10 can be rotated according to a non-limiting example. FIGS. 5B-5F show graphs of the voltages applied to the first and second transmitting coils 100 and 200 as a function of time for five states shown in FIG. 5A. The numerical values shown in the graphs of FIGS. 5B-5F represent non-limiting examples. Beginning with a first state (1) as shown in FIGS. 5A and 5B, the first amplitude of the first AC current of the first wire 110 is at 0, the second amplitude of the second AC of the second wire 210 current is at 10, and the direction of the magnetic field at a point above the area of overlap 300 may oscillate between the Y-axis direction and the negative Y-axis direction.

Figure 5C:
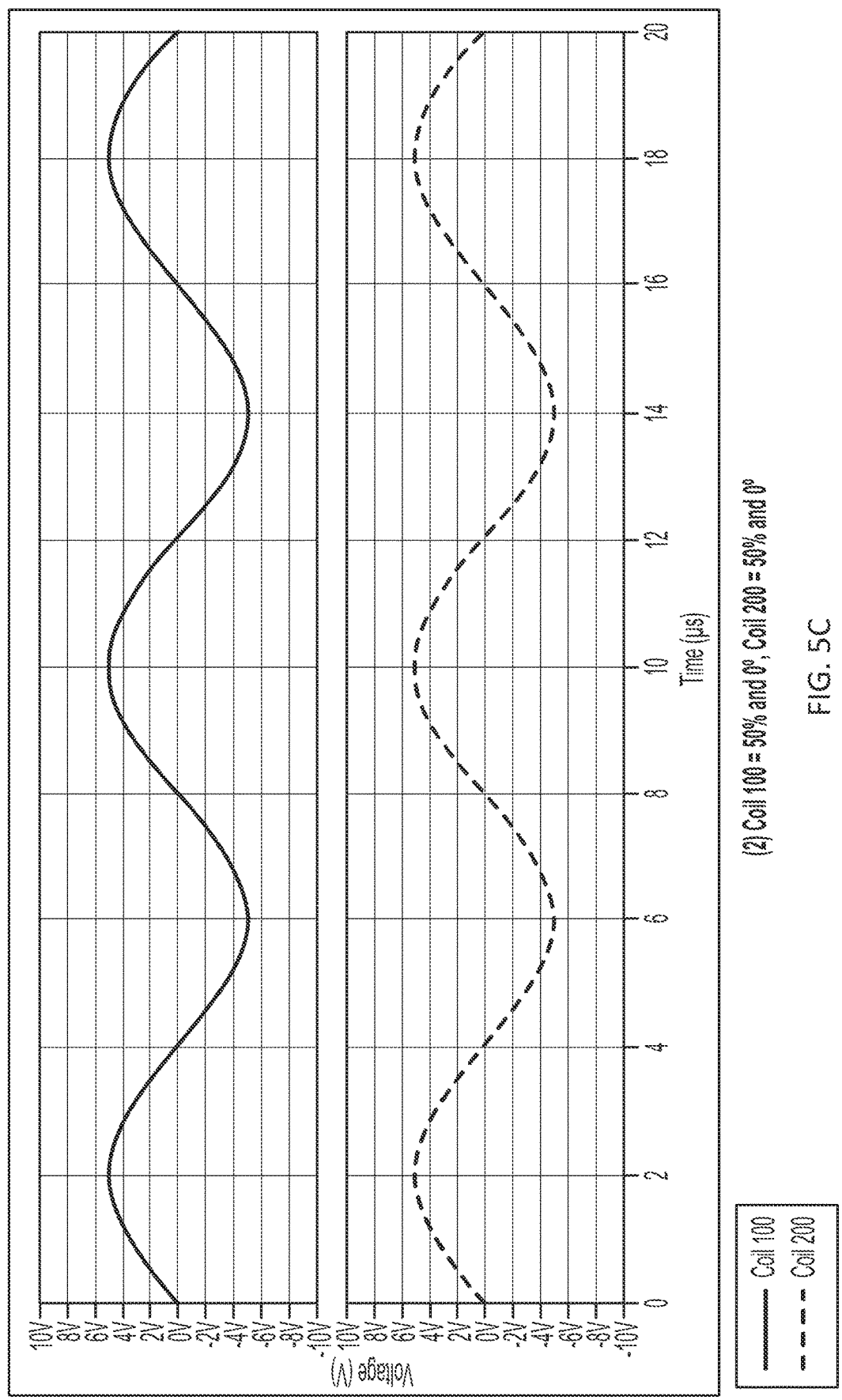

To rotate the magnetic field clockwise to a second position corresponding to a second state (2) as shown in FIGS. 5A and 5C, the first and second AC currents are driven in phase, the first amplitude is increased while the second amplitude is decreased until they are the same (each at an amplitude of 5), and the direction of the magnetic field at the point will oscillate between 45° between the X-axis direction and the Y-axis direction and 45° between the negative X-axis direction and the negative Y-axis direction.

Figure 5D:
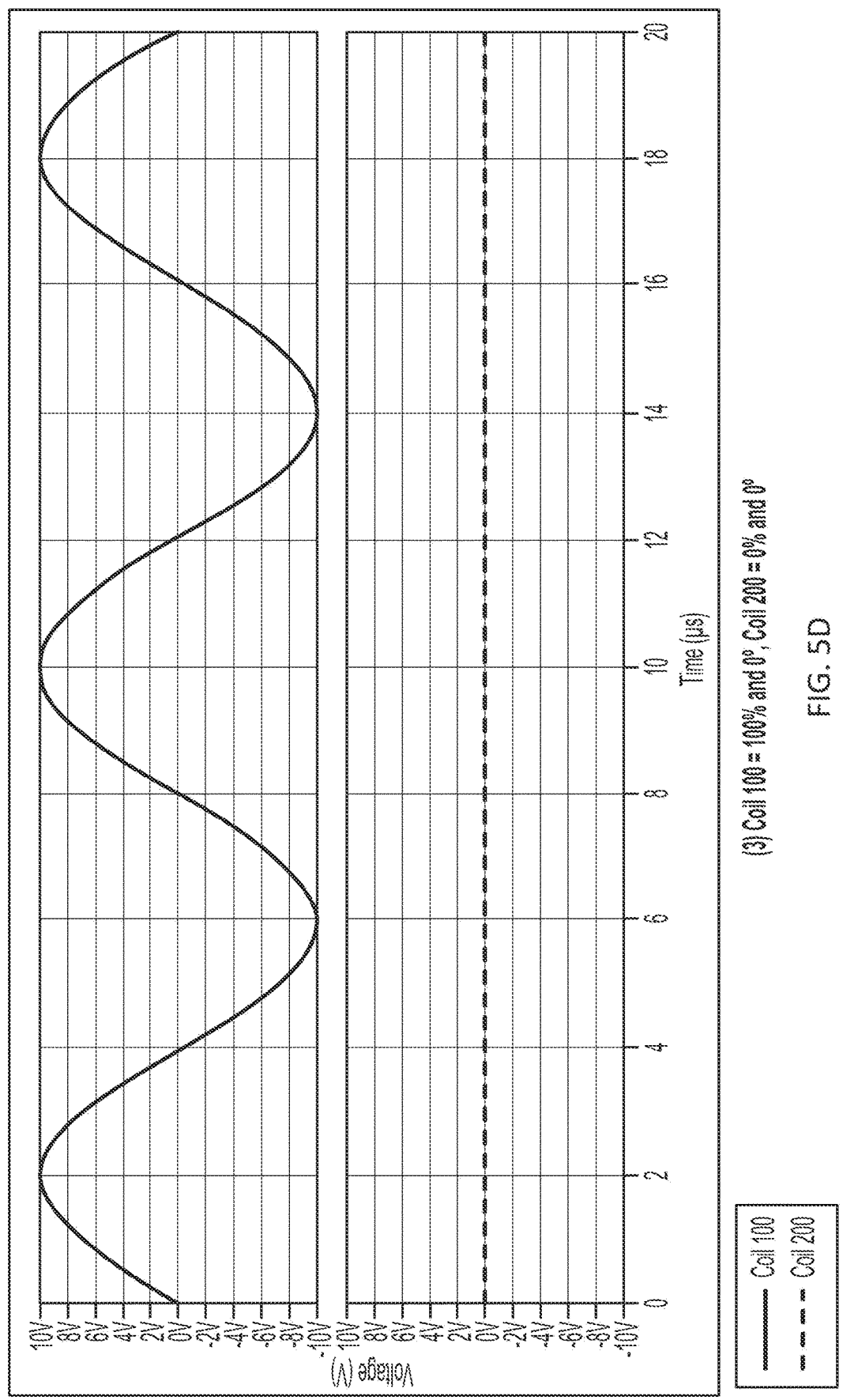

To rotate the magnetic field clockwise to a third position corresponding to a third state (3) as shown in FIGS. 5A and 5D, the first and second AC currents are driven in phase, the first amplitude is increased while the second amplitude is decreased until the first amplitude is at 10 and the second amplitude is at 0, and the direction of the magnetic field at the point will oscillate between the X-axis direction and the negative X-axis direction.

Figure 5E:
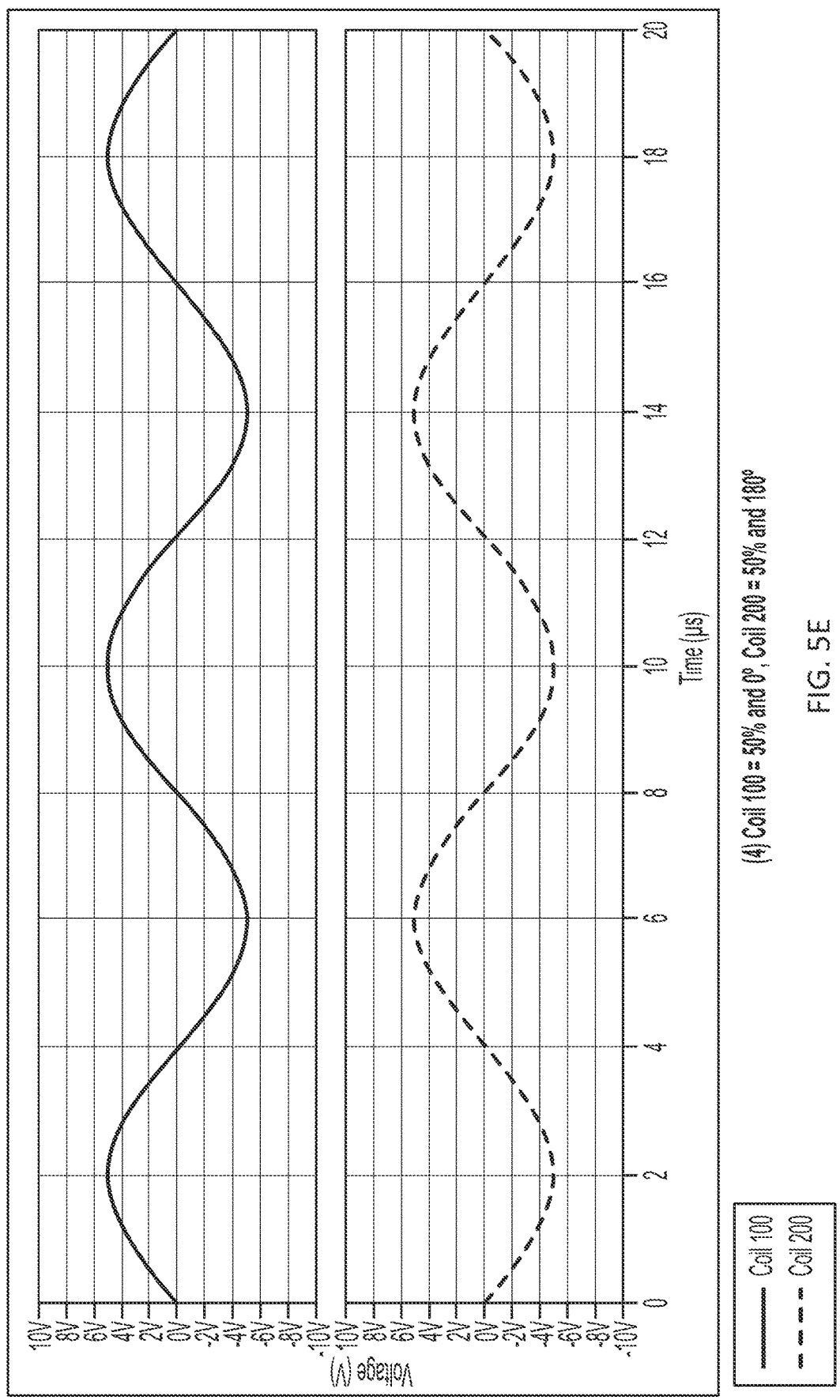

To rotate the magnetic field to a fourth position corresponding to a fourth state (4) as shown in FIGS. 5A and 5E, the first and second AC currents are driven 180° out of phase, the first amplitude is decreased while the second amplitude is increased until the first and second amplitudes are the same (each at 5), and the direction of the magnetic field at the point will oscillate between 45° between the X-axis direction and the negative Y-axis direction and 45° between the negative X-axis direction and the Y-axis direction.

Figure 5F:
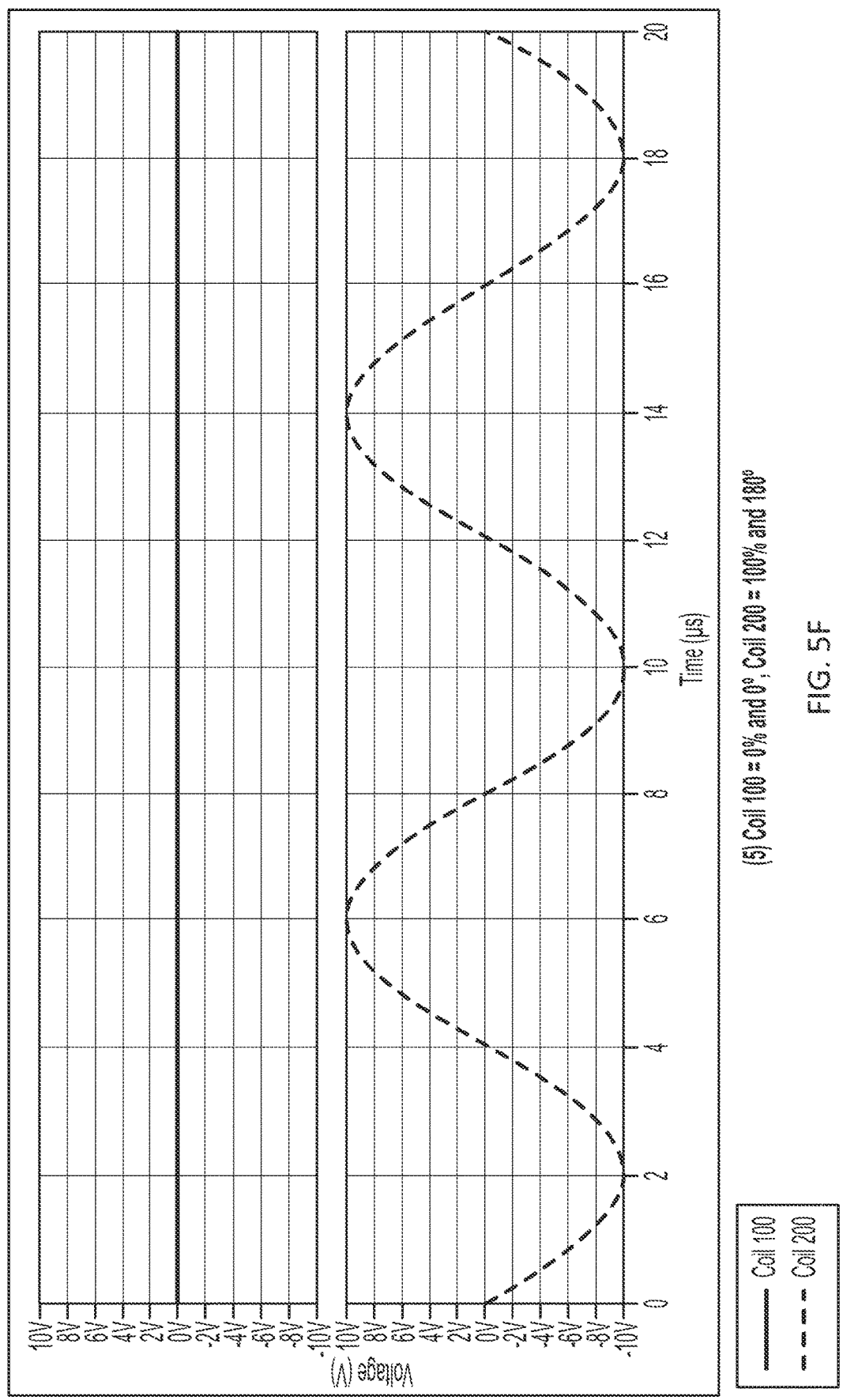

To rotate the magnetic field to a fifth position corresponding to a fifth state (5) as shown in FIGS. 5A and 5F, the first and second AC currents are driven 180° out of phase, the first amplitude is decreased while the second amplitude is increased until the first amplitude is at 0 and the second amplitude is at 10, and the direction of the magnetic field at the point may oscillate between the negative Y-axis direction and the Y-axis direction, similar to the first state (1). As utilized herein, the terms "first amplitude" and "second amplitude" refer to the peak amplitude.

Accordingly, the direction of the magnetic field at a point above the area of overlap 300 may be rotated to have any direction in the X-Y plane (any of quadrants I-IV of the X-Y plane in FIG. 5) by gradually adjusting the first amplitude of the first AC current and the second amplitude of the second AC current, and by shifting the first and second AC currents between being in-phase and being 180° out of phase. For example, when the first and second AC currents are in phase, the magnetic field at the point may have any direction in the first and third quadrants I and III of the X-Y plane by suitably setting the first and second amplitudes. Furthermore, when the first and second AC currents are 180° out of phase, the magnetic field at the point may have any direction in the second and fourth quadrants II and IV of the X-Y plane by suitably setting the first and second amplitudes.

Although a direction of the magnetic field generated by the wireless power transfer device 10 at a point above the area of overlap 300 has been described with respect to FIG. 5, it will be understood that the direction of the magnetic field at any point around the wireless power transfer device 10 may be controlled (e.g., rotated) or selected as described above by controlling the first and second amplitudes and/or by controlling the phase difference between the first and second AC currents. The direction of the magnetic field at points away from regions above or below the area of overlap 300 may have a directional component along the Z-axis direction, whereas a direction of the magnetic field at regions above or below the area of overlap 300 may have substantially no Z-axis component.

The wireless power transfer device 10 may also include a power source, such as a rechargeable battery (e.g., a lithium-ion battery pack) or non-rechargeable battery (e.g., a replaceable battery), or the wireless power transfer device 10 may be configured to couple to (e.g., connect to), and be powered from, an external power source, such an electrical outlet. In some embodiments, the wireless power transfer device 10 includes a rechargeable battery and a power management system. A charger profile of the rechargeable battery may be set to not perform trickle charging, and the rechargeable battery may be allowed to charge to a set percentage of battery state of charge (SoC) of the rechargeable battery, for example, a percentage within a range of about 80% to about 90% of the SoC. The SoC of the rechargeable battery may refer to the maximum charge that the rechargeable battery is able to store.

Figure 6A:
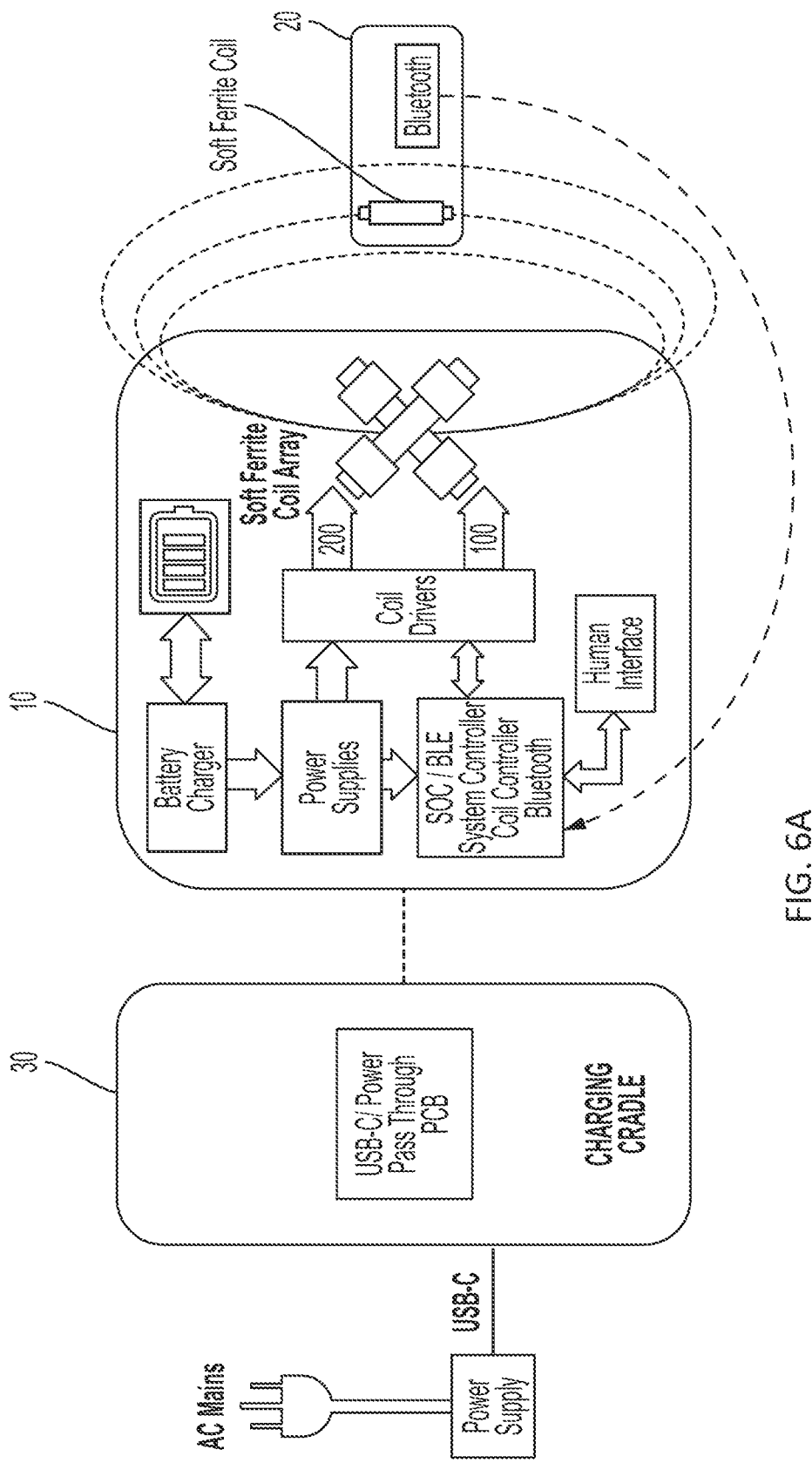
FIG. 6A shows a schematic view of a wireless power transfer system according to some embodiments.

Referring to FIG. 6A, which illustrates a wireless power transfer system according to some embodiments, the rechargeable battery of the wireless power transfer device 10 may be recharged through a power port or connector of the wireless power transfer device 10 that interfaces with a charging cradle 30. The wireless power transfer device 10 may be configured to be placed in or fixed to the charging cradle 30, and the wireless power transfer device 10 may be configured to detect the presence of a voltage at the power port or connector when it is placed in or fixed to the charging cradle 30. In some embodiments, the wireless power transfer device 10 is configured to allow the rechargeable battery to charge when the detected voltage value is equal to a set value or within a set range.

Referring again to FIG. 1, the driver 400 may include a first driver 410 to drive the first transmitting coil 100 and a second driver 420 to drive the second transmitting coil 200. In some embodiments, each of the first and second drivers 410 and 420 include a class D MOSFET bridge module, and the first and second drivers 410 and 420 may be respectively coupled (e.g., connected) in series to the first and second wires 110 and 210 through a capacitor to create a series resonant tank circuit, which may be tuned to 125 kHz. At the tuned frequency, the circuit may have the lowest impedance and highest quality factor. In some embodiments, each of the first and second drivers 410 and 420 may include a half or full bridge MOSFET switch.

Each of the first and second drivers 410 and 420 may receive an independent digital output signal from a digital port of the controller 600. Each of the digital output signals may be a driver signal, for example, a 125 kHz frequency, 50% duty cycle square wave. The two independent digital output signals may allow phase shifting between the first and second AC currents. However, the present disclosure is not limited thereto, and these quantities are provided as an example. In some embodiments, the first and second coils 100 and 200 may be driven with AC frequency within a range of about 1 kHz to 100 MHz (e.g., within a range of about 120 kHz to about 130 kHz). As the frequency at which the first and second coils 100 and 200 are operated increases, the efficiency of wireless charging of the electronic device 200 may increase because the quality factor increases when the frequency increases. The frequencies at which the first and second coils 100 and 200 are to be operated at may be limited by secondary effects, such as losses in the first and second cores 120 and 220 and the first and second wires 110 and 210 caused by skin and proximity effects. The frequencies at which the first and second coils 100 and 200 are to be operated at may be limited by regulations from governments and authorities, such as regulations from the Federal Communications Commission (FCC) and the international electrotechnical commission (IEC) regarding EM field strength and energy levels vs. frequency that create effective bands for operating for wireless charging systems.

Each of the first and second drivers 410 and 420 may include an isolation current sensor respectively coupled (e.g., connected) in series with the first and second wires 110 and 210. The isolation current sensors may be configured to convert a current passing through the first and second drivers 410 and 420 into a proportional voltage which is rectified and signal conditioned. The signal may then be routed to an analog port of the controller 600 to be utilized as current feedback.

In some embodiments, the power modulation electronics 500 includes first power modulation electronics 510 and second power modulation electronics 520. The first and second power modulation electronics 510 and 520 may be respectively configured to provide power to the first and second drivers 410 and 420. The first and second power modulation electronics 510 and 520 may be independently controlled by respective analog output control signals received from the controller 600. In some embodiments, each of the first and second power modulation electronics 510 and 520 includes a single-ended primary-inductor converter (SEPIC) DC-to-DC converter that is configured to step-up or step-down a system bus voltage received at an input and to output the stepped-up or stepped-down voltage.

Each of the first and second power modulation electronics 510 and 520 may be configured to monitor their respective output voltages and provide overcurrent protection. In some embodiments, the first and second power modulation electronics 510 and 520 are configured to attenuate their respective output voltages, filter their output voltages via a capacitor, and couple (e.g., connect) their output voltages to respective analog inputs of the controller 600. For example, the first and second power modulation electronics 510 and 520 may be configured to provide their respective output voltages to the controller 600 as analog voltage feedback signals. The controller 600 may be configured to then provide respective digital signals to the first and second power modulation electronics 510 and 520 to enable or disable the first and second power modulation electronics 510 and 520 from providing power to the first and second drivers 410 and 420.

In some embodiments, the controller 600 is a Bluetooth™ low energy system on chip controller (BLE SOC). The controller 600 may be programmed via a JTAG or USB-C connector. In some embodiments, the controller 600 is configured to provide two analog output control signals to the first and second power modulation electronics 510 and 520, and the controller 600 is configured to receive two analog voltage feedback signals from the first and second power modulation electronics 510 and 520, which are utilized to monitor and adjust output power and to detect supply faults. Furthermore, the controller 600 may be configured to provide two digital output signals to the first and second drivers 410 and 420 to drive the first and second transmitting coils 100 and 200, and the controller 600 may be configured to provide two digital output signals to enable or disable the first and second power modulation electronics 510 and 520. The two digital output signals may be wave pulses having a frequency and duty cycle, such as 125 kHz and 50% duty cycle.

The controller 600 may be configured to control the power output from each of the first and second drivers 410 and 420 by controlling the respective bus voltages of the first and second power modulation electronics 510 and 520. The controller 600 may also be configured to control the phase difference between the first and second AC currents by changing a phase difference between the digital output signal pulse signals it provides to the first and second drivers 410 and 420. Accordingly, by controlling the power of the first and second AC currents and the phase difference between the first and second AC currents, the controller 600 may control the direction and magnitude of the magnetic fields generated by the first and second transmitting coils 100 and 200.

The wireless power transfer device 10 may be configured (e.g., via the controller 600) to communicate various suitable information to the user. Such information may include information about charging of the wireless power transfer device 10, information about charging of the electronic device 20, and various faults (e.g., defects, overheating, etc.). More details regarding what information the wireless power transfer device 10 may communicate to the user will be described below with reference to FIGS. 17-22. The wireless power transfer device 10 may communicate the information via any suitable means, for example, auditory signals, visual signals, and/or haptic feedback signals (e.g., vibrational signals). For example, referring to FIG. 6A, the charger 10 may include a human interface circuit that includes a piezoelectric based speaker, a vibration motor, and/or an LED light configured to communicate information.

Figure 7B:
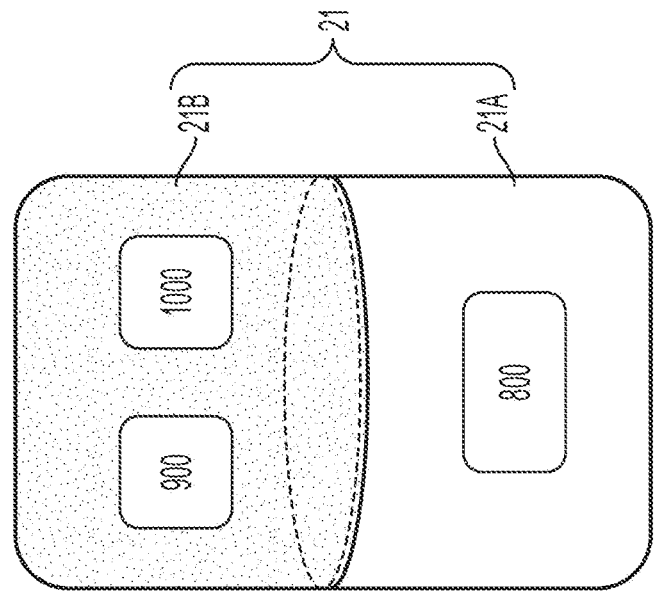
FIG. 7B shows a schematic view of an electronic device according to some embodiments.
Figure 7A:
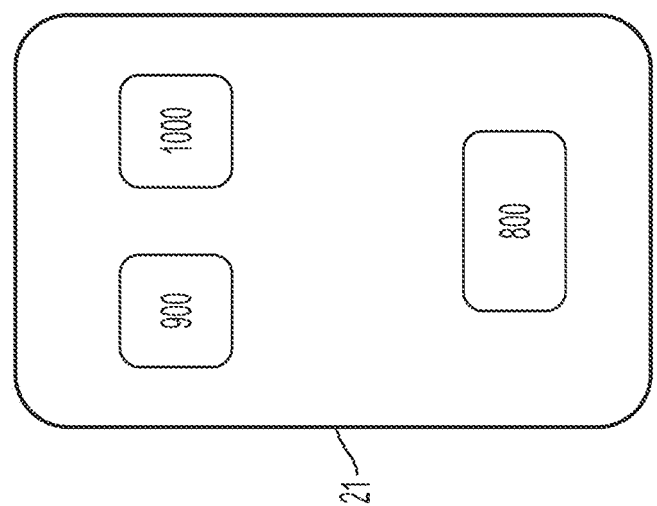
FIG. 7A shows a schematic view of an electronic device according to some embodiments.

The electronic device 20 may be an implantable device (e.g., a device that is configured to be inserted in vivo). In some embodiments where the electronic device 20 is an implantable medical device, the electronic device 20 may include a casing 21 that encases the components of the electronic device 20. In some embodiments, as shown in FIG. 7A, the entire casing 21 may include a metallic material. In some other embodiments, as shown in FIG. 7B, a first portion 21A of the casing 21 may include a ceramic material and a second portion of 21B of the casing 21 may include a metallic material. The first portion 21A may cover the receiver coil 800, and the second portion 21B may cover the other components of the electronic device 20 (e.g., the detector 900 and the transmitter 1000). The size and configuration of the first and second portions 21A and 21B may depend, for example, on the sizes, shapes, and relative positions of the receiver coil 800 and the other components of the electronic device 20. In some embodiments, a portion of the casing 21 may include a plastic, an epoxy, and/or a polymer material.

The electronic device 20 is not limited to implantable devices or medical devices, and the electronic device 20 may be any suitable device configured to receive power and/or generate an electrical current via electromagnetic induction. In some embodiments, the electronic device 20 may be configured to store energy of the current generated in the receiver coil 800, for example, in a capacitor. However, the present disclosure is not limited thereto, and the electronic device 20 may be configured in some embodiments to utilize the current without storing the energy of the current. For example, energy of the current generated in the receiver coil 800 may be utilized to drive or power other components in the electronic device 20.

When the electronic device 20 is in the proximity of the wireless power transfer device 10, and the wireless power transfer device 10 generates an oscillating magnetic field, a current may be generated in the receiver coil 800 by electromagnetic induction via the oscillating magnetic field. The receiver coil 800 may be, for example, a solenoid with a ferrimagnetic (e.g., soft ferrite) core.

The detector 900 may be electrically coupled (e.g., electrically connected) to the receiver coil 800 and configured to detect information about the current (e.g., the power or amplitude of the current) generated in the receiver coil 800.

The transmitter 1000 may be to transmit the information detected by the detector 900 to the receiver 700 of the wireless power transfer device 10, but the present disclosure is not limited thereto. The transmitter 1000 may be configured to transmit the information to any suitable receiver outside of the electronic device 20 that is able to receive the information transmitted by the transmitter 1000. In some embodiments, the transmitter 1000 transmits information wirelessly, for example, via Bluetooth™ low energy (BLE).

Aligning the orientation of magnetic field at the receiver coil 800 with the receiver coil 800 increases the efficiency at which the wireless power transfer device 10 transfers power to the electronic device 20 compared to otherwise comparable wireless power transfer devices and receiver coils in which the magnetic field is misaligned. Accordingly, the wireless power transfer device 10 may rotate the magnetic field in order to align (e.g., optimally align) the magnetic field with the receiver coil 800.

A feedback system that monitors (e.g., directly or indirectly monitors) the relative direction of the magnetic field at the receiver coil 800 may be utilized to align (or to enable an operator to align) the magnetic field with the receiver coil 800. The feedback system may allow the wireless power transfer device 10 to automatically align the magnetic field with, or to create a magnetic field that is aligned with, the receiver coil 800 at the receiver coil 800 without requiring a user to manually adjust the position and/or orientation of the wireless power transfer device 10 after placing the wireless power transfer device 10 in proximity with the electronic device 20. Two example feedback systems will now be described in more detail.

In a first feedback system, the wireless power transfer device 10 generates an initial magnetic field and rotates the initial magnetic field (e.g., in the manner described above with reference to FIG. 5). For example, the initial magnetic field may be continuously rotated through a range of angles, or rotated through the range of angles via a plurality of steps changes in angle (e.g., 10 degrees). As the initial magnetic field is rotated, the detector 900 detects information (e.g., power or amplitude) of the current generated in the receiver coil 800. The power received in the receiver coil 800 (e.g., the power of the current generated in the receiver coil 800) may correlate with how aligned the initial magnetic field is with the receiver coil 800. Accordingly, a maximum detected power may correspond to alignment (e.g., optimal alignment) between the initial magnetic field and the receiver coil 800. The maximum detected power also indicates what values of the first amplitude, the second amplitude, and the relative phase between the first and second AC currents generate a magnetic field that will be aligned with the receiver coil 800. After this information is obtained, the wireless power transfer device 10 may generate a magnetic field aligned with the receiver coil 800 to charge (or drive) the electronic device 20.

In a second feedback system, load modulation may be utilized. Load modulation is described in Griffith, U.S. Pat. No. 9,962,085 and Finkenzeller, "Battery Powered Tags for ISO/IEC 14443, Actively Emulating Load Modulation," *RFID SysTech* 2011 *7th European Workshop on Smart Objects: Systems, Technologies and Applications* (2011), the entire content of each of which is incorporated herein by reference.

In the second feedback system, the wireless power transfer device 10 may generate an initial magnetic field and rotate the initial magnetic field (e.g., in the manner described above with reference to FIG. 5). For example, the initial magnetic field may be continuously rotated through a range of angles, or rotated through the range of angles via a plurality of steps changes in angle (e.g., 10 degrees). The electronic device 20 may include a modulation resistance coupled (e.g., connected in parallel) to the receiver coil 800, and the modulation resistance can be turned on and off to cause the receiver coil 800 to transmit a signal back to the wireless power transfer device 10 while the electronic device 20 receives power from the wireless power transfer device 10. Information in the signal may be controlled or selected, for example, by the clock rate at which the modulation resistance is turned on and off. The signal may include information about how aligned (i.e., the degree or extent of alignment) the initial magnetic field is with the receiver coil 800. The signal may be measured by a demodulator in the wireless power transfer device 10 that is coupled to one or both of the first and second transmitting coils 100 and 200. The information in the signal may be utilized to determine what values of the first amplitude, the second amplitude, and the relative phase between the first and second AC currents generate a magnetic field that will be aligned with the receiver coil 800. After this information is obtained, the wireless power transfer device 10 may generate a magnetic field that is aligned with the receiver coil 800 to charge (or drive) the electronic device 20.

In some embodiments, the values of the first amplitude, the second amplitude, and the phase difference between the first and second AC currents that can generate a magnetic field that is aligned with the receiver coil 800 may be determined after the wireless power transfer device 10 rotates the magnetic field through a range of degrees (e.g., the wireless power transfer device 10 sweeps the magnetic field through a range of orientations), for example, a full 180° sweep (360° when taking into account the oscillating nature of the magnetic field), but the present disclosure is not limited thereto. For example, information regarding how aligned the initial magnetic field is with the receiver coil 800 may be continuously monitored, and the wireless power transfer device 10 (e.g., the controller 600 of the wireless power transfer device 10) may stop the rotation when alignment (e.g., optimal alignment) between the initial magnetic field and the receiver coil 800 has been detected. The wireless power transfer device 10 may then charge (or drive) the electronic device 20.

Figure 6C:
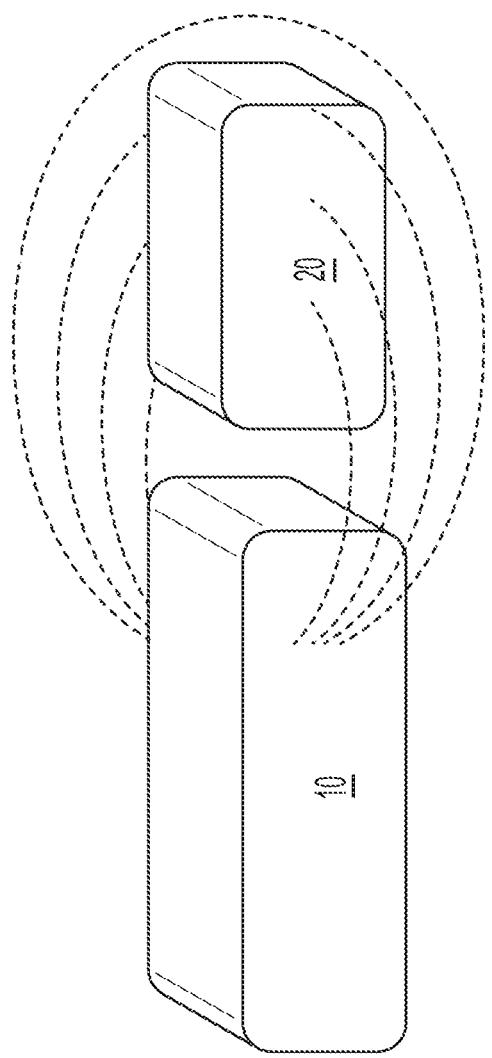
FIG. 6C shows a schematic side view of the wireless power transfer system of FIG. 6A with the electronic device at the side of the wireless power transfer device.

The wireless power transfer device 10 may be configured to transfer power to the electronic device 20 regardless of where the electronic device 20 is positioned relative to the wireless power transfer device 10. For example, FIGS. 6B and 6C show schematic side views of the wireless power transfer device 10 and electronic device 20 of the wireless power transfer system of FIG. 6A with the electronic device 20 in two different positions relative to the wireless power transfer device 10. For example, FIGS. 6B and 6C show side views of a plane substantially defined by the first and second transmitting coils 100 and 200. FIG. 6B shows a non-limiting example where the wireless power transfer device 10 transfers power to the electronic device 20 while being positioned above (e.g., while an area of overlap between the first and second transmitting coils 100 and 200 is positioned above) the electronic device 20. FIG. 6C shows a non-limiting example where the wireless power transfer device 10 transfers power to the electronic device while the electronic device 20 is positioned at the side of the wireless power transfer device 10 (e.g., at the side of the first and second transmitting coils 100 and 200).

Figure 9:
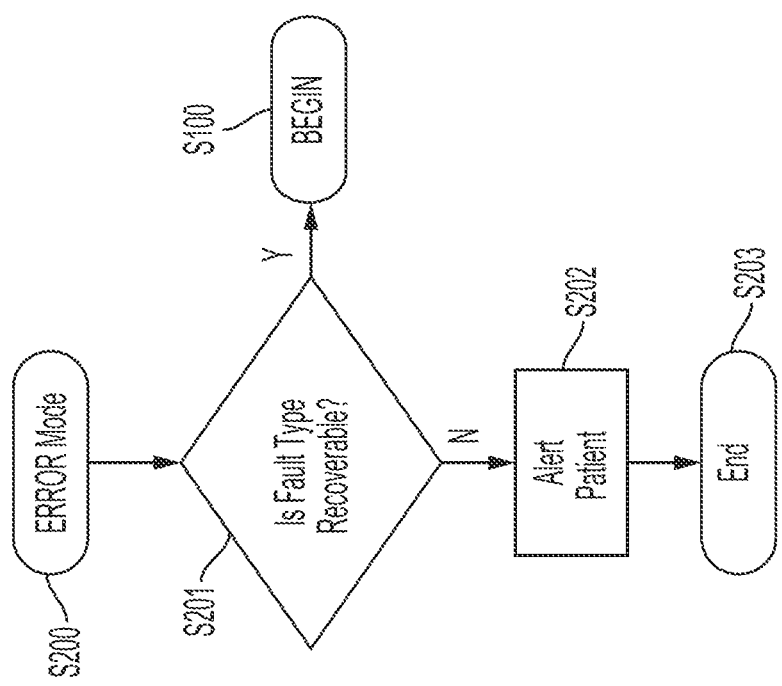
FIG. 9 shows a method flow chart for an error mode according to some embodiments.
Figure 10:
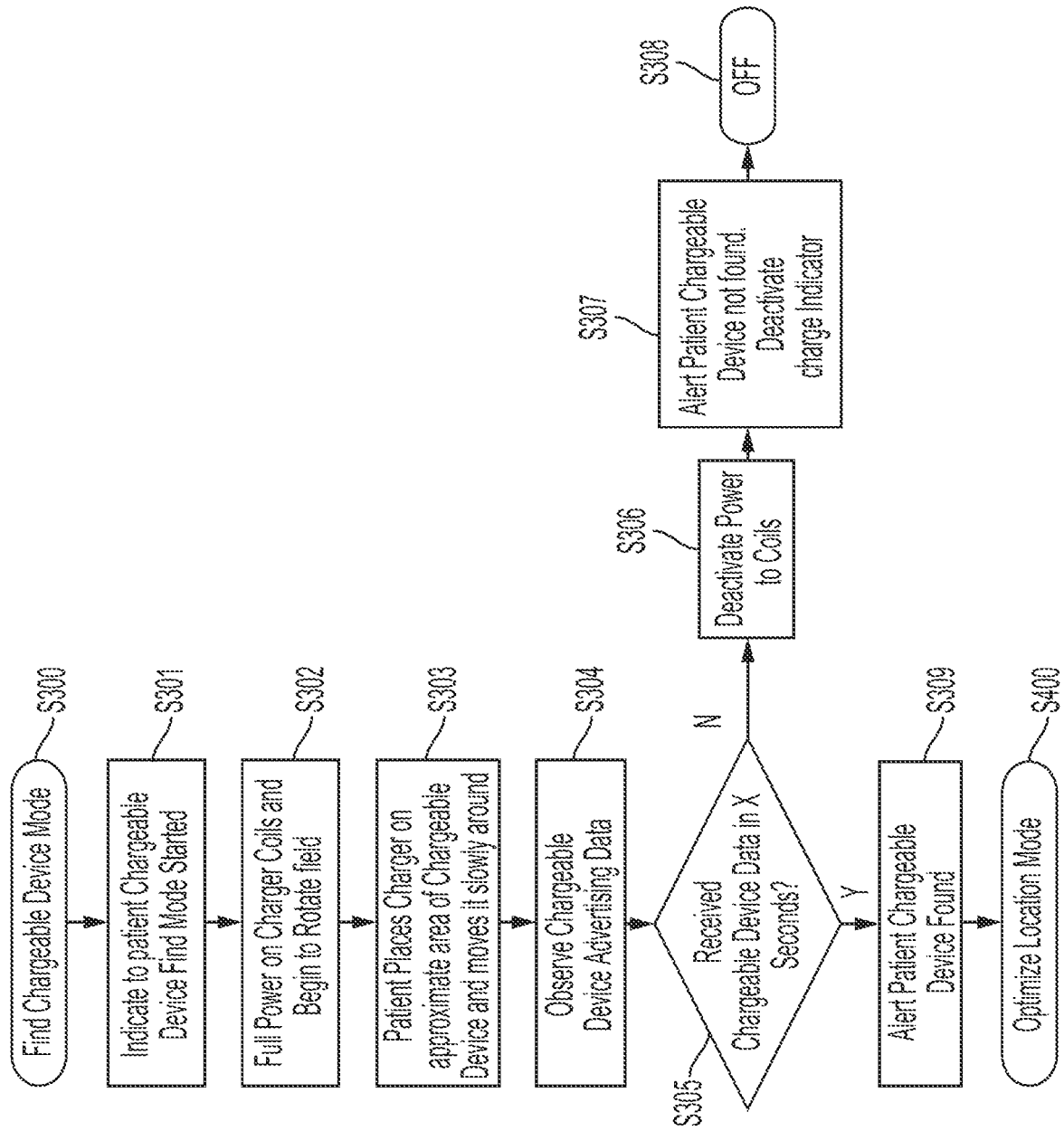
FIG. 10 shows a method flow chart for a find electronic device mode according to some embodiments.
Figure 11:
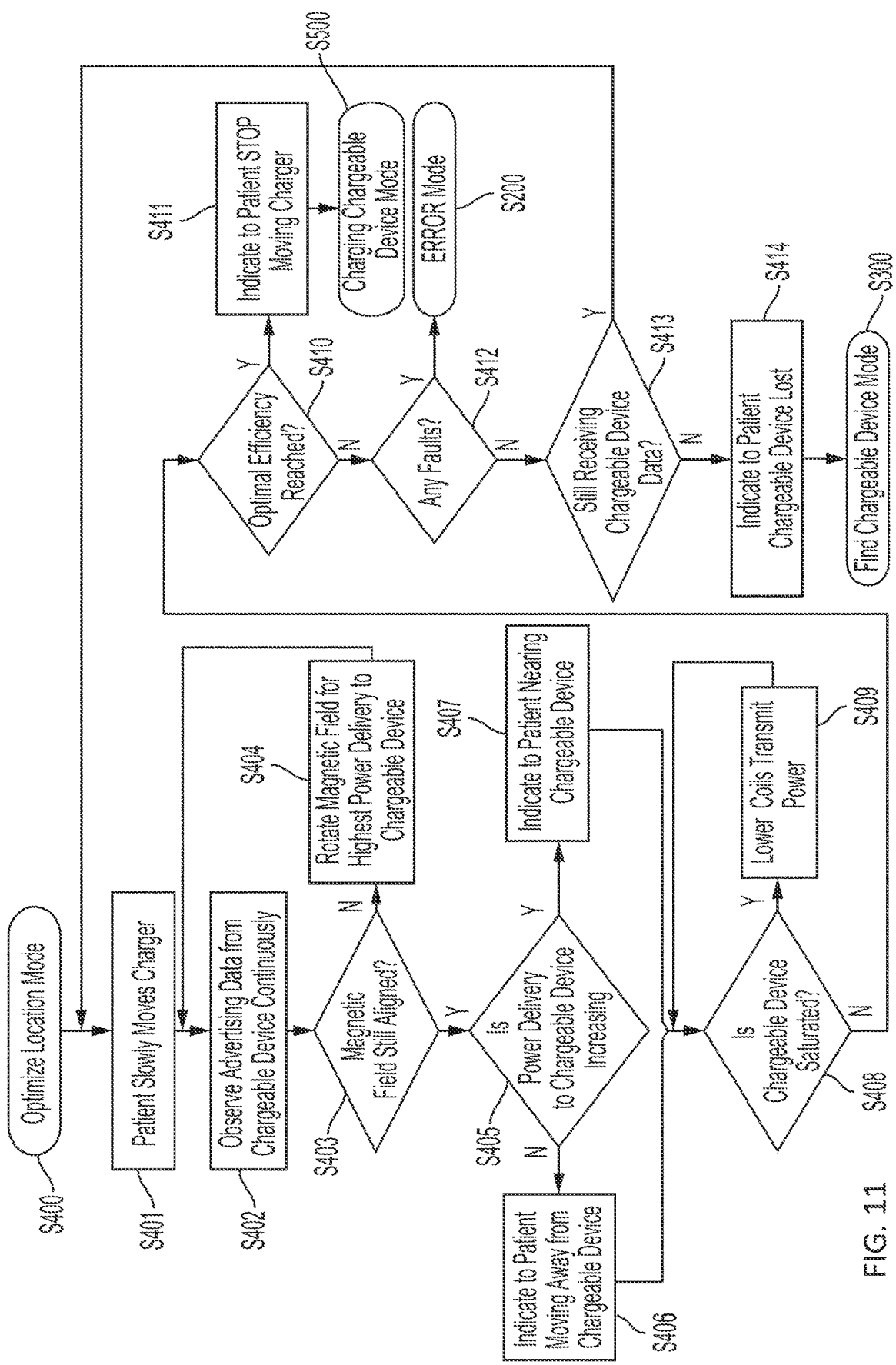
FIG. 11 shows a method flow chart for an optimize location mode according to some embodiments.
Figure 12:
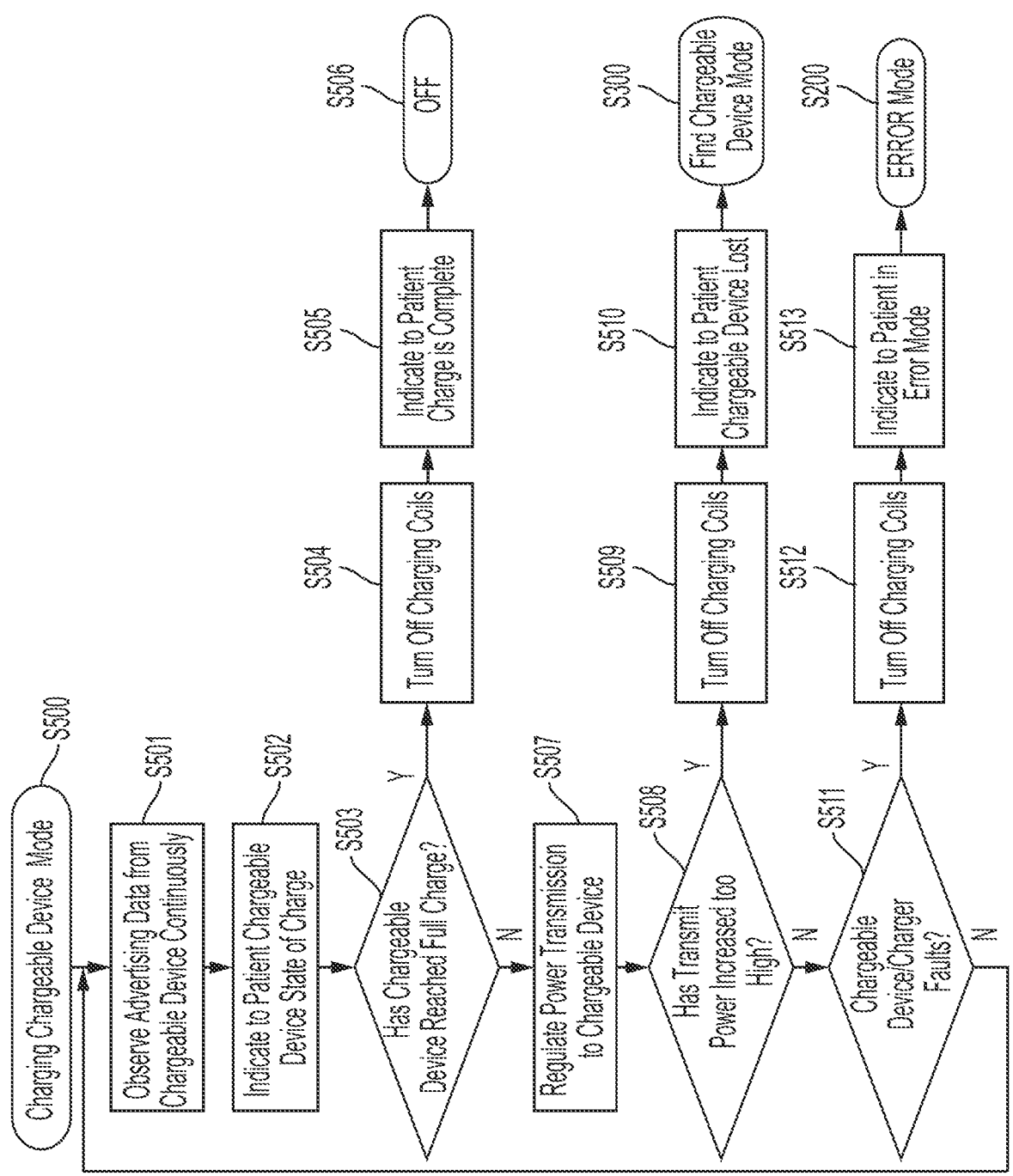
FIG. 12 shows a method flow chart for an electronic device charging mode according to some embodiments.
Figure 13:
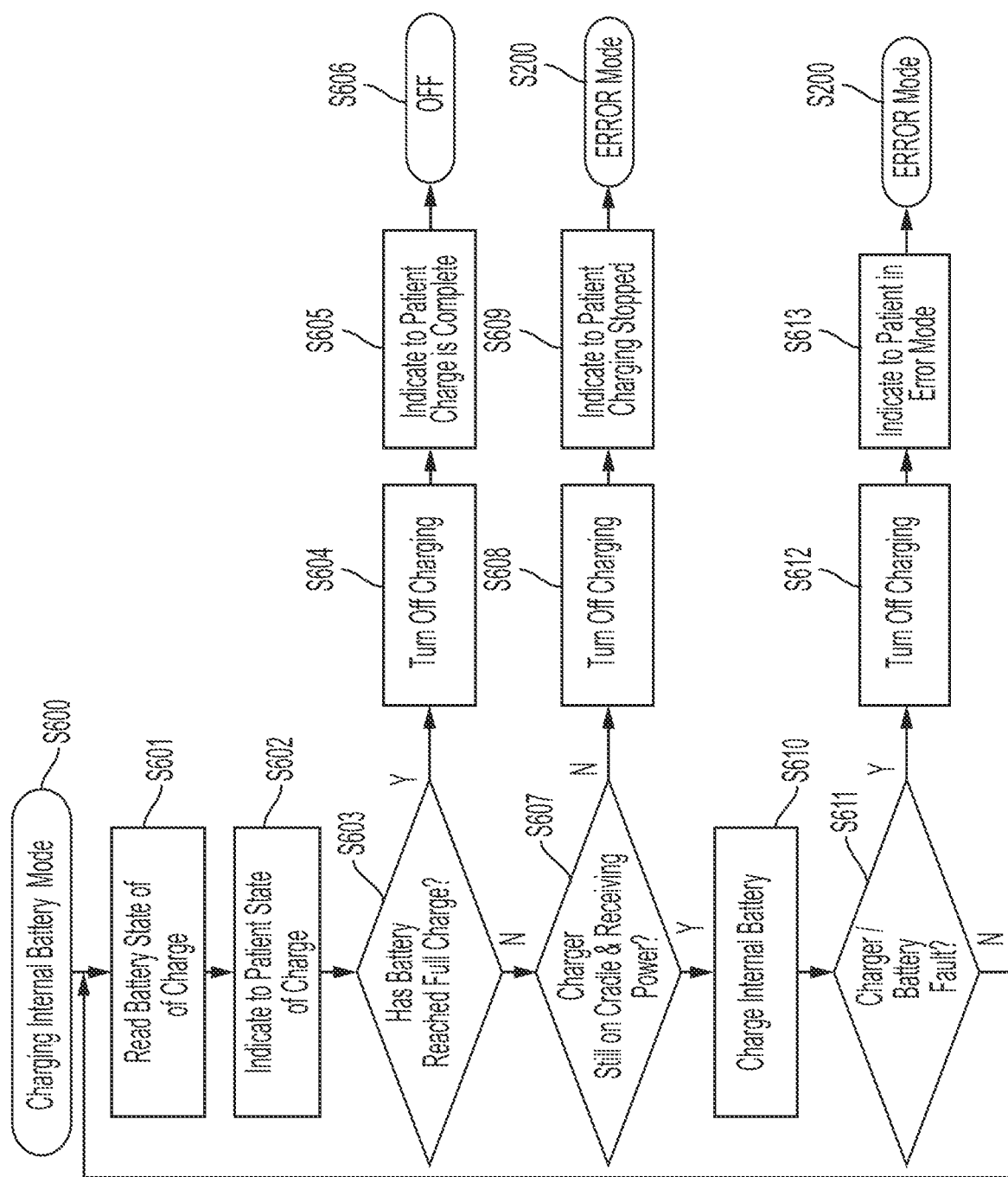
FIG. 13 shows a method flow chart for a wireless power transfer device charging mode according to some embodiments.

Various modes of operating a wireless power transfer system will now be described in more detail with reference to FIGS. 8-13. FIG. 8 illustrates an initialization mode; FIG. 9 illustrates an error mode; FIG. 10 illustrates a find the electronic device mode; FIG. 11 illustrates an optimize location mode; FIG. 12 illustrates an electronic device charging mode; and FIG. 13 illustrates a wireless power transfer device charging mode.

Referring to FIG. 8, an Initialization mode may begin at stage S100. The initialization mode may begin, for example, when the wireless power transfer device 10 is placed in the charging cradle 30, when a charge button is pressed, or when the wireless power transfer device 10 is trying to recover from a recoverable error. The charge button may be a button on the wireless power transfer device 10 that allows a user to initialize the wireless power transfer device 10 for charging the electronic device 20.

At stage S101, the wireless power transfer device 10 may determine whether a voltage of an internal battery (e.g., a rechargeable battery) of the wireless power transfer device 10 is greater than or equal to a minimum voltage. When the voltage of the internal battery is less than the minimum voltage, then the wireless power transfer device 10 may repeat stage S101. However, when the voltage of the internal battery is greater than or equal to the minimum voltage, the wireless power transfer device 10 may initialize the system of the wireless power transfer device 10 at stage S102.

After the wireless power transfer device 10 is initialized at stage S102, the wireless power transfer device 10 may perform a power up self-test at stage S103. For example, the wireless power transfer device 10 may test for internal faults (e.g., defects) or errors during stage S103, and the wireless power transfer device 10 may begin an error mode at stage S200 when the wireless power transfer device 10 detects an error such that the power up self-test fails. However, when at stage S103 the power up self-test is passed, the wireless power transfer device 10 may measure a voltage of the internal battery at stage S104 and communicate to the user the SoC of the internal battery at stage S105.

At stage S106, the wireless power transfer device 10 may determine whether the SoC of the internal battery is sufficient to charge (or drive) the electronic device 20. When the SoC of the internal battery is insufficiently low, the wireless power transfer device 10 may alert the user at S107 and proceed to stage S108. However, when at stage S106 the SoC is determined to be sufficient, the wireless power transfer device 10 may determine whether the charge button has been pressed at stage S108.

When the charge button has been pressed, the wireless power transfer device 10 may determine whether it is in a self-charging mode at stage S109. When the wireless power transfer device 10 is not in the self-charging mode, then the wireless power transfer device 10 may begin the find electronic device mode at stage S300. However, when at stage S109 the wireless power transfer device 10 is in the self-charging mode, the wireless power transfer device 10 may proceed to stage S110. Furthermore, when at stage S108 it is determined that the charge button has not been pressed, the wireless power transfer device 10 may detect whether a power supply from the charging cradle 30 is available.

When the wireless power transfer device 10 detects the power supply from the charger cradle 30, the wireless power transfer device 10 may begin the wireless power transfer device charging mode at stage S600. However, when at stage S110 the wireless power transfer device 10 does not detect the power supply from the charger cradle 30, the wireless power transfer device 10 may determine at stage S111 whether a set (e.g., predetermined) amount of time has passed since a previous stage, for example, stage S102 or stage S103.

When the wireless power transfer device 10 determines that the set amount of time has not elapsed, then the wireless power transfer device 10 may proceed to stage S104. However, when the set amount of time has elapsed, then the wireless power transfer device 10 may turn off at stage S112.

Referring to FIG. 9, after the error mode begins at stage S200, the wireless power transfer device 10 may determine at stage S201 whether it is able to recover from (e.g., resolve or remedy) the fault. When the wireless power transfer device 10 is able to recover from the fault, the wireless power transfer device 10 may begin the initialization mode at stage S100. However, when the wireless power transfer device 10 is unable to recover from the fault, the wireless power transfer device 10 may alert the user at stage S202 that the wireless power transfer device 10 is unable to recover. The wireless power transfer device 10 may then end the error mode at stage S203. In some embodiments, the wireless power transfer device 10 may turn off at stage S203.

Referring to FIG. 10, after the find electronic device mode begins at stage S300, the wireless power transfer device 10 may communicate to the user that the find electronic device mode has started. The wireless power transfer device 10 may drive the first and second transmitting coils 100 and 200 to generate and rotate an initial magnetic field at stage S302. At stage S303, the wireless power transfer device 10 may be placed at an initial position in approximate or estimated proximity to the electronic device 20, and the wireless power transfer device 10 may be moved slowly around the initial position. At stage S304, the wireless power transfer device 10 may communicate information to the user regarding whether the electronic device 20 has been located, for example, by receiving a signal from the electronic device 20, while the wireless power transfer device 10 is moved around the initial position.

The wireless power transfer device 10 may determine at stage S305 whether the electronic device 20 has been located within a set amount of time, for example, from a previous stage such as S303. When the electronic device 20 has not been located when the set amount of time elapses, the wireless power transfer device 10 may stop driving the first and second transmitting coils 100 and 200 to terminate the initial magnetic field at stage S306. The wireless power transfer device 10 may then communicate to the user that the electronic device 20 was not found at stage S307, and the wireless power transfer device 10 may turn off at stage S308. However, when at stage S305 the wireless power transfer device 10 determines within the set amount of time that the electronic device 20 has been found, then the wireless power transfer device 10 may communicate to the user that the electronic device 20 has been found at stage S309. The wireless power transfer device 10 may then begin an optimize location mode at stage S400.

Referring to FIG. 11, after the optimize location mode begins at stage S400 and at stage S401, the wireless power transfer device 10 may be slowly moved, for example, from a second position where the wireless power transfer device 10 was located when the electronic device 20 was found. The wireless power transfer device 10 may continuously communicate information to the user at stage S402 while the wireless power transfer device 10 is being moved. The information communicated at stage S402 may include whether the initial magnetic field is aligned with the receiver coil 800 and whether power delivered to the electronic device 20 is increasing or decreasing. The wireless power transfer device 10 may determine whether the initial magnetic field is aligned with the receiver coil 800 by utilizing a feedback system as described above.

At stage S403, the wireless power transfer device 10 may determine whether the initial magnetic field is aligned with the receiver coil 800. When the initial magnetic field is not aligned, the wireless power transfer device 10 may rotate the initial magnetic field as needed (e.g., by utilizing a feedback system as described above) at stage S404 to automatically align the initial magnetic field with the receiver coil 800. However, when at stage S403 the wireless power transfer device 10 determines that the initial magnetic field is aligned with the receiver coil 800, then the wireless power transfer device 10 may determine at stage S405 whether power delivered to the electronic device 20 is increasing as the wireless power transfer device 10 is moved. The wireless power transfer device 10 may then communicate to the user whether the wireless power transfer device 10 is being moved away from the electronic device 20 (stage S406) or toward the electronic device 20 (stage S407).

At stage S408, the wireless power transfer device 10 may determine whether the receiver coil 800 is saturated. Saturation of the receiver coil 800 may occur when an increase in magnitude of the initial magnetic field at the receiver coil 800 does not significantly increase the magnetization of the core material (e.g., ferrimagnetic material) of the receiver coil 800. When it is determined that the receiver coil 800 is saturated, the first and second amplitudes of the first and second currents utilized to generate the initial magnetic field may be reduced at stage S409, and the wireless power transfer device 10 may again determine whether the receiver coil 800 is saturated at stage S408. However, when at stage S408 it is determined that the receiver coil 800 is not saturated, the wireless power transfer device 10 may determine whether the wireless power transfer device 10 is at an optimal position and/or orientation at stage S410. The optimal position and/or orientation may correspond to a position and/or orientation of the wireless power transfer device 10 that results in a maximum power received in the receiver coil at set amplitudes of the first and second AC currents that do not saturate the receiver coil 800.

When it is determined that the wireless power transfer device 10 is at an optimal position and/or orientation, the wireless power transfer device 10 may communicate to the user to stop moving the wireless power transfer device 10 at stage S411, and the wireless power transfer device 10 may begin the electronic device charging mode at stage S500. However, when at stage S410 it is determined that the wireless power transfer device 10 is not at an optimal position and/or orientation, the wireless power transfer device 10 may conduct a test to detect faults at stage S412. When a fault is detected, the wireless power transfer device 10 may begin the error mode at stage S200. However, when no faults are detected, the wireless power transfer device 10 may determine whether information from the electronic device 20 is still being received at stage S413.

When information from the electronic device 20 is still being received, the user may continue to move the wireless power transfer device 10 at stage S401. For example, the wireless power transfer device 10 may prompt the user to continue to move the wireless power transfer device 10. However, when at stage S413 the wireless power transfer device 10 determines that information is not being received from the electronic device 20, the wireless power transfer device 10 may communicate to the user at stage S414 that the electronic device 20 has been lost, and the wireless power transfer device 10 may begin the find electronic device mode at stage S300.

Referring to FIG. 12, after the electronic device charging mode begins at stage S500, information from the electronic device 20 may be continuously received and monitored at stage S501, and the wireless power transfer device 10 may communicate information about the electronic device 20 (e.g., SoC of a battery or of an energy storage in the electronic device 20) to the user at stage S502.

At stage S503, the wireless power transfer device 10 may determine whether the electronic device 20 has reached a set SoC of the electronic device 20. For example, the wireless power transfer device 10 may determine whether the electronic device 20 has reached a fully charged state. When the electronic device 20 has reached the set SoC, the wireless power transfer device 10 may stop driving the first and second transmitting coils 100 and 200 at stage S504 to terminate the magnetic field generated by the wireless power transfer device 10. The wireless power transfer device 10 may then communicate to the user that the charge is complete at stage S505 before turning off at stage S506.

However, when at stage S503 the wireless power transfer device 10 determines that the set SoC of the electronic device 20 has not been reached, it may regulate power transmission to the electronic device 20 at stage S507. For example, the wireless power transfer device 10 may change the amplitudes of the first and second AC currents to reduce or increase the power provided to the electronic device 20.

At stage S508, the wireless power transfer device 10 may determine whether transmission power is at or above a set or predetermined threshold. When the transmission power is at or above the set or predetermined threshold, the wireless power transfer device 10 may turn off the first and second transmitting coils 100 and 200 at stage S509 to terminate the magnetic field. The wireless power transfer device 10 may then communicate to the user that the electronic device 20 has been lost at stage S510 and begin the find electronic device mode at stage S300.

However, when at stage S508 the wireless power transfer device 10 determines that the transmission power is below the set or predetermined threshold, then the wireless power transfer device 10 may determine whether any faults have occurred in the wireless power transfer device 10 and/or in the electronic device 20 at stage S511. When a fault is detected, the wireless power transfer device 10 may turn off the first and second transmitting coils 100 and 200 at stage S512. The wireless power transfer device 10 may then communicate to the user that a fault has been found and begin the error mode at stage S200.

However, when at stage S511 the wireless power transfer device 10 does not detect any faults, the wireless power transfer device 10 may proceed to stage S501 and continue to receive and monitor information received from the electronic device 20.

Referring to FIG. 13, the wireless power transfer device 10 may begin charging an internal battery via a power supply provided by the charging cradle 30 at stage S600 of the wireless power transfer device charging mode. The wireless power transfer device 10 may determine a SoC of the internal battery at stage S601 and communicate the SoC to the user at stage S602. At stage S603, the wireless power transfer device 10 may determine whether a set SoC of the internal battery has been reached. For example, the wireless power transfer device 10 may determine whether the internal battery has been fully charged.

When the wireless power transfer device 10 determines that the set SoC of the internal battery has been reached, the wireless power transfer device 10 may stop charging the internal battery at stage S604, communicate to the user that the charging process is complete at stage S605, and turn off at stage S606.

However, when at stage S603 the wireless power transfer device 10 determines that the internal battery has not reached the set SoC, the wireless power transfer device 10 may determine whether the wireless power transfer device 10 is still coupled to (e.g., on or in) the charger cradle 30 and receiving power from the charger cradle 30. When the wireless power transfer device 10 is not coupled to the charger cradle 30 or not receiving power from the charger cradle 30, the wireless power transfer device 10 may stop charging the internal battery at stage S608, communicate to the user that the charging process has stopped at stage S609, and begin the error mode at stage S200.

However, when at stage S607 the wireless power transfer device 10 determines that the wireless power transfer device 10 is coupled to the charger cradle 30 and is receiving power from the charger cradle 30, the wireless power transfer device 10 may continue to charge the internal battery at stage S610. At stage S611, the wireless power transfer device 10 may determine whether faults have occurred in the wireless power transfer device 10 and/or in the internal battery at stage S611. When a fault is detected, the wireless power transfer device 10 may stop the charging process at stage S612, communicate to the client that the charging process has stopped at stage S613, and begin the error mode at stage S200.

However, when at stage S611 the wireless power transfer device 10 does not detect any faults, the wireless power transfer device 10 may proceed to stage S601 to determine the SoC of the internal battery.

Figure 14:
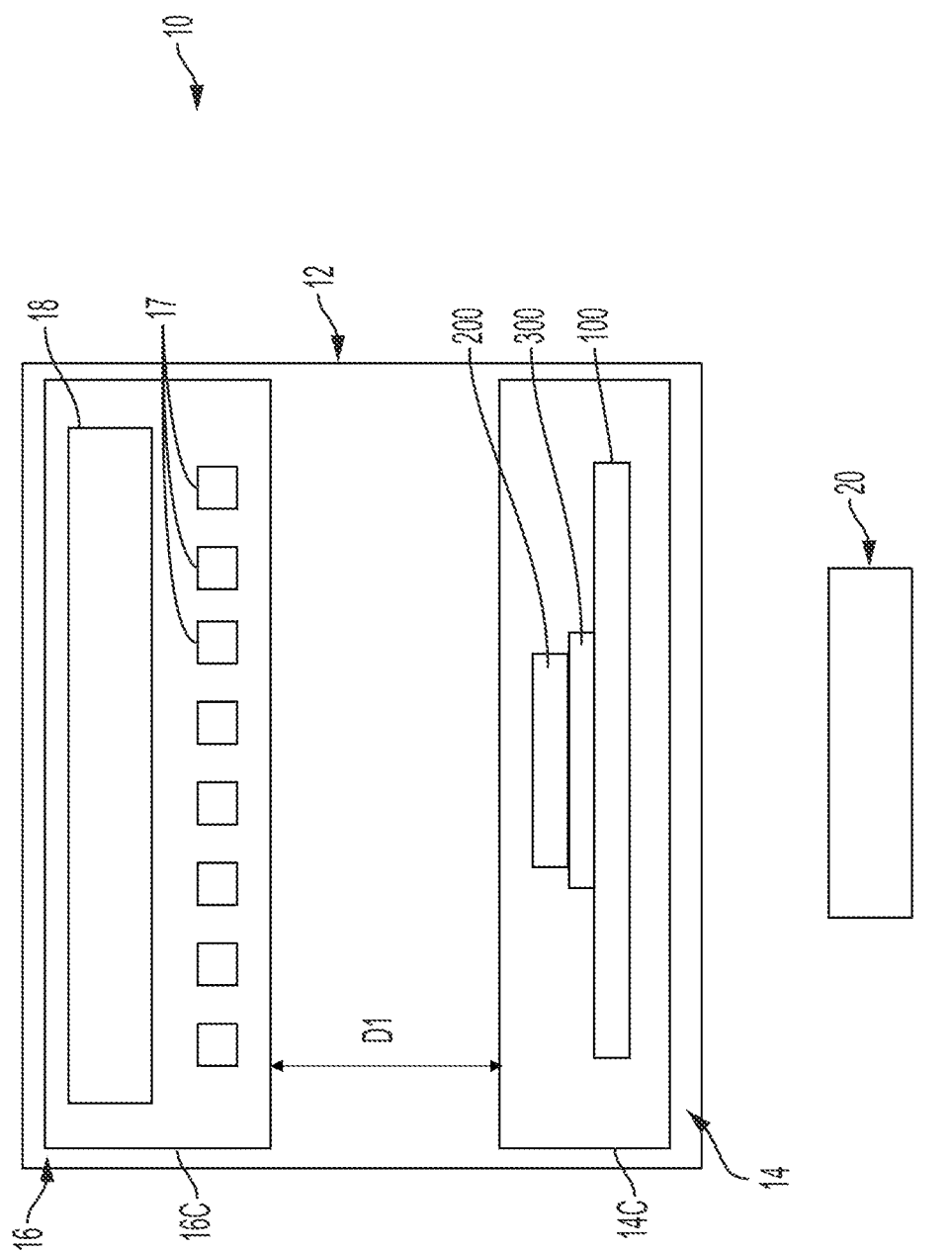
FIG. 14 shows a schematic view of a wireless power transfer system according to some embodiments.
Figure 15:
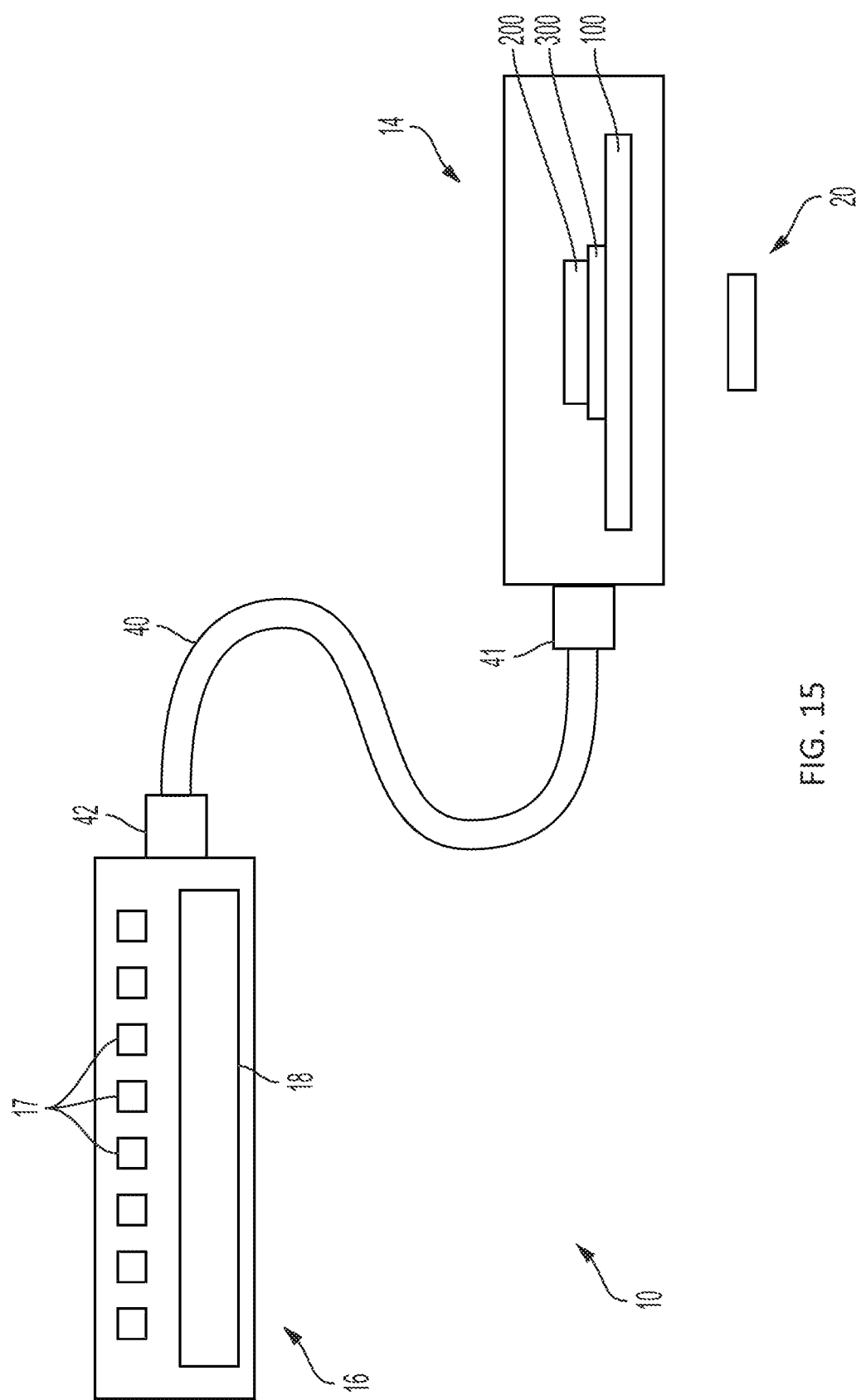
FIG. 15 shows a schematic view of a wireless power transfer system according to some embodiments.
Figure 16:
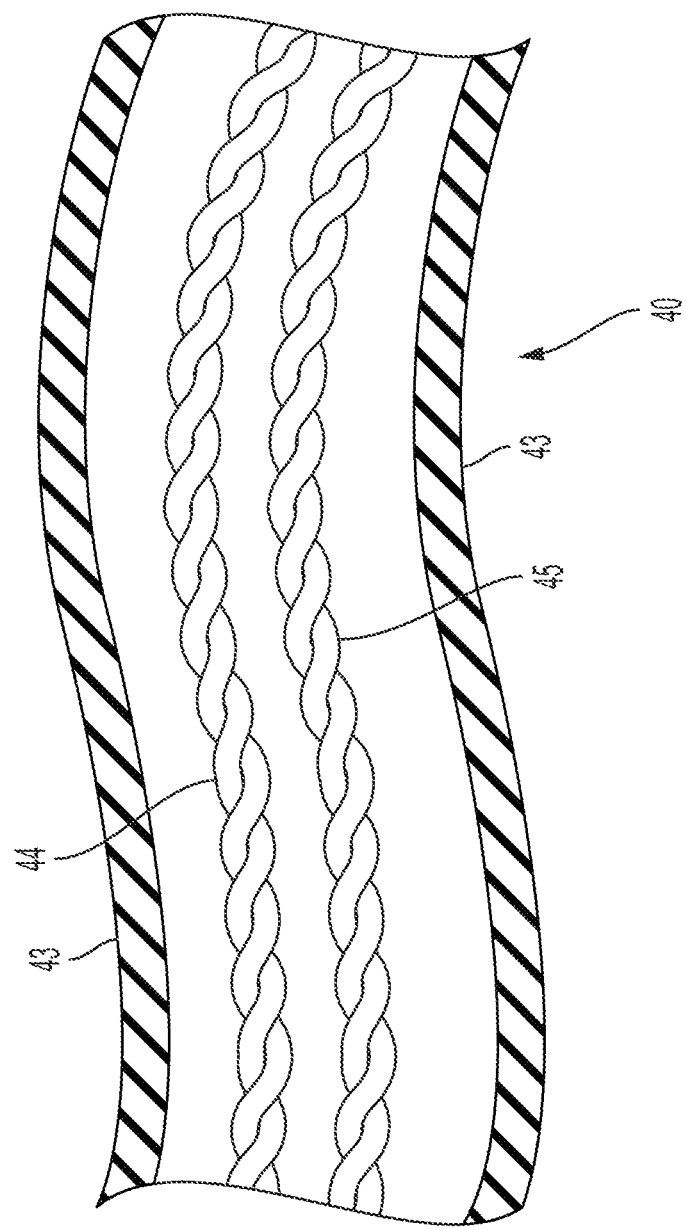
FIG. 16 shows a cross-sectional partial view of the cable illustrated in FIG. 15.

FIG. 14 shows a schematic view of a wireless power transfer system according to some embodiments. FIG. 15 shows a schematic view of a wireless power transfer system according to some embodiments. FIG. 16 shows a cross-sectional partial view of the cable illustrated in FIG. 15.

Referring to FIGS. 1 and 14-16, the wireless power transfer device 10 may include a coil assembly 14 and an electronics assembly 16 spaced apart from the coil assembly 14. The coil assembly 14 includes the first transmitting coil 100, the second transmitting coil 200, and the non-magnetic material in the intermediate space 300a, and the electronics assembly 16 may include one or more electronic components 17 of the wireless power transfer device 10. By including the electronic components 17 in the electronics assembly 16 and spacing the electronics assembly 16 apart from the coil assembly 14, negative interactions between the electronic components 17 and a magnetic field generated by the first and second transmitting coils 100 and 200 may be reduced or minimized, as explained in more detail below.

Figure 22A:
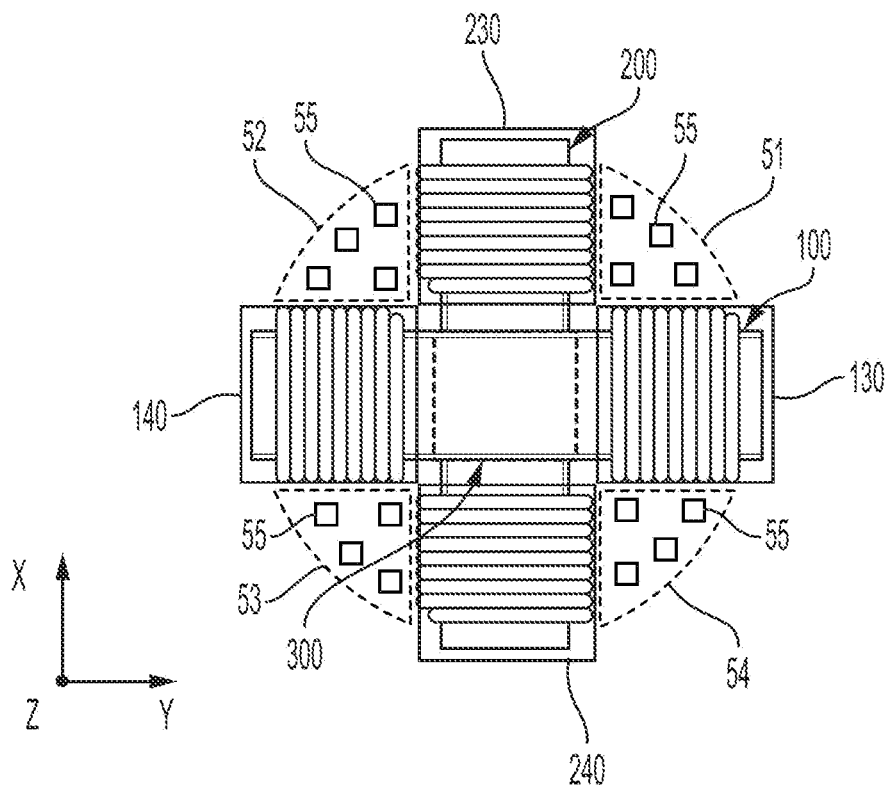
FIG. 22A shows a plan view of a coil assembly according to some embodiments.

The coil assembly 14 may include one or more electronic components (see 55 in FIG. 22A). The electronic components of the coil assembly 14 and the electronic components of the electronics assembly 16 may each include active electronic components and/or passive electronic components. Active electronic components may refer to electronic components that require a source of energy (e.g., a current) to perform their function, and passive electronic components may refer to electronic components that are able to influence the flow of electricity running through them. Active electronic components may include, for example, transistors and diodes, and passive electronic components may include, for example, resistors, capacitors, inductors, and transducers.

In some embodiments, the electronic components in the coil assembly 14 may include circuit elements of one or more LC resonant circuits and/or circuit elements of one or more current sensors. For example, the coil assembly 14 may include one or more transistors, one or more resistors, one or more capacitors, one or more inductors, one or more transformers, one or more diodes, one or more transducers, etc.

The electronics assembly 16 may include a battery 18, which may be a permanent or rechargeable battery. In some embodiments, the electronics components 17 of the electronics assembly 16 include the first and second drivers 410 and 420, the first and second power modulation electronics 510 and 520, the controller 600, the receiver 700, and/or other circuit elements (e.g., circuit elements of one or more LC resonant circuits and/or circuit elements of one or more current sensing circuits).

The components of the coil assembly 14 may be housed in a coil assembly container 14C that partially or entirely surrounds or encloses the components of the coil assembly 14 and that includes any suitable material such as plastic, glass, metal, etc.

The components of the electronics assembly 16 may be housed in an electronics assembly container 16C that partially or entirely surrounds or encloses the components of the electronics assembly 16 and that includes any suitable material such as plastic, glass, metal, etc.

The electronics assembly 16 may be spaced apart from the coil assembly 14 by a set distance in order to decrease the negative interactions between the electronic components 17 in the electronics assembly 16 and the magnetic field generated by the first and second transmitting coils 100 and 200. The electronic components 17 may convert energy from the magnetic field into eddy currents, which may reduce the efficiency of the wireless power transfer device 10 to wirelessly transfer energy to the electronic device 20, thereby requiring a larger power supply and a larger battery (e.g., battery 18). The eddy currents created in the electronic components 17 will also generate magnetic fields, which may distort the magnetic field generated by the first and second transmitting coils 100 and 200 at the electronic device 20, and thus, may reduce the accuracy of the wireless power transfer device's alignment of the magnetic field generated by the first and second transmitting coils 100 and 200 with the electronic device 20 at the electronic device 20. At least some of the energy of the eddy currents in the electronic components 17 will be dissipated as heat in regions around the electronic components 17, thereby increasing the temperature of the electronic components 17 and reducing their efficiency, thus requiring a larger power supply and a larger battery (e.g., battery 18).

The above-described negative interactions between electronic components 17 and the magnetic field generated by the first and second transmitting coils 100 and 200 may be reduced by including the electronic components 17 in the electronics assembly 16 and spacing the electronics assembly 16 apart from the coil assembly 14 by a set distance. Because the magnetic field generated by the first and second transmitting coils 100 and 200 will generally decrease in magnitude as distance from the first and second transmitting coils 100 and 200 increases, increasing the set distance between the electronics assembly 16 and the coil assembly 14 will reduce the above-described negative interactions.

Referring to FIG. 14, the coil assembly 14 and the electronics assembly 16 may be in a housing container 12 and spaced apart from each other in the housing container 12 by a first distance D1. The first distance D1 may be a smallest distance between the coil assembly 14 and the electronics assembly 16. The housing container 12 may include any suitable material, such as plastic, glass, etc.

The housing container 12 may partially or entirely surround the coil assembly 14 and the electronics assembly 16. The coil assembly 14 and the electronics assembly 16 may be set or fixed in respective regions within the housing container 12 by any suitable means. For example, the coil assembly 14 and the electronics assembly 16 may each be attached to a wall of the housing container 12 by an adhesive. In some embodiments, the coil assembly 14 and the electronics assembly 16 may each be integrated with the housing container 12.

In some embodiments, the coil assembly container 14C and/or the electronics assembly container 16C is not provided, and the components of the coil assembly 14 are spaced apart from the components of the electronics assembly 16 in the housing container 12 with or without a shielding material (e.g., a shielding layer) provided between the components of the coil assembly 14 and the components of the electronics assembly 16. The shielding material may include any suitable material such as a metal (e.g., steel, copper, brass, nickel, silver, and/or tin) and/or a nonmagnetic material. One or more wires may be provided to electrically couple the components of the electronics assembly 16 to the components of the coil assembly 14.

The first distance D1 may be a distance that suitably or desirably reduces interactions between the electronic components 17 in the electronics assembly 16 and the magnetic field generated by the first and second transmitting coils 100 and 200. Factors that may affect the distance D1 may include the length of the first transmitting coil 100, the length of the second transmitting coil 200, and/or the number, arrangement, and materials of the electronic components 17 in the electronics assembly 16. In some embodiments, the first distance D1 may be greater than or equal to 0.25, 0.5, 0.75, 1.0, 1.5, or 2.0 times a length of the first transmitting coil 100 along the first axis 100A and/or a length of the second transmitting coil 200 along the second axis 200A.

Although interaction between the electronic components 17 in the electronics assembly 16 and the magnetic field generated by the first and second transmitting coils 100 and 200 may be reduced by spacing the electronics assembly 16 away from the coil assembly 14, some such interaction may be unavoidable. However, a shape of a collective magnetic field (i.e., a magnetic field defined as a superposition of the magnetic fields) generated by the eddy currents in the electronic components 17 of the electronics assembly 16 in response to the magnetic field generated by the first and second transmitting coils 100 and 200 is determined at least in part by the configuration of the electronic components 17 (e.g., the position and/or orientation of the electronic components 17 relative to each other) in the electronics assembly 16.

The configuration of the electronic components 17 of the electronics assembly 16 may be a balanced configuration such that the magnitude of the collective magnetic field at the electronic device 20 is substantially reduced or minimized compared to other configurations and/or such that alignment between the direction of the collective magnetic field and the magnetic field generated by the first and second transmitting coils 100 and 200 at the electronic device 20 is increased or maximized compared to other configurations (e.g., compared to 85%, 87%, 90%, 93%, 95%, 97%, or 99% of all potential configurations of the electronic components 17). A balanced configuration of the electronic components 17 in the electronics assembly 16 may reduce or eliminate distortion in the direction of the magnetic field generated by the first and second transmitting coils 100 and 200 at the electronic device 20.

Referring to FIG. 15, the electronics assembly 16 may be electrically coupled to the coil assembly 14 by a cable (or board) 40. The cable 40 may include one or more internal wires electrically coupled between electronic components 17 in the electronics assembly 16 and electronic components in the coil assembly 14 to allow signals to be transmitted between the electronic components 17 in the electronics assembly 16 and the electronic components in the coil assembly 14.

A length of the cable 40 may be any length that suitably or desirably reduces interactions between the electronic components 17 in the electronics assembly 16 and the magnetic field generated by the first and second transmitting coils 100 and 200. Factors that may affect the length of the cable 40 may include the length of the first transmitting coil 100, the length of the second transmitting coil 200, and/or the number, arrangement, and materials of the electronic components 17 in the electronics assembly 16. In some embodiments, the first distance D1 may be greater than or equal to 0.5, 0.75, 1.0, 1.5, 2.0, 5.0, or 10.0 times the length of the first transmitting coil 100 along the first axis 100A and/or of the second transmitting coil 200 along the second axis 200A.

The cable 40 may include a first connector 41 at a first end of the cable 40 configured to couple and decouple the first end of the cable 40 to the coil assembly 14, or the first end of the cable 40 may be permanently coupled to the coil assembly 14. The cable 40 may include a second connector 42 at a second end of the cable 40 configured to couple and decouple the second end of the cable 40 to the electronics assembly 16, or the second end of the cable 40 may be permanently coupled to the electronics assembly 16. The first connector 41 and/or the second connector 42 may be lockable connectors. A lockable connector may refer to a connector that includes a locking mechanism generally known or available in the art that, when the connector is coupled to an assembly (e.g., the coil assembly 14 or the electronics assembly 16) and the locking mechanism is locked, prevents the connector from being decoupled from the assembly by a pulling force less than a threshold amount. The lockability of a connector provides a safety feature to reduce the risk of disconnection between the electronics assembly 16 and the coil assembly 14, for example, when the wireless power transfer device 10 is in use.

Referring to FIG. 16, the one or more internal wires in the cable 40 may include a first twisted pair of wires 44 including two wires, each electrically coupled to the first driver 410 at one end and electrically coupled to respective ends of the first wire 110 of the first transmitting coil 100 at another end. Accordingly, the first twisted pair of wires 44 may provide the first AC current to the first wire 110. The internal wires in the cable 40 may also include a second twisted pair of wires including two wires, each electrically coupled to the second driver 420 at one end and electrically coupled to respective ends of the second wire 210 of the second transmitting coil 200 at another end. Accordingly, the second twisted pair of wires may provide the second AC current to the second wire 210.

The internal wires may include a third twisted pair of wires 45 including two wires to respectively provide information about currents in the first and second wires 110 and 210 from the coil assembly 14 to the electronics assembly 16. In some embodiments, one of the two wires of the third twisted pair of wires 45 may have one end electrically coupled to the first wire 110 or to a current sensing circuit configured to measure or sense current in the first wire 110, and another end electrically coupled to the controller 600. Another one of the two wires of the third twisted pair of wires 45 may have one end electrically coupled to the second wire 210 or to a current sensing circuit configured to measure or sense current in the second wire 210, and another end electrically coupled to the controller 600.

The information about the currents in the first and second transmitting coils 100 and 200 that is provided via the third twisted pair of wires 45 may be utilized in a feedback system as described herein, for example, the second feedback system that utilizes load modulation. For example, the information about the currents in the first and second transmitting coils 100 and 200 may include and/or correspond to information in the signal transmitted from the receiver coil 800 to the wireless power transfer device 10 as described herein.

In some embodiments, at least one (e.g., all) of the one or more internal wires in the cable 40 is a shielded wire coated in a shielding material (e.g., braided copper or metallic coating). In some embodiments, a set of wires of the one or more internal wires may also be collectively shielded. For example, each of the two wires of the first twisted pair of wires 44 may be partially or entirely surrounded (e.g., coated) by a shielding material, and an additional shielding layer may partially or entirely surround (e.g., coat) both of the two wires of the first twisted pair of wires 44. Thus, the two wires of the first twisted pair of wires may be at least double shielded by the shielding material surrounding the two wires individually and by another shielding material surrounding the two wires collectively. In some embodiments, the internal wires may include Litz wire.

The cable 40 may include a sheath 43 as an outermost layer that partially or entirely encloses the one or more internal wires. The sheath 43 may include a shielding material.

Figure 17:
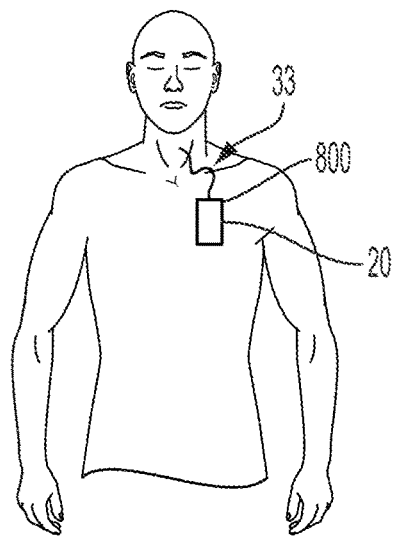
FIG. 17 shows a possible placement of an electronic device in a user.
Figure 18:
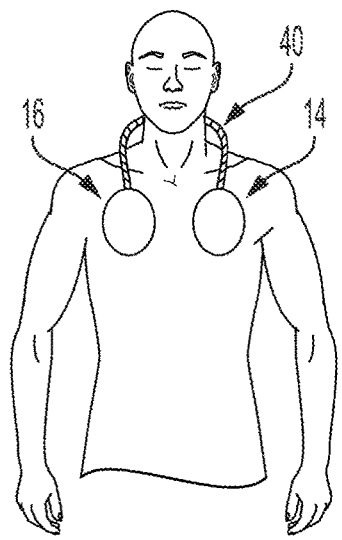
FIG. 18 shows a possible placement of a wireless power transfer device on the user of FIG. 17.
Figure 19:
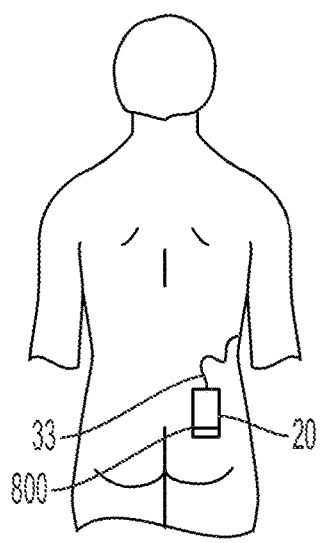
FIG. 19 shows another possible placement of an electronics device in a user.
Figure 20:
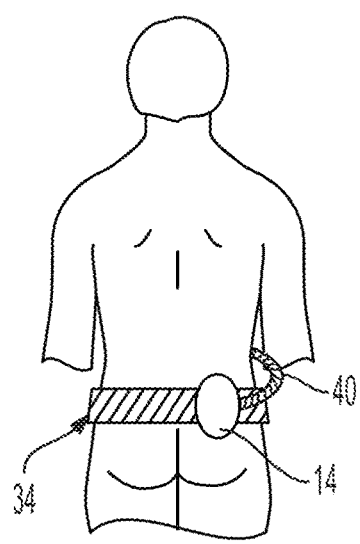
FIGS. 20 and 21 show a possible placement of the wireless power transfer device on the user of FIG. 19.
Figure 21:
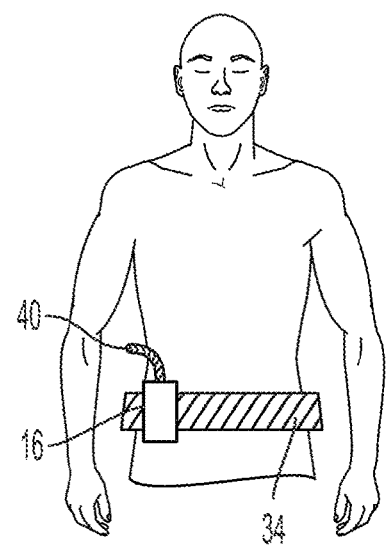

FIG. 17 shows a possible placement of an electronic device in a user. FIG. 18 shows a possible placement of a wireless power transfer device on the user of FIG. 17. FIG. 19 shows another possible placement of an electronics device in a user. FIGS. 20 and 21 show a possible placement of the wireless power transfer device on the user of FIG. 19.

Referring to FIGS. 17-21, electrically and manually coupling the electronics assembly 16 to the coil assembly 14 with the cable 40 increases the freedom that a user has to place the wireless power transfer device 10.

As shown in FIG. 17, the electronic device 20 may include a stimulator 33 (e.g., an electrode to provide stimulation to biological tissue). FIG. 17 shows a possible placement of the electronic device 20 in a user (e.g., in an upper torso region), and FIG. 18 illustrates how the cable 40 may allow the user to control placement of the coil assembly 14 in proximity with the electronic device 20 and space the electronics assembly 16 away from the coil assembly 14. For example, the user may wrap the cable 40 around his or her neck to allow the coil assembly 14 to be in proximity with the electronic device 20 at the left side of his or her chest and to allow the electronics assembly 16 to be at the right side of his or her chest.

FIG. 19 shows another possible placement of the electronic device 20 in a user (e.g., a lower torso region), and FIGS. 20 and 21 illustrate how the cable 40 may allow the user to control placement of the coil assembly 14 in proximity with the electronic device 20 and space the electronics assembly 16 away from the coil assembly 14. For example, the user may wrap the cable around the right or left side of his or her torso to allow the coil assembly 14 to be in proximity with the electronic device 20 at a front side of the user's lower torso and to allow the electronics assembly 16 to be at the back side of the user's lower torso. In some embodiments, the coil assembly 14 and the electronics assembly 16 may be attachable to a belt 34 configured to allow the coil assembly 14 and the electronics assembly to be attached or secured thereto. In some embodiments, the electronics assembly 16 may include a display to provide an interface with the wireless power transfer system.

Figure 22B:
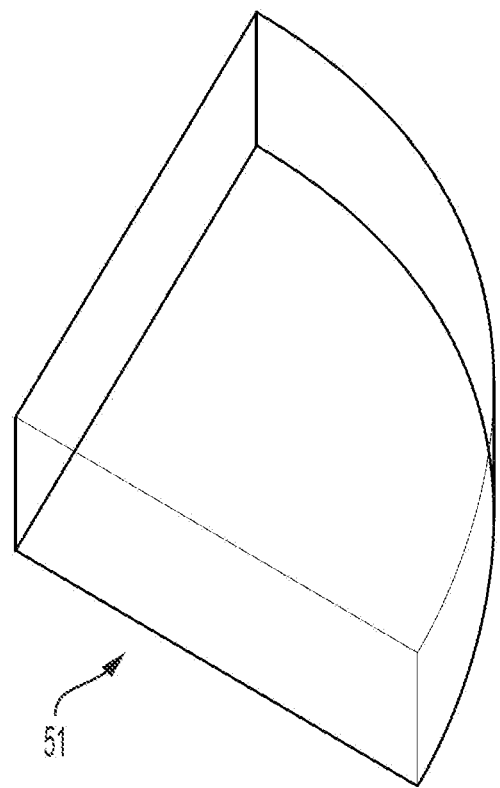
FIG. 22B shows a perspective view of a magnetic field shallow zone of FIG. 22A according to some embodiments.
Figure 23:
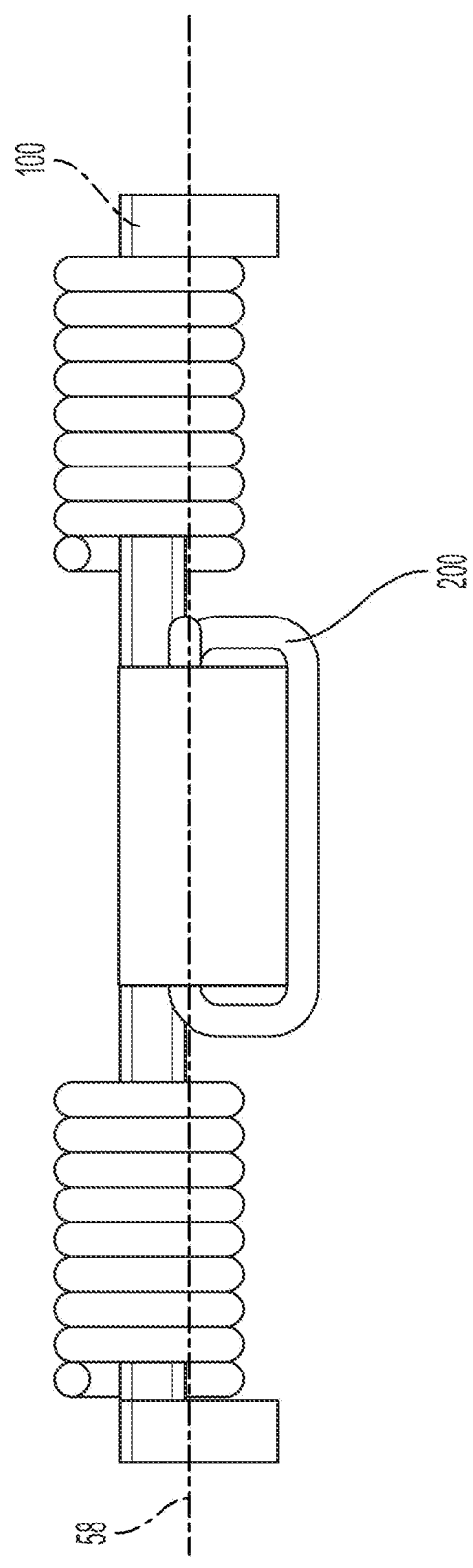
FIG. 23 shows a side view of the first and second transmitting coils according to some embodiments.
Figure 24:
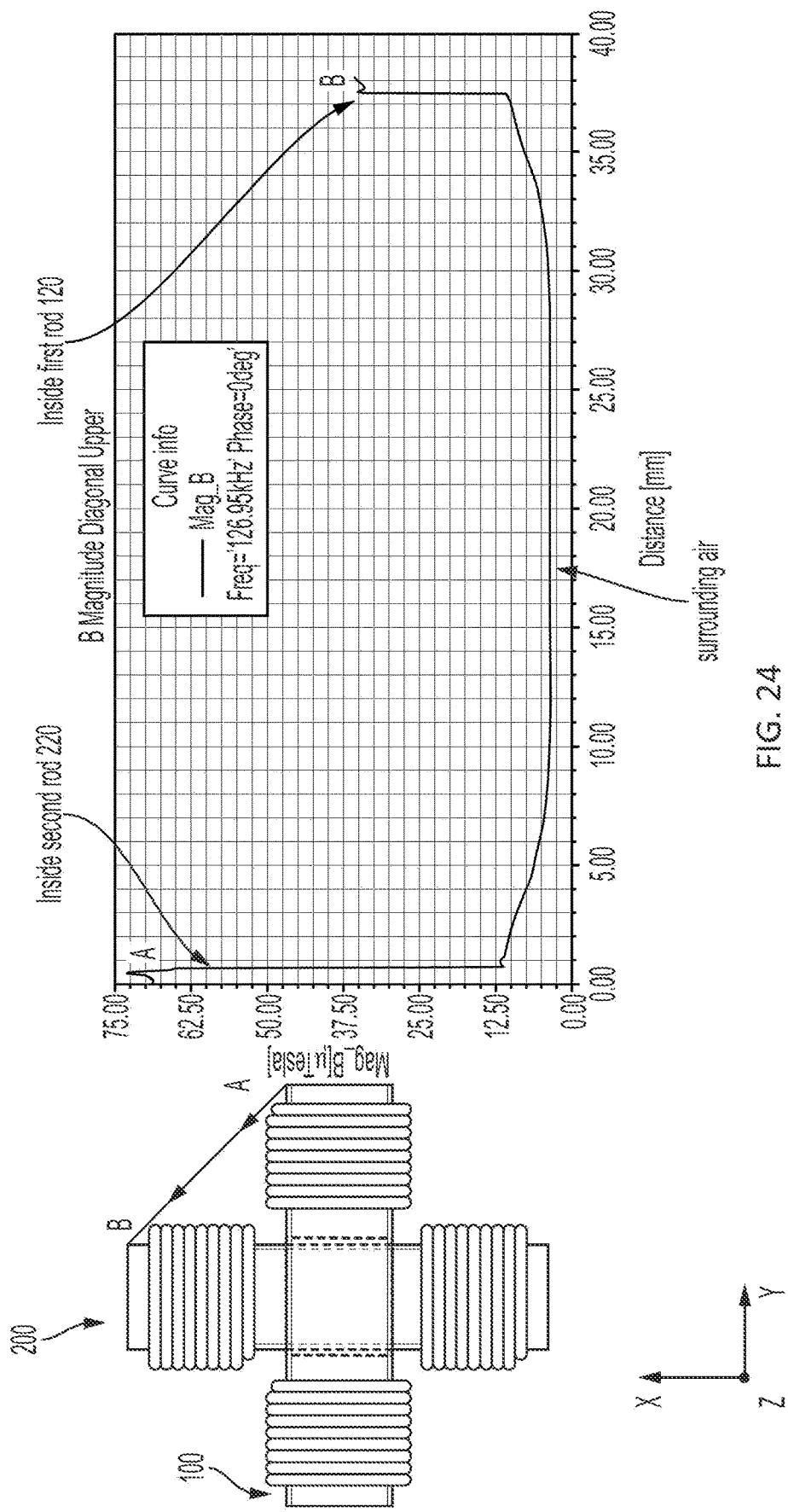
FIG. 24 shows a plan view of first and second transmitting coils and a graph of a magnitude of the magnetic field along line A-B generated by the first and second transmitting coils when the first and second transmitting coils are driven with AC currents that are in-phase and of a same amplitude, according to some embodiments.
Figure 25:
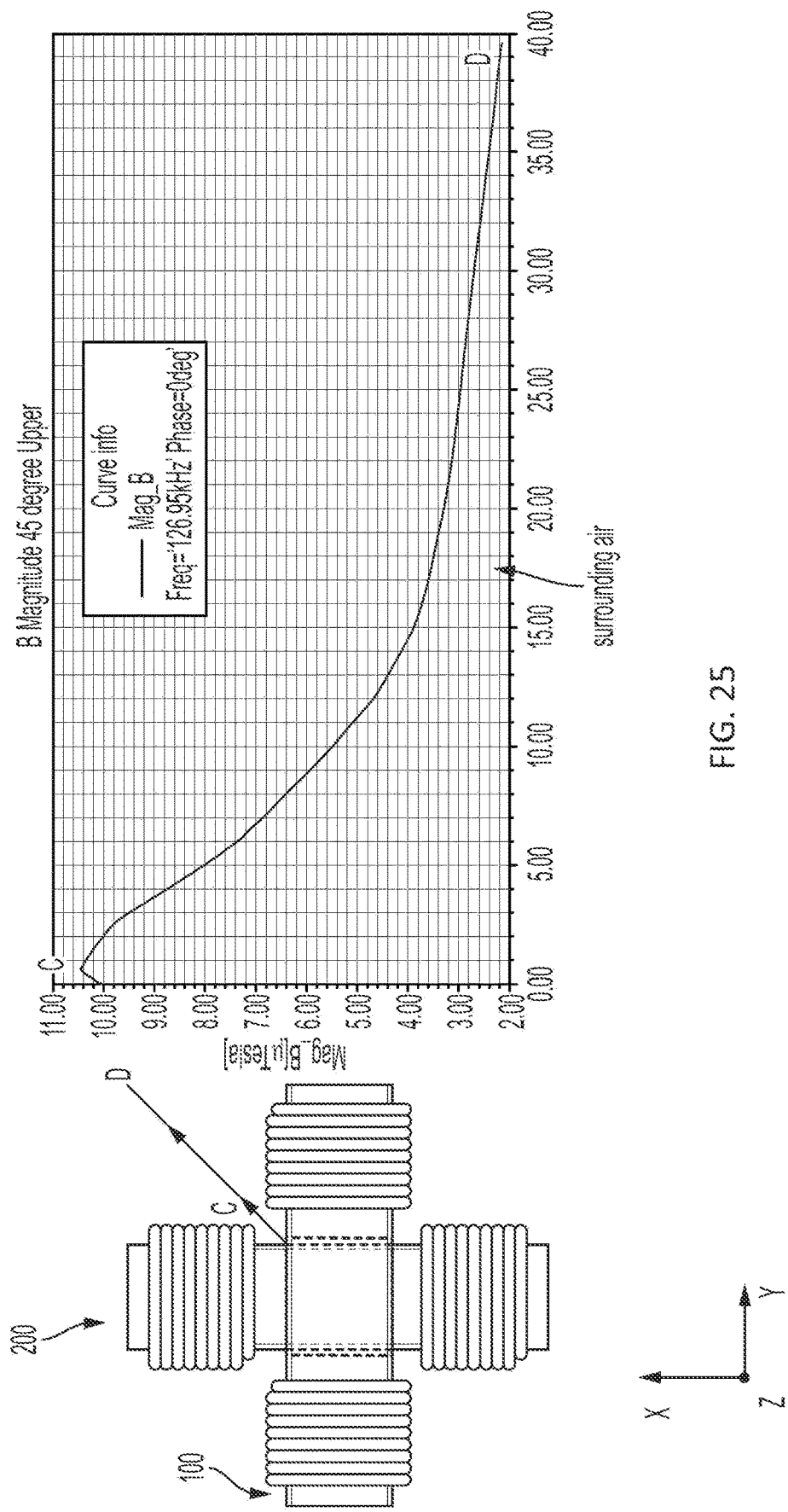
FIG. 25 shows a plan view of first and second transmitting coils and a graph of a magnitude of the magnetic field along line C-D generated by the first and second transmitting coils when the first and second transmitting coils are driven with AC currents that are in-phase and of a same amplitude, according to some embodiments.
Figure 26:
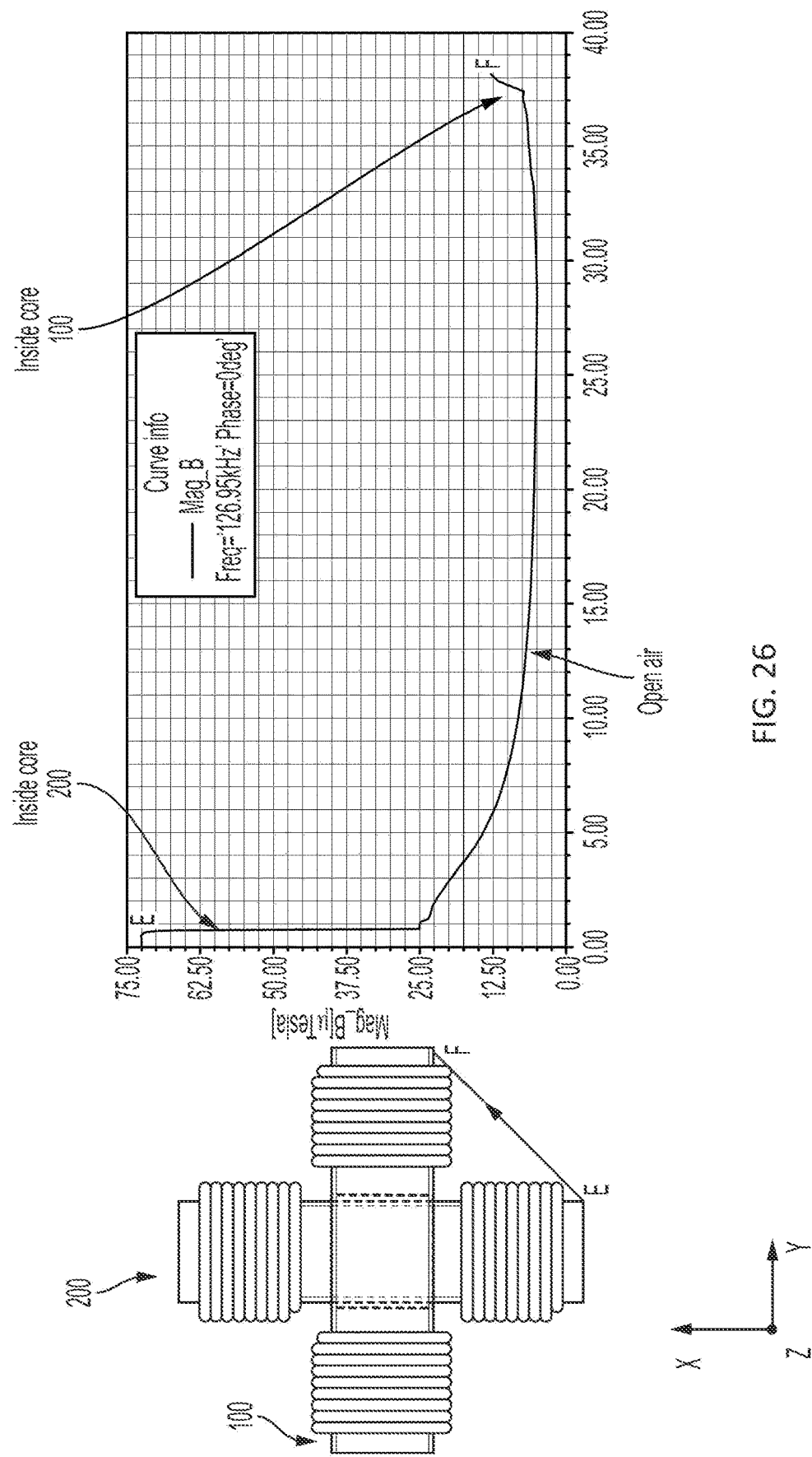
FIG. 26 shows a plan view of first and second transmitting coils and a graph of a magnitude of the magnetic field along line E-F generated by the first and second transmitting coils when the first transmitting coil is driven with AC current and the second transmitting coil is not driven, according to some embodiments.
Figure 27:
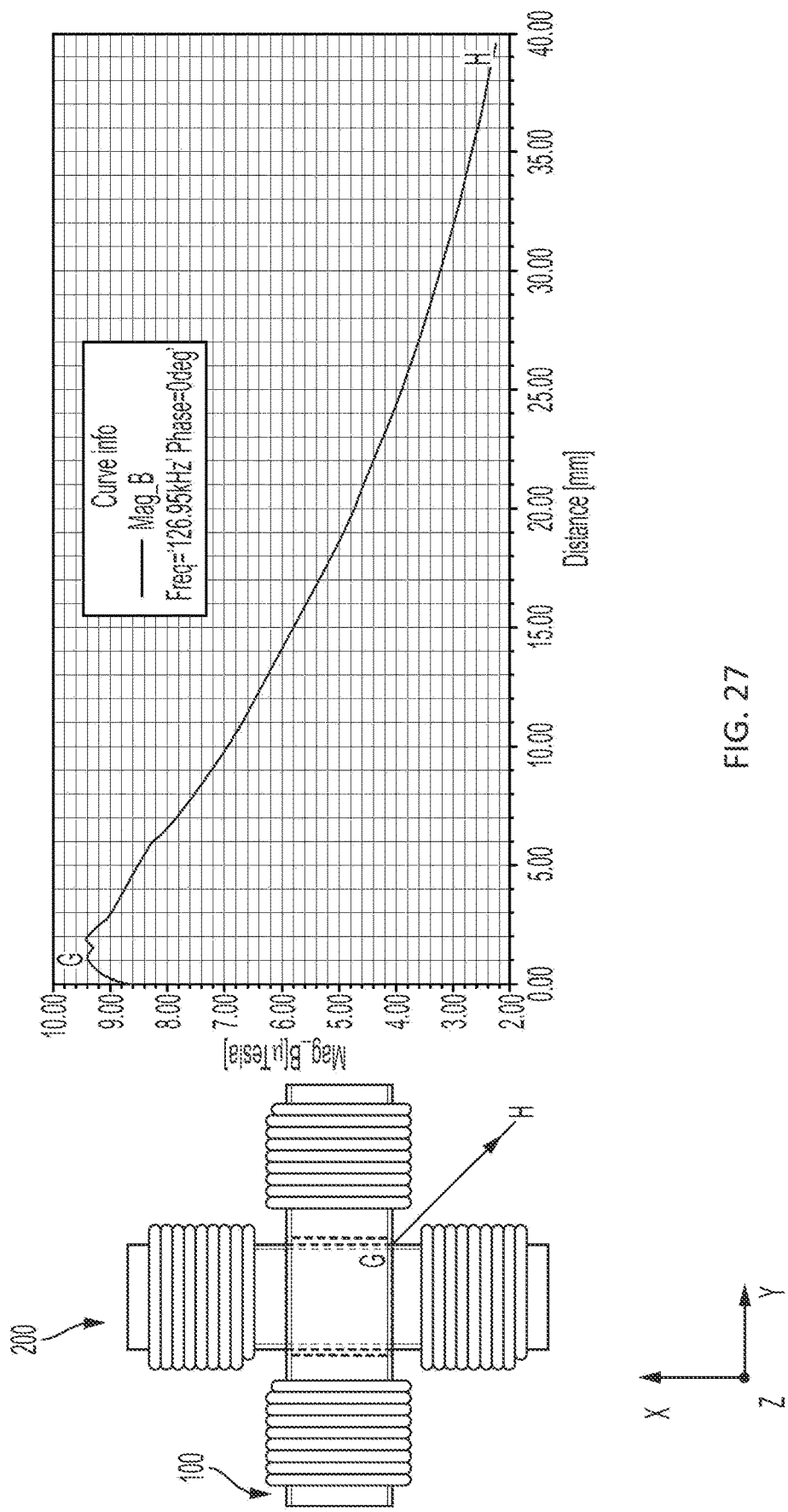
FIG. 27 shows a plan view of first and second transmitting coils and a graph of a magnitude of the magnetic field along line G-H generated by the first and second transmitting coils when the first transmitting coil is driven with AC current and the second transmitting coil is not driven, according to some embodiments.

FIG. 22A shows a plan view of a coil assembly according to some embodiments. FIG. 22B shows a perspective view of a magnetic field shallow zone of FIG. 22A according to some embodiments. FIG. 23 shows a side view of the first and second transmitting coils according to some embodiments. FIG. 24 shows a plan view of the first and second transmitting coils and a graph of a magnitude of the magnetic field along line A-B generated by the first and second transmitting coils when the first and second transmitting coils are driven with AC currents that are in-phase and of a same amplitude, according to some embodiments. FIG. 25 shows a plan view of the first and second transmitting coils and a graph of a magnitude of the magnetic field along line C-D generated by the first and second transmitting coils when the first and second transmitting coils are driven with AC currents that are in-phase and of a same amplitude, according to some embodiments. FIG. 26 shows a plan view of the first and second transmitting coils and a graph of a magnitude of the magnetic field along line E-F generated by the first and second transmitting coils when the first transmitting coil is driven with AC current and the second transmitting coil is not driven, according to some embodiments. FIG. 27 shows a plan view of the first and second transmitting coils and a graph of a magnitude of the magnetic field along line G-H generated by the first and second transmitting coils when the first transmitting coil is driven with AC current and the second transmitting coil is not driven, according to some embodiments.

Referring to FIGS. 22A-27, at least one electronic component 55 may be included in the coil assembly 14 and positioned in a magnetic field shallow zone. The electronic components 55 may include active electronic components and/or passive electronic components. The electronic components 55 may include electronic components to drive the first and second transmitting coils 100 and 200, electronic components of one or more LC resonant circuits, electronic components of a feedback system, and/or electronic components utilized to align a magnetic field generated by the first and second transmitting coils 100 and 200 with the electronic device 20.

As explained herein, negative interactions between the electronic components 55 and the magnetic field generated by the first and second transmitting coils 100 and 200 may occur, and the severity of these negative interactions is generally proportional to the magnetic flux of the magnetic field through surfaces of the electronic components 55. The magnetic flux through a surface of the electronic components 55 generally increases as the magnitude of the magnetic field at the surface increases and as the angle between the surface and the magnetic field at the surface gets closer to 90 degrees. Accordingly, it is desirable to position and/or orient the electronic components 55 in the coil assembly 14 to reduce the magnitude of the magnetic field at surfaces of the electronic components 55 and/or to decrease the angle between the surfaces and the magnetic field at the surfaces.

One or more magnetic field shallow zones may exist near the first and second transmitting coils 100 and 200, where a magnitude of a magnetic field generated by the first and second transmitting coils 100 and 200 is relatively low and/or substantially reduced, and where one or more of the electronic components 55 may be positioned in the magnetic field shallow zones to reduce or minimize the negative interactions between the electronic components and the magnetic field.

Referring to FIG. 22A, the first and second transmitting coils 100 and 200 may cross each other in a plan view at the area of overlap 300, and the magnetic field shallow zones may be positioned in a plan view angularly between the first transmitting coil 100 and the second transmitting coil 200.

For example, the first transmitting coil 100 may include a first portion 130 extending in the plan view from the area of overlap 300 (e.g., from a first side of the area of overlap 300) and a second portion 140 extending in the plan view from the area of overlap 300 (e.g., from a second side of the area of overlap 300 opposite to the first side), and the second transmitting coil 200 may include a first portion 230 extending in the plan view from the area of overlap 300 (e.g., from a third side of the area of overlap 300) and a second portion 240 extending in the plan view from the area of overlap 300 (e.g., from a fourth side of the area of overlap 300 opposite to the third side). In some embodiments, the area of overlap 300 may form a square or rectangle shape in the plan view defined by the first side, the second side, the third side, and the fourth side of the area of overlap 300.

A first magnetic field shallow zone 51 may be positioned in the plan view angularly between the first portion 130 and the first portion 230, a second magnetic field shallow zone 52 may be positioned in the plan view angularly between the second portion 140 and the first portion 230, a third magnetic field shallow zone 53 may be positioned in the plan view between the second portion 140 and the second portion 240, and a fourth magnetic field shallow zone 54 may be positioned in the plan view angularly between the first portion 130 and the second portion 240.

The magnetic field shallow zones may all be the same or similar in geometric shape, or one or more magnetic field shallow zones may be different in shape compared to one or more of the remaining magnetic field shallow zones.

In some embodiments, the first magnetic field shallow zone 51 may have a planar shape in the plan view of a rectangle (e.g., a square) or of a sector of a circle, ellipse, or egg shape. The planar shape may correspond to a top surface and/or bottom surface of the first magnetic field shallow zone 51. When the planar shape is a sector, the sector may span an angle ranging from about 15 degrees to about 165 degrees, about 45 degrees to about 135 degrees, about 88 degrees to about 92 degrees, 89 degrees to 91 degrees, or about 90 degrees. Two straight sides of the sector may be generally parallel to, and/or adjacent to, sidewalls of the first and second portions 130 and 230 that face the first magnetic field shallow zone 51. The corner of the sector where the two straight sides cross may be at or near, or may correspond to, a corner in the plan view where the sidewalls of the first and second portions 130 and 230 that face toward the first magnetic field shallow zone 51 cross. The two straight sides of the sector may have lengths respectively equal to or less than the sidewalls of the first and second portions 130 and 230 that face the first magnetic field shallow zone 51. In some embodiments, the planar shape of the first magnetic field shallow zone 51 is a sector of a circle having a radius equal to or less than the length of the first portion 130 and/or of the first portion 230. For example, the radius may be equal to or less than a distance between a first point along the first axis 100A corresponding to an end of the first transmitting coil 100 and a second point along the first axis 100A corresponding to the first side of the area of overlap 300.

In some embodiments, the planar shape of the first magnetic field shallow zone 51 is a rectangle, and two crossing sides of the rectangle and the corner of the rectangle where the two crossing sides cross may have features the same as or similar to the features described herein of the two straight sides of the sector and of the corner of the sector where the two straight sides of the sector cross.

The first magnetic field shallow zone 51 may have a thickness in a thickness direction (e.g., the Z-direction, as shown in FIG. 22A) perpendicular to the plan view (e.g., the X-Y plane, as shown in FIG. 22A), and the thickness of the first magnetic field shallow zone 51 may be uniform or variable over the planar shape of the first magnetic field shallow zone 51. In some embodiments, the thickness of the first magnetic field shallow zone 51 may be equal to or less than a largest or smallest distance in the thickness direction between a top side of a topmost one of the first and second transmitting coils 100 and 200 and a bottom side of another one of the first and second transmitting coils 100 and 200, for example, equal to or less than 0.5, 0.25, 0.10, 0.05, or 0.01 times any such thickness. In some examples, the thickness of the first magnetic field shallow zone 51 may be equal to or less than a largest, smallest, or average thickness of the first transmitting coil 100 or of the second transmitting coil 200, for example, equal to or less than 0.5, 0.25, 0.10, 0.05, or 0.01 times any such thickness.

The first magnetic field shallow zone 51 may be positioned along the thickness direction between the first and second transmitting coils 100 and 200 (e.g., between a top surface of a topmost one of the first and second transmitting coils 100 and 200 and a bottom surface of another one of the first and second transmitting coils 100 and 200).

Referring to FIG. 23, a plane 58 parallel to the plan view (e.g., parallel to the X-Y plane) may extend between the first and second transmitting coils 100 and 200, for example, between a bottom surface of a topmost one of the first and second transmitting coils 100 and 200 and a top surface of another one of the first and second transmitting coils 100 and 200. In some embodiments, the plane 58 may extend through the intermediate space 300a. In some embodiments, the plane 58 may extend through (e.g., intersect) a point equidistant in the thickness direction between the first and second transmitting coils 100 and 200 (e.g., equidistant between geometric centers of the first and second transmitting coils 100 and 200) or a point corresponding to a center (e.g., a geometric center) of the intermediate space 300a, and the first magnetic field shallow zone 51 may be centered in the thickness direction on the plane 58.

In some embodiments, the first magnetic field shallow zone 51 may include (e.g., be) a region where a magnitude of a magnetic field generated by the first and second transmitting coils 100 and 200 is lower than a set or threshold value.

In more detail, the first and second portions 130 and 140 of the first transmitting coil 100 may respectively include a first and second end of the first transmitting coil 100, and the first and second portions 230 and 240 of the second transmitting coil 200 may respectively include a first and second end of the second transmitting coil 200. For example, the first and second ends of the first transmitting coil 100 may correspond to the two first thick portions 120b (see FIG. 2) of the first transmitting coil 100, and the first and second ends of the second transmitting coil 200 may correspond to the two second thick portions 220b (see FIG. 2) of the second transmitting coil 200.

In some embodiments, the first magnetic field shallow zone 51 may include (e.g., be) a region where, when the first and second transmitting coils are driven with in-phase AC currents of a same magnitude, a first ratio of a first magnitude of a magnetic field at any point in the region to a second magnitude of a magnetic field at the first end of the first transmitting coil 100 (e.g., just inside the first rod 120 at a first end of the first rod 120) is less than a set value such as 0.30, 0.25, 0.20, 0.15, 0.10, 0.08, 0.05, 0.03, or 0.01. The first and second magnitudes may each be instantaneous magnitudes at a same point in time or may be magnitudes that are time-averaged over a set time span. The time span may be one or more periods (e.g., 1, 2, 5, 10, 20, 50, 100, or 1,000 periods) of the first AC current and/or the second AC current. In some embodiments, the time span is within a range of 0.01 second to 10 minutes.

The graph of FIG. 24 shows that, when the first and second transmitting coils 100 and 200 are driven with AC currents of a same magnitude and the first and second transmitting coils 100 and 200 are surrounded by air, the magnitude of the magnetic field generated by the first and second transmitting coils 100 and 200 is substantially reduced at portions of the line A-B outside of the first and second rods 120 and 220 and angularly between the first and second transmitting coils 100 and 200 compared to at and in end portions of the first and second rods 120 and 220. Referring to FIGS. 24 and 25, the graph of FIG. 25 shows that, when the first and second transmitting coils 100 and 200 are driven with AC currents of a same magnitude and the first and second transmitting coils 100 and 200 are surrounded by air, the magnitude of the magnetic field generated by the first and second transmitting coils 100 and 200 is substantially less along the line C-D angularly between the first and second transmitting coils 100 and 200 compared to at and in the end portions of the first and second rods 120 and 220.

In theory, when the first and second transmitting coils 100 and 200 are driven with in-phase AC currents of the same amplitude, there may be one or more isolated points in time over a period of the first AC current and/or the second AC current when the first and second transmitting coils 100 and 200 cease to generate magnetic fields, and the first ratio is undefined because the denominator is zero. However, it is to be understood that, when the first and second magnitudes of the first ratio are instantaneous magnitudes, the first and second magnitudes are magnitudes at a point of time different than points in time in which the first ratio may be undefined. It is to also be understood that when the first and second magnitudes of the first ratio are time-averaged magnitudes, the time-average does not include the first and second magnitudes at the isolated points in time where the first ratio may be undefined.

Because the magnetic field generated by the first and second transmitting coils 100 and 200 generally decreases as the distance from the first and second transmitting coils 100 and 200 increases, it will be understood that the region where the first ratio is below the set value may be further confined (e.g., truncated) by a shallow zone confinement region including all points that are (i) angularly between the first portions 130 and 230 in the plan view, and (ii) positioned in the thickness direction between a top surface of a topmost one of the first and second transmitting coils 100 and 200 and a bottom surface of another one of the first and second transmitting coils 100 and 200.

In some embodiments, the first magnetic field shallow zone 51 may include (e.g., be) a region where, when one of the first and second transmitting coils 100 and 200 is driven with AC current and another one of the first and second transmitting coils 100 and 200 is not driven, a second ratio of a first magnitude of a magnetic field at any point in the region to a second magnitude of a magnetic field at an end of the one of the first and second transmitting coils 100 and 200 (e.g., just inside the rod at an end of the rod of the one of the first and second transmitting coils 100 and 200) is less than a set value such as 0.30, 0.25, 0.20, 0.15, 0.10, 0.08, 0.05, 0.03, or 0.01. The first and second magnitudes may each be instantaneous magnitudes at a same point in time or may be magnitudes that are time-averaged over a set time span, as described herein. The graph of FIG. 26 shows that, when the second transmitting coil 200 is driven with AC current and the first transmitting coil 100 is not driven, and the first and second transmitting coils 100 and 200 are surrounded by air, the magnitude of the magnetic field generated by the first and second transmitting coils 100 and 200 is substantially reduced at portions of the line E-F outside of the first and second rods 120 and 220 and angularly between the first and second transmitting coils 100 and 200 compared to at and in an end portion of the second rod 220. Referring to FIGS. 26-27, the graph of FIG. 27 shows that, when the second transmitting coil 200 is driven with AC current and the first transmitting coil 100 is not driven, and the first and second transmitting coils 100 and 200 are surrounded by air, the magnitude of the magnetic field generated by the first and second transmitting coils 100 and 200 is substantially less along the line G-H angularly between the first and second transmitting coils 100 and 200 compared to at and in the end portion of the second rod 220.

In some embodiments, the first magnetic field shallow zone 51 may include a portion of a low-angle magnetic field plane that is parallel to the plan view (e.g., parallel to the X-Y plane) and between the first and second transmitting coils 100 and 200, where an angle between a magnetic field generated by the first and second transmitting coils 100 and 200 at the low-angle magnetic field plane to the low-angle magnetic field plane is less than a set angle such as 20 degrees, 15 degrees, 10 degrees, or 5 degrees. In some embodiments, the low-angle magnetic field plane is the plane 58. One or more of the electronic components 55 may be at the low-angle magnetic field plane, for example, may intersect the low-angle magnetic field plane or be spaced apart from the low-angle magnetic field plane in the thickness direction by less than a set distance. In some embodiments, the set distance may be a largest, smallest, or average thickness of the first transmitting coil 100 or 0.5, 0.25, 0.20, 0.15, 0.10, or 0.05 times any such thickness. The electronic components 55 at the low-angle magnetic field plane may be oriented to have their largest-area surface(s) generally parallel to the low-angle magnetic field plane. For example, the electronic components 55 at the low-angle magnetic field plane may be oriented to maximize their area in the plan view or to have an area in the plan view greater than a percentage of all possible orientations, such as 90%, 93%, 95%, 97%, or 99%.

Because the first and second axes 100A and 200A of the first and second transmitting coils 100 and 200 may be parallel in the plan view to the low-angle magnetic field plane and spaced apart in the thickness direction from the low-angle magnetic field plane by a relatively small distance compared to the lengths of the first and second transmitting coils 100 and 200, when one or both of the first and second transmitting coils 100 and 200 are driven with AC current, a direction of a magnetic field generated by the first and second transmitting coils 100 and 200 at the low-angle magnetic field plane may form a small angle to the low-angle magnetic field plane. Accordingly, the magnetic flux of the magnetic field generated by the first and second transmitting coils 100 and 200 through surfaces of electronic components 55 at the low-angle magnetic field plane and oriented to have their largest-area surface generally parallel with the low-angle magnetic field plane may be reduced.

The second, third, and fourth magnetic field shallow zones 52, 53, and 54 may each have any shape that the first magnetic field shallow zone 51 may have, and the second, third, and fourth magnetic field shallow zones 52, 53, and 54 may each have a shape that is the same as or different from the shape of the first magnetic field shallow zone 51. The second, third, and fourth magnetic field shallow zones 52, 53, and 54 may each be positioned and oriented in any manner similar to or the same as the first magnetic field shallow zone 51, and the second, third, and fourth magnetic field shallow zones 52, 53, and 54 may each be positioned and/or oriented in a manner that is the same as or different from the manner in which the first magnetic field shallow zone 51 is positioned and/or oriented. In some embodiments, the first and second axes 100A and 200A of the first and second transmitting coils 100 and 200 are perpendicular to each other in the plan view, and the first to fourth magnetic field shallow zones 51-54 are positioned in the plan view in four quadrants defined by the first and second transmitting coils 100 and 200.

Figure 28:
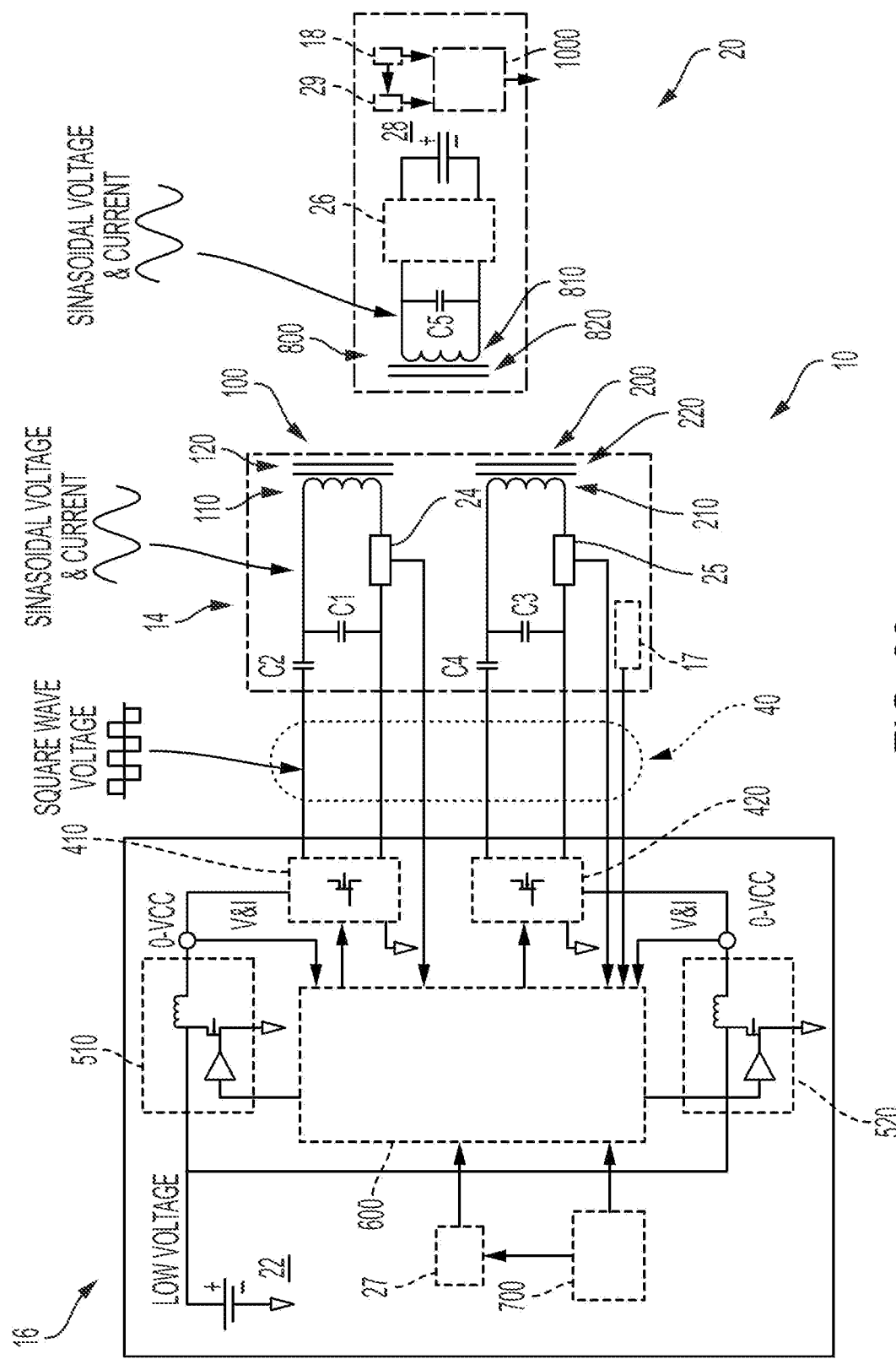
FIG. 28 shows a schematic view of a circuit diagram of the wireless power transfer system according to some embodiments.

FIG. 28 shows a schematic view of a circuit diagram of the wireless power transfer system according to some embodiments.

Referring to FIG. 28, the wireless power transfer device 10 may include the coil assembly 14, the electronics assembly 16, and a cable 40 coupled between the coil assembly 14 and the electronics assembly 16.

The coil assembly 14 may include the first and second transmitting coils 100 and 200, a first capacitor C1 coupled in parallel with the first wire 110 of the first transmitting coil 100, a second capacitor C2 coupled in series with the first capacitor C1 and first wire 110, a third capacitor C3 coupled in parallel with the second wire 210 of the second transmitting coil 200, a fourth capacitor C4 coupled in series with the third capacitor C3 and second wire 210, a first current sensor 24 coupled to the first wire 110, and a second current sensor 25 coupled to the second wire 210.

The wireless power transfer device 10 may include a first LC resonant circuit corresponding to the first transmitting coil 100 and a second LC resonant circuit corresponding to the second transmitting coil 200. The first LC resonant circuit includes the first wire 110, the first capacitor C1, and the second capacitor C2, and the second LC resonant circuit includes the second wire 210, the third capacitor C3, and the fourth capacitor C4. However, the present disclosure is not limited thereto. For example, in some embodiments, the first LC resonant circuit includes the first wire 110 and the first capacitor C1, and the second capacitor C2 is not included, and/or the second LC resonant circuit includes the second wire 210 and the third capacitor C3, and the fourth capacitor C4 is not included.

The first and second capacitors C1 and C2 may form an impedance matching network that matches the impedance of the first driver 410. The resonant frequency of the first LC resonant circuit may be defined by equation 1 below, $$f_{res1} = \frac{1}{2\pi\sqrt{L_{110}(C1_{cap} + C2_{cap})}},$$ [Equation 1]

wherein $f_{res1}$ is the resonant frequency of the first LC resonant circuit, $L_{110}$ is the inductance of the first wire 110, and $C1_{cap}$ and $C2_{cap}$ are the first and second capacitances of the first and second capacitors C1 and C2, respectively. The resonant frequency of the second LC resonant circuit may be defined in a manner similar to how the resonant frequency of the first LC resonant circuit is defined. In some embodiments, the resonant frequencies of the first and second LC resonant circuits are the same or similar, and an angle between the first and second axes 100A and 200A of the first and second transmitting coils may be within a range of 89 degrees to 91 degrees to avoid substantial coupling between the first and second transmitting coils 100 and 200 when the first transmitting coil 100 and/or the second transmitting coil 200 are driven.

A ratio of the second capacitance $C2_{cap}$ to the first capacitance $C1_{cap}$ may be set such that, when the first driver 410 produces its highest pulse voltage, the electronic device 20 will receive its required power dependent on a coupling coefficient between the electronic device 20 and the wireless power transfer device 10.

The first and second current sensors 25 and 26 are respectively configured to measure or sense a current flowing through the first and second wires 110 and 210 and to provide information about the current to the controller 600.

The electronics assembly 16 may include the first and second drivers 410 and 420, the first and second power modulation electronics 510 and 520, the controller 600, the receiver 700, and a permanent or rechargeable battery 22. The controller 600 may include a microcontroller or system on a chip that contains firmware and hardware. The controller 600 may be configured to output analog or digital signals to the first and second power modulation electronics 510 and 520 and to output digital square wave signals to the first and second drivers 410 and 420. The controller 600 may be configured to receive signals (e.g., voltage feedback) from the outputs of the first and second power modulation electronics 510 and 520, the first and second current sensors 24 and 25, and the receiver 700.

The first and second drivers 410 and 420 may output square wave voltages to the first and second LC resonant circuits. Sinusoidal voltage and current may be provided to the first and second wires 110 and 210 respectively in the first and second LC resonant circuits. Local feedback information may be provided to the controller 600 from the first and second current sensors 24 and 25, and global feedback information may be provided to the controller 600 from the receiver 700 that receives the global feedback information from the electronic device 20 (e.g., from the transmitter 1000). The local and/or global feedback information may be utilized in a feedback system, such as any feedback system described herein.

The electronic device 20 may include the receiver coil 800 comprising a receiver rod 820 and a receiver wire 810 wound around the receiver rod 820. The receiver rod 820 may include any material that the first rod 120 may include, and the receiver rod 820 may include a same or different material as the first rod 120 includes. The receiver wire 810 may be wound around the receiver rod 820, for example, to form a solenoid.

The electronic device 20 may include a fifth capacitor C5 coupled in parallel with the receiver wire 810 to form at least part of a third LC resonant circuit, a rechargeable battery 28, a power management system 26, and the transmitter 1000. In some embodiments, the third LC resonant circuit may include a sixth capacitor coupled in series with the fifth capacitor C5 and receiver wire 810. The fifth capacitor C5 and the sixth capacitor may form at least part of a capacitive matching network.

The power management system 26 may be configured to regulate system voltage and charging of the rechargeable battery 28, and may be configured to convert an AC voltage in the third LC resonant circuit to a DC voltage.

The transmitter 1000 may transmit information about a state of charge of the rechargeable battery 28, a voltage of the rechargeable battery 28, and/or a rectified voltage of the receiver coil 800 and/or of the third LC resonant circuit.

In some embodiments, the wireless power transfer device 10 is configured to pre-align, with the receiver coil 800 of the electronic device 20, a magnetic field to be generated by the wireless power transfer device 10 such that, in response to the wireless power transfer device 10 generating the magnetic field, the magnetic field is aligned, at the receiver coil 800, with the receiver coil 800.

The wireless power transfer device 10 (e.g., the controller 600 of the wireless power transfer device 10) may be configured to determine (e.g., calculate, for example, via an algorithm) a magnetic field (e.g., configured to determine the magnetic field before generating the magnetic field), from among a plurality of directionally different potential magnetic fields that the wireless power transfer device 10 is configured to generate, that has, at the receiver coil 800, a direction aligned with the receiver coil 800. As utilized herein, reference to a direction of a magnetic field at the receiver coil 800 being aligned with the receiver coil 800 may include a direction of exact alignment (i.e., a direction parallel to an axis of the receiver coil 800) and a direction substantially optimally or suitably aligned (e.g., a direction within 15 degrees, 10 degrees, 5 degrees, 3 degrees, 1 degree, or 0.5 degrees from a direction closest to exact alignment) with the receiver coil 800 from among directions of the potential magnetic fields that the wireless power transfer device 10 is configured to generate. In some embodiments, based, for example, on the geometry of the wireless power transfer device 10 relative to the electronic device 20, the wireless power transfer device 10 is not able to generate a magnetic field having a direction at the receiver coil 800 that is exactly aligned with the receiver coil 800. However, the wireless power transfer device 10 may be configured to generate a plurality of directionally different magnetic fields having, at the receiver coil 800, different degrees of alignment with the receiver coil 800, including an optimal degree alignment (e.g., a degree of alignment closest to the exact alignment from among the different degrees of alignment), and the wireless power transfer device 10 may be configured to determine a magnetic field, from among the directionally different magnetic fields, having a degree of alignment with the receiver coil 800 that is the optimal degree of alignment or that deviates from the optimal degree of alignment by less than 15 degrees, 10 degrees, 5 degrees, 3, degrees, 1 degree, or 0.5 degrees.

In some embodiments, as explained herein, the wireless power transfer device 10 is configured to differentially drive the first and second transmitting coils 100 and 200 respectively with first and second currents (e.g., first and second AC currents) having controllably different amplitudes, and to thereby directionally control the magnetic field generated by the first and second transmitting coils 100 and 200. For example, a direction at a set position (e.g., at the receiver coil 800) of a potential magnetic field that the wireless power transfer device 10 is configured to generate may depend on a potential amplitude ratio of (i) an amplitude of a first current that the wireless power transfer device 10 is configured to drive the first transmitting coil 100 with to generate the potential magnetic field, to (ii) an amplitude of a second current that the wireless power transfer device 10 is configured to drive the second transmitting coil 200 with to generate the potential magnetic field. The wireless power transfer device 10 may be configured to determine (e.g., calculate, for example, by an algorithm) an amplitude ratio such that, in response to the first transmitting coil 100 being driven with a first current, the second transmitting coil 200 being driven with a second current, and a ratio of an amplitude of the first current to an amplitude of the second current being the amplitude ratio, the wireless power transfer device 10 will generate a magnetic field having, at the receiver coil 800, a direction aligned with the receiver coil 800. As utilized herein, reference to determining the amplitude ratio may include determining a ratio of amplitudes (e.g., from which any number of pairs of amplitudes of the first and second currents can be determined) and/or determining a pair of amplitudes of the first and second currents that satisfy the amplitude ratio. In some embodiments, the wireless power transfer device 10 may be configured to further determine a relative phase difference (e.g., in-phase corresponding to a relative phase difference of zero degrees, or a 180 degree relative phase difference) between the first and second currents such that, when the first and second transmitting coils are respectively driven with the first and second currents satisfying the amplitude ratio and the relative phase difference, the wireless power transfer device 10 generates the magnetic field having, at the receiver coil 800, the direction aligned with the receiver coil 800.

Figure 29:
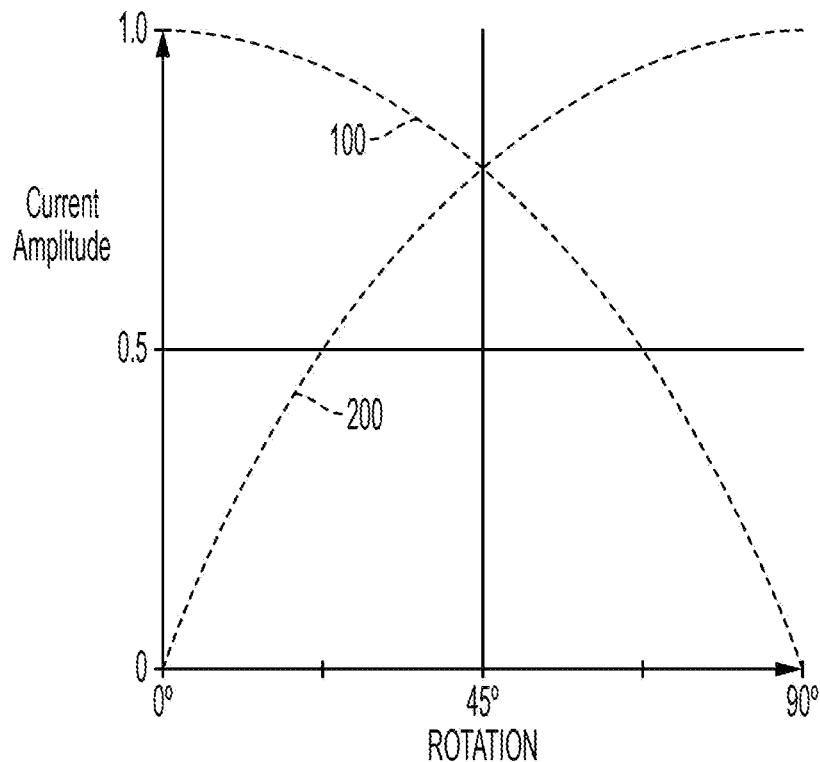
FIG. 29 shows a graph displaying current magnitude versus a direction of a magnetic field generated by a wireless power transfer device according to an embodiment.
Figure 30:
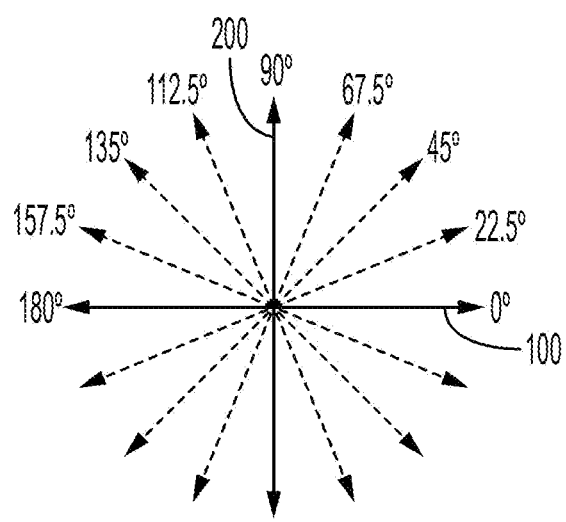
FIG. 30 shows a graph displaying various directions of a magnetic field generated by a wireless power transfer device according to an embodiment.

For example, FIG. 29 shows a graph displaying the direction of a potential magnetic field (horizontal axis) that can be generated by the first and second transmitting coils 100 and 200 at a position above an area of overlap between the first and second transmitting coils 100 and 200 versus a pair of potential amplitudes (vertical axis) of first and second currents that can be utilized to respectively drive in-phase the first and second transmitting coils 100 and 200 to generate the potential magnetic field. The amplitude axis (vertical axis) in FIG. 29 is unitless for convenience of illustration. FIG. 30 shows a graph displaying the directions of some of the potential magnetic fields, at a position above an area of overlap between the first and second transmitting coils 100 and 200, that may be generated by the first and second transmitting coils 100 and 200 in response to being respectively driven with some of the pairs of the first and second currents shown in FIG. 29. In FIG. 30, the first and second transmitting coils 100 and 200 are respectively aligned parallel to the 0 degree line and to the 90 degree line. In the embodiment of FIG. 29, the amplitudes of the first and second currents are shown as having sinusoidal shapes such that the magnitude of the potential magnetic field at the position above the area of overlap in FIG. 30 is substantially constant.

As explained herein, because the wireless power transfer device 10 may be configured to controllably drive the first and second currents either in-phase or 180 degree out-of-phase, the wireless power transfer device 10 can control the direction of the magnetic field to have any direction within the 0 to 90 degree range (corresponding to when the first and second currents are in-phase) and to have any direction within the 90 to 180 degree range (corresponding to when the first and second currents are 180 degrees out-of-phase). Furthermore, because the first and second currents may be AC currents, the 0 to 90 degree range also covers the 180 to 270 degree range, and the 90 to 180 degree range also covers the 270 to 360 degree range. For example, when the first current has an amplitude of $(3^{1/2})/2$ and the second current has an amplitude of ½ and is in-phase with the first current, the potential magnetic field may have a direction along the 22.5 degree line shown in FIG. 30. When the first current has an amplitude of ½ and the second current has an amplitude of $(3^{1/2})/2$ and is 180 degrees out-of-phase from the first current, the potential magnetic field may have a direction along the 112.5 degree line shown in FIG. 30. When the first current has an amplitude of $1/(2^{1/2})$ and the second current has an amplitude of $1/(2^{1/2})$ and is 180 degrees out-of-phase from the first current, the potential magnetic field may have a direction along the 135 degree line shown in FIG. 30.

Accordingly, in non-limiting and non-exhaustive embodiments where the receiver coil 800 is positioned above the area of overlap between the first and second transmitting coils 100 and 200, and is oriented in a plane parallel to both the first and second transmitting coils 100 and 200, then there is an amplitude ratio and a relative phase difference (e.g., in-phase or 180 degrees out-of-phase) such that, if the first transmitting coil 100 is driven with a first current, the second transmitting coil 200 is driven with a second current, the ratio of an amplitude of the first current to an amplitude of the second current is the amplitude ratio, and the first and second currents are driven with the relative phase difference, a magnetic field will be generated by the first and second transmitting coils 100 and 200 that is aligned with the receiver coil 800. The wireless power transfer device 10 may be configured to determine the amplitude ratio and the relative phase difference as described herein.

Because the wireless power transfer device 10 is able to determine, and selectively generate, the magnetic field that will be directionally aligned with the receiver coil 800 at the receiver coil 800 (e.g., by being able to determine the amplitude ratio and the relative phase difference), the wireless power transfer device 10 can test the sufficiency of its position and/or orientation relative to the electronic device 20 faster. For example, as described herein (e.g., in the discussion of FIG. 11), a person in whom the electronic device 20 may be implanted may first find a suitable position and/or orientation of the wireless power transfer device 10 relative to the electronic device 20 before utilizing the wireless power transfer device 10 to charge the electronic device 20. The person may place the wireless power transfer device 10 at various positions and/or orientations relative to the electronic device 20 (e.g., the person may press the wireless power transfer device 10 against his or her body, such as against his or her outer skin or outer clothing, at various positions across his or her body near to where the person knows the electronic device 20 is approximately implanted at) and receive feedback information from the electronic device 20 regarding the rate of power transfer from the wireless power transfer device 10 to the electronic device 20 when the wireless power transfer device 10 generates a magnetic field aligned with the receiver coil 800.

In some embodiments, the wireless power transfer device 10 finds the magnetic field that is aligned with the receiver coil 800 by generating a plurality of preliminary magnetic fields (e.g., rotating through a range of preliminary magnetic fields) and receiving feedback data from the electronic device 20 regarding the rate of power transfer. The preliminary magnetic field associated with the highest rate of power transfer may be determined to be the magnetic field that is aligned with the receiver coil 800 for that position and/or orientation of the wireless power transfer device 10 relative to the electronic device 20. However, the process of testing the plurality of preliminary magnetic fields to determine which one is aligned with the receiver coil 800 before moving the wireless power transfer device 10 to another position and/or orientation can require an undesirably long period of time that can frustrate the person and increase the likelihood of error caused by the person accidentally or unintentionally moving the wireless power transfer device 10 while the wireless power transfer device 10 is testing the plurality of preliminary magnetic fields. Accordingly, in embodiments where the wireless power transfer device 10 is configured to determine the magnetic field that is aligned with the receiver coil 800 without testing the plurality of preliminary magnetic fields, the process of positioning and/or orienting the wireless power transfer device 10 prior to charging the electronic device 20 can be made faster, easier, and less prone to errors.

The wireless power transfer device 10 (e.g., the controller 600) may be configured to determine, from among the plurality of potential magnetic fields that the wireless power transfer device 10 is configured to generate, the magnetic field that has, at the receiver coil 800, a direction aligned with the receiver coil 800 based on at least one of (i) a gravity orientation of the wireless power transfer device 10 (e.g., a gravity orientation of the coil assembly 14 or of the first and second transmitting coils 100 and 200) relative to a gravity vector (e.g., a vector pointing along a direction parallel to a direction of gravity); (ii) a gravity orientation of the electronic device 20 (e.g., a gravity orientation of the receiver coil 800) relative to a gravity vector; (iii) a bodily orientation of the wireless power transfer device 10 (e.g., a bodily orientation of the coil assembly 14 or of the first and second transmitting coils 100 and 200) relative to a body that the electronic device 20 may be implanted in; (iv) a bodily orientation of the electronic device 20 (e.g., a bodily orientation of the receiver coil 800) relative to a body that the electronic device 20 may be implanted in; (v) information about a prior operation of the wireless power transfer device 10 that generated a prior magnetic field having, at the receiver coil 800, a direction aligned with the receiver coil 800; or (vi) first and second reflected loads (or first and second reflected impedances) in the first and second LC resonant circuits of the wireless power transfer device 10 that respectively include the first and second transmitting coils 100 and 200 (e.g., respectively including the first and second wires 110 and 210 of the first and second transmitting coils 100 and 200).

In some embodiments, the wireless power transfer device 10 is configured to determine the magnetic field (e.g., the amplitude ratio and the relative phase difference) based on the gravity orientation of the wireless power transfer device 10 (e.g., of the coil assembly 14 or of the first and second transmitting coils 100 and 200) and the gravity orientation of the electronic device 20 (e.g., of the receiver coil 800).

The wireless power transfer device 10 (e.g., the coil assembly 14) may include a first inertial measurement unit (IMU) 17 configured to measure the gravity orientation of the wireless power transfer device 10 (e.g., of the coil assembly 14 or of the first and second transmitting coils 100 and 200), and the wireless power transfer device 10 (e.g., the electronics assembly 16) may include a first memory 27 configured to store information (e.g., information received from the first IMU 17). The first IMU 17 may be communicatively coupled (e.g., through the cable 40) to the controller 600 and/or to a first memory 27, and the first memory 27 may be communicatively coupled to the controller 600. In some embodiments, the first IMU 17 is communicatively coupled to the first memory 27 through the controller 600. Thus, information about the gravity orientation of the wireless power transfer device 10 can be stored in the first memory 27 and utilized by the controller 600.

The electronic device 20 may include a second IMU 18 configured to measure the gravity orientation of the electronic device 20 (e.g., of the receiver coil 800), and the electronic device 20 may include a second memory 29 configured to store information (e.g., information received from the second IMU 18). The second IMU 18 may be communicatively coupled to the transmitter 1000 and/or to the second memory 29, and the second memory 29 may be communicatively coupled to the transmitter 1000. Thus, the information about the gravity orientation of the receiver coil 800 may be stored in the second memory 29 and/or transmitted via the transmitter 1000 to the wireless power transfer device 10 (e.g., to the controller 600). For example, the information about the gravity orientation of the receiver coil 800 may be transmitted to the wireless power transfer device 10 to be stored in the first memory 27 before being transmitted to the controller 600, or the information about the gravity orientation of the receiver coil 800 may be transmitted to the controller 600 from the second memory 29 without first being stored in the first memory 27.

The wireless power transfer device 10 may be configured to determine the magnetic field, for example, by determining a relative orientation of the receiver coil 800 relative to the first and second transmitting coils 100 and 200 based on the gravity orientation of the electronic device 20 (e.g., of the receiver coil 800) and the gravity orientation of the wireless power transfer device 10 (e.g., of the coil assembly 14 or of the first and second transmitting coils 100 and 200). Based on the relative orientation of the receiver coil 800, the wireless power transfer device 10 may be configured to determine the magnetic field (e.g., the amplitude ratio and the relative phase difference that will generate the magnetic field) having, at the receiver coil 800, a direction aligned with the receiver coil 800.

For example, if the wireless power transfer device 10 determines that the receiver coil 800 is parallel to the first transmitting coil 100, the wireless power transfer device 10 may determine that driving the first transmitting coil 100 with a first current and not driving the second transmitting coil 200 will generate a magnetic field that has, at the receiver coil 800, a direction aligned with the receiver coil 800. If the wireless power transfer device 10 determines that the receiver coil 800 is oriented in a plane parallel to the first and second transmitting coils 100 and 200 and at a 135 degree angle from the first transmitting coil 100 (see FIG. 30), then the wireless power transfer device 10 may determine that driving the first and second transmitting coils 100 and 200 with first and second currents having equal amplitudes (e.g., corresponding to an amplitude ratio of 1) and with a 180 degree relative phase difference will generate a magnetic field having, at the receiver coil 800, a direction aligned with the receiver coil 800.

In some embodiments, in response to determining that the receiver coil 800 (e.g., an axis of the receiver coil 800) is oriented in a plane nonparallel to the first and second transmitting coils 100 and 200, the wireless power transfer device 10 may estimate the relative orientation of the receiver coil 800 relative to the first and second transmitting coils 100 and 200 to be the relative orientation of a projection of the receiver coil 800 onto a plane parallel to the first and second transmitting coils 100 and 200.

In some embodiments, the wireless power transfer device 10 may be configured to determine the magnetic field (e.g., the amplitude ratio and the relative phase difference) based on the bodily orientation of the wireless power transfer device 10 (e.g., of the coil assembly 14 or of the first and second transmitting coils 100 and 200) and the bodily orientation of the electronic device 20 (e.g., or the receiver coil 800). For example, as explained herein, in some embodiments the electronic device 20 is an implantable medical device configured, for example, to provide stimulation (e.g., electrical stimulation) and/or to sense bodily information (e.g., biophysical characteristics, bioindicators, etc.).

In some embodiments, the bodily orientation of the receiver coil 800 and/or of the first and second transmitting coils 100 and 200 may include (e.g., be) an orientation relative to a reference axis of a portion of the body (e.g., a portion of the body where the electronic device 20 is implanted in). For example, the bodily orientation may include an orientation relative to a reference axis of a torso of the body, an axis of a neck of the body, or an axis of a limb (e.g., a leg or an arm) of the body. The torso axis of the body of a person may be a useful reference axis because this axis may reliably be substantially parallel to the gravity vector when the person is standing or sitting upright. The torso axis may extend in a direction parallel to a line intersecting a sagittal (or longitudinal) plane of the body and a coronal (or frontal) plane of the body, for example, in a direction perpendicular to a horizontal (or transverse) plane of the body. For example, the torso axis may be oriented along the line intersecting the sagittal plane and the coronal plane. In some embodiments, the reference axis is along a direction perpendicular to the sagittal plane, which can be a useful reference axis because it may reliably be substantially parallel to the ground (e.g., substantially perpendicular to a gravity direction) when the person is standing or sitting upright.

The electronic device 20 may be configured receive information about the bodily orientation of the receiver coil 800 and to store the information in the second memory 29. For example, the electronic device 20 may have a receiver or a transceiver configured to receive (e.g., wirelessly receive) the information about the bodily orientation of the receiver coil 800, and the receiver or the transceiver may be communicatively coupled to the second memory 29 so that the information about the bodily orientation of the receiver coil 800 can be stored in the second memory 29. In some embodiments, the transceiver of the electronic device 20 includes the transmitter 1000. Accordingly, the electronic device 20 may be configured to transmit the information about the bodily orientation of the receiver coil 800 to the wireless power transfer device 10 (e.g., to the controller 600) so that the wireless power transfer device 10 may determine, based on the bodily orientation of the receiver coil 800, the magnetic field having, at the receiver coil 800, a direction aligned with the receiver coil 800. The bodily orientation of the receiver coil 800 may be assumed to be substantially static (e.g., substantially static for at least a set period of time), and thus, the information about the bodily orientation of the receiver coil 800 may be relied upon by the wireless power transfer device 10 to determine the magnetic field even after the bodily orientation of the receiver coil 800 is received by the electronic device 20 and stored in the second memory 29. Because the electronic device 20 may be provided separately from the wireless power transfer device 10, the bodily orientation of the receiver coil 800 may be stored in the second memory 29 instead of in the first memory 27 of the wireless power transfer device 10.

In some embodiments, such as embodiments where the wireless power transfer device 10 and the electronic device 20 are provided together (e.g., sold together or collectively provided to a patient in whom the electronic device 20 is implanted from a physician or medical provided), the wireless power transfer device 10 is configured to receive (e.g., via the receiver 700) the information about the bodily orientation of the receiver coil 800 and to store the information about the bodily orientation of the receiver coil 800 in the first memory 27. For example, the receiver 700 may be communicatively coupled to the first memory 27. Storing the information about the bodily orientation of the receiver coil 800 in the first memory (instead of in the second memory 29) may be beneficial in the aspect that the electronic device 20 would not need to transmit the information to the wireless power transfer device 10 every time the wireless power transfer device 10 determines the magnetic field. Additionally, it may allow the electronic device 20 to be manufactured without the second memory 29 in some embodiments, thereby simplifying the manufacturing process and making it less expensive. The controller 600 may receive the information about the bodily orientation of the receiver coil 800 from the first memory 27 or from the second memory 29 in order to generate its determination of the magnetic field (e.g., of the amplitude ratio and the relative phase difference).

The information about the bodily orientation of the receiver coil 800 may be input into the first memory 27 and/or into the second memory 29 by, for example, a physician at the time of the electronic device 20 being implanted or at some time thereafter (e.g., during a follow up visit by the patient to determine if the electronic device 20 has moved since it was implanted) and via, for example, a physician programmer or controller communicatively coupled to the wireless power transfer device 10 and/or to the electronic device 20. The information about the bodily orientation of the receiver coil 800 may need to be updated periodically to account for unintended changes to the bodily orientation of the receiver coil 800 over time (e.g., after a sufficiently long time after the information about the bodily orientation was last input into the first memory 27 and/or into the second memory 29) or to account for changes to the bodily orientation of the receiver coil 800 caused by the person in whom the electronic device 20 is implanted (e.g., to account for changes resulting from twiddlers syndrome).

In some embodiments, the electronic device 20 may include the second IMU 18. The electronic device 20 may be configured, at a set time, to measure (by the second IMU 18) a gravity orientation of the receiver coil 800 relative to the gravity vector and to receive (e.g., from the physician programmer or the controller) information about the orientation of the body (e.g., the orientation of a reference axis of the body, such as a torso axis) relative to the gravity vector. The electronic device 20 (e.g., a controller of the electronic device 20) may be configured to define or estimate the bodily orientation of the receiver coil 800 (e.g., of the receiver coil 800 relative to the reference axis) based on the gravity orientation of the receiver coil 800 and the orientation of the body relative to the gravity vector at the set time. For example, the gravity orientation of the receiver coil 800 at the set time may be measured to be parallel to the gravity vector, the electronic device 20 may receive information that the reference axis (e.g., the torso axis) was parallel to the gravity vector at the set time (e.g., information that a person in whom the electronic device 20 is implanted was sitting or standing upright at the set time), and the electronic device 20 may therefore determine that the bodily orientation of the receiver coil 800 is parallel to the reference axis. In some other embodiments, the electronic device 20 (or the wireless power transfer device 10) may base its determination of the bodily orientation of the receiver coil 800 on an assumption that the receiver coil 800 is oriented in a plane parallel to (or in) the body's coronal plane. Therefore, the electronic device 20 may define or estimate the bodily orientation of the receiver coil 800 even if the gravity orientation of the receiver coil 800 is not parallel to the gravity vector. The electronic device 20 may be configured to store the bodily orientation of the receiver coil 800 in the second memory 29. In some embodiments, the gravity orientation of the receiver coil 800 and the information about the orientation of the body relative to the gravity vector may be transmitted to the wireless power transfer device 10, and the wireless power transfer device 10 (e.g., the controller 600) may be configured to determine the bodily orientation of the receiver coil 800 based on the gravity orientation of the receiver coil 800 and the information about the orientation of the body relative to the gravity vector.

In some embodiments, the bodily orientation of the wireless power transfer device 10 (e.g., of the coil assembly 14 or of the first and second transmitting coils 100 and 200) may be based on (e.g., assumed from) the configuration (e.g., shape, size, configurability to couple to a body, etc.) of the wireless power transfer device 10. The wireless power transfer device 10 may be configured to couple (e.g., attach) to the body such that, in response to the wireless power transfer device 10 being so coupled to the body, the first and second transmitting coils 100 and 200 have a substantially fixed bodily orientation relative to the body. For example, the wireless power transfer device 10 may be configured to fixedly couple to (e.g., lock onto) the body or may be configured to couple to the body in a manner such that it is configured to remain in place, for example, under the influence of gravity.

In some embodiments, the wireless power transfer device 10 includes the coil assembly 14, the electronics assembly 16, and the cable 40 coupled between the coil assembly 14 and the electronics assembly 16. The wireless power transfer device 10 may be configured to be fitted over a neck of the body so that the coil assembly 14 (e.g., the first and second transmitting coils 100 and 200) is positioned over a front or a back of the body with a substantially fixed orientation and/or position relative to the body. FIG. 31 shows an electronic device 20 implanted in a person's body according to an embodiment, and FIG. 32 shows an electronic device 20 implanted in a person's body according to another embodiment. The receiver coil 800 of the electronic device 20 is oriented perpendicular to the person's torso axis (perpendicular to the body's sagittal plane) in FIG. 31, and the receiver coil 800 is oriented parallel to the person's torso axis (perpendicular to the body's horizontal plane) in FIG. 32. Other orientations of the receiver coil 800 are also possible. For example, the receiver coil 800 can be oriented anywhere in a plane substantially parallel to the body's coronal plane. FIG. 33 shows a wireless power transfer device 10 coupled to a person's body according to an embodiment, and FIG. 34 shows another wireless power transfer device 10 coupled to a person's body according to another embodiment. The wireless power transfer device 10 can be fitted over the person's neck with the coil assembly 14 of the wireless power transfer device 10 positioned and oriented to cover the electronic device 20. FIG. 33 shows a magnetic field direction MFD of a magnetic field generated by the wireless power transfer 10 so that the magnetic field is aligned with the receiver coil 800 oriented in the person's body as shown in FIG. 31. FIG. 34 shows an embodiment where the coil assembly 14 includes the first IMU 17.

The wireless power transfer device 10 may be configured to determine the magnetic field (e.g., the amplitude ratio and the relative phase difference), for example, by determining a relative orientation of the receiver coil 800 relative to the first and second transmitting coils 100 and 200 based on the bodily orientation of the receiver coil 800 and the bodily orientation of the first and second transmitting coils 100 and 200. Based on the relative orientation of the receiver coil 800, the wireless power transfer device 10 may be configured to determine the magnetic field (e.g., the amplitude ratio and the relative phase difference that will generate the magnetic field) having, at the receiver coil 800, a direction aligned with the receiver coil 800.

For example, the bodily orientation of the receiver coil 800 may be parallel to torso axis of the body, the first and second transmitting coils 100 and 200 may have a bodily orientation where each of the first and second transmitting coils 100 and 200 are oriented 45 degrees relative to the torso axis, and the wireless power transfer device 10 may determine that the receiver coil 800 has a relative orientation relative to the first and second transmitting coils 100 and 200 of 45 degrees from each of the first and second transmitting coils 100 and 200. The wireless power transfer device 10 may thus determine the amplitude ratio to be a value of 1 and the relative phase difference to be 0 degrees (i.e., the first and second currents are to be driven in-phase). In some other examples, the bodily orientation of the receiver coil 800 may be oriented perpendicular to the body's sagittal plane, the first and second transmitting coils 100 and 200 may have a bodily orientation in a plane parallel to the body's coronal plane with the first transmitting coil 100 oriented in a direction perpendicular to the body's sagittal plane and with the second transmitting coil 200 oriented perpendicular to the first transmitting coil 100. The wireless power transfer device 10 may determine that the receiver coil 800 has a relative orientation relative to the first and second transmitting coils 100 and 200 of 0 degrees relative to the first transmitting coil 100 and 90 degrees relative to the second transmitting coil 200. The wireless power transfer device 10 may thus determine that driving the first transmitting coil 100 and not driving the second transmitting coil 200 will generate a magnetic field having a direction, at the receiver coil 800, aligned with the receiver coil 800.

In some embodiments, the wireless power transfer device 10 may assume in its determination of the magnetic field that the receiver coil 800 is oriented in a plane parallel to the first and second transmitting coils 100 and 200. For example, the wireless power transfer device 10 may assume that the receiver coil 800, as well as the first and second transmitting coils 100 and 200 (collectively), are oriented in planes parallel to the body's coronal plane or to the body's sagittal plane. In some embodiments, the wireless power transfer device 10 may be configured to determine that the receiver coil 800 is oriented in a plane parallel or nonparallel to the first and second transmitting coils 100 and 200. In response to determining that the receiver coil 800 is oriented in a plane nonparallel to the first and second transmitting coils 100 and 200, the wireless power transfer device 10 may be configured to estimate the relative orientation of the receiver coil 800 relative to the first and second transmitting coils 100 and 200 as the relative orientation of a projection of the receiver coil 800 (e.g., a projection of the axis of the receiver coil 800) onto a plane parallel to the first and second transmitting coils 100 and 200.

The wireless power transfer device 10 may be configured to determine the magnetic field (e.g., the amplitude ratio and the relative phase difference) based on the gravity orientation of the wireless power transfer device 10 and the bodily orientation of the electronic device 20 (e.g., of the receiver coil 800) relative to a body. For example, the wireless power transfer device 10 may be configured to determine a relative orientation of the receiver coil 800 relative to the first and second transmitting coils 100 and 200 based on the gravity orientation of the wireless power transfer device 10 and the bodily orientation of the receiver coil 800, and to determine the magnetic field based on the relative orientation of the receiver coil 800 in a similar or same manner as has been described hereinabove.

In some embodiments, the wireless power transfer device 10 is configured to determine (e.g., estimate) a gravity orientation of the receiver coil 800 based on the bodily orientation of the receiver coil 800 relative to a reference axis (e.g., a torso axis or an axis perpendicular to the body's sagittal plane), and to determine the relative orientation of the receiver coil 800 relative to the first and second transmitting coils 100 and 200 based on the gravity orientation of the receiver coil 800.

For example, the wireless power transfer device 10 may be configured to determine the gravity orientation of the receiver coil 800 based on the bodily orientation of the receiver coil 800 relative to the reference axis and the orientation of the body (e.g., based on the orientation of the reference axis) relative to a gravity vector.

In some embodiments, the wireless power transfer device 10 may determine the orientation of the reference axis relative to the gravity vector based on the gravity orientation of the first and second transmitting coils 100 and 200 (e.g., as measured by the first IMU). For example, if the reference axis is a torso axis, the wireless power transfer device 10 may be configured, in response to determining (e.g., via measuring the gravity orientation of the first and second transmitting coils 100 and 200 by the first IMU 17) that the first and second transmitting coils 100 and 200 are both parallel to a plane parallel to the gravity direction (e.g., a plane that a gravity vector lies within), to determine that the torso axis is parallel to the gravity vector. This determination may be based in some embodiments on the assumption that the wireless power transfer device 10 would be held against the body in a manner such that the first and second transmitting coils 100 and 200 are both parallel to a plane tangential to the outer surface of the torso, which, if the plane tangential to the outer surface of the body is parallel to the gravity direction, would indicate that the torso axis is parallel to the gravity vector.

In some other embodiments, if the reference axis is the torso axis, the wireless power transfer device 10 may be configured to determine the orientation of the reference axis relative to the gravity vector to be parallel to the gravity vector. This determination may be based in some embodiments on the assumption that the person is standing or sitting uprightly, for example, in embodiments where standard operating instructions of the wireless power transfer device 10 require that the person in whom the electronic device 20 is implanted be standing or sitting uprightly when charging the electronic device 20.

In some other embodiments, the wireless power transfer device 10 may be configured to determine the orientation of the reference axis (e.g., the torso axis) relative to the gravity vector based on an algorithm, for example, predicting when (e.g., what times during the day) the reference axis is oriented parallel to the gravity vector and when the reference axis is not oriented parallel to the gravity vector. The wireless power transfer device 10 may then determine (e.g., estimate) the gravity orientation of the receiver coil 800 based on a determination (e.g., via the algorithm and the current time of day) of the orientation of the reference axis relative to the gravity vector.

For example, the electronic device 20 may include the second IMU 18 and may be configured (e.g., via the second IMU 18 and a controller in the electronic device 20) to monitor and store, for example, in the second memory 29 and/or in the first memory 27, information about the gravity orientation of the body (e.g., about the orientation of the reference axis relative to the gravity vector) over time (e.g., over one or more days). As explained herein, in some embodiments, the bodily orientation of the receiver coil 800 is determined based on the gravity orientation of the receiver coil 800 and the gravity orientation of the body at the same set time. In some such embodiments, the electronic device 20 may be configured to determine the gravity orientation of the body at any particular time based on the gravity orientation of the body at the set time and a comparison between the gravity orientation of the receiver coil 800 at the set time and the gravity orientation of the receiver coil 800 at the particular time. The electronic device 20 may therefore be configured to determine, monitor, and store information about the orientation of the reference axis relative to the gravity vector over time. An algorithm may then be generated (e.g., by the controller 600 or by a controller of the electronic device 20), based on the monitored information about the orientation of the reference axis relative to the gravity vector, to predict the orientation of the reference axis relative to the gravity vector based on the time (e.g., current time). The gravity orientation of the receiver coil 800 may then be determined utilizing the algorithm and the time.

In some embodiments, the wireless power transfer device 10 is configured to determine the magnetic field (e.g., the amplitude ratio and the relative phase difference) based on the gravity orientation of the receiver coil 800 and the bodily orientation of the first and second transmitting coils 100 and 200.

In some embodiments, the wireless power transfer device 10 is configured to determine the magnetic field (e.g., the amplitude ratio and the relative phase difference) based on information about a prior operation of the wireless power transfer device 10, for example, a prior operation where the wireless power transfer device 10 generated a magnetic field at the receiver coil 800 that was aligned with the receiver coil. The information about the prior operation may include information about a prior magnetic field generated by the wireless power transfer device 10 during the prior operation that had, at the receiver coil 800, a direction aligned with the receiver coil 800. For example, the information about the prior magnetic field may include information about a prior amplitude ratio of an amplitude of a prior first current to an amplitude of a prior second current and of a relative phase difference between the prior first current and the prior second current. The prior first current and the prior second current may have been utilized during the prior operation to respectively drive the first and second transmitting coils 100 and 200 with the prior relative phase difference to generate the prior magnetic field.

The prior magnetic field that had, at the receiver coil 800, the direction aligned with the receiver coil 800, may have been determined by the wireless power transfer device to be aligned with the receiver coil 800 via any suitable manner, including any manner disclosed herein or within the scope of the present disclosure. For example, the wireless power transfer device 10 may have determined that the prior magnetic field was aligned with the receiver coil 800 by utilizing a feedback process as described herein. The feedback process may include generating, by the wireless power transfer device 10, a plurality of magnetic fields and receiving, from the electronic device 20 and for each of the plurality of magnetic fields, feedback information about how aligned the magnetic field was with the receiver coil 800 (e.g., information about a degree of alignment between the magnetic field and the receiver coil 800). The prior magnetic field may be determined by the wireless power transfer device 10 to be a magnetic field from among the plurality of magnetic fields that was determined (e.g., by the wireless power transfer device 10) to be most closely aligned with the receiver coil 800. During subsequent operations after the prior operation, the wireless power transfer device 10 can determine the magnetic field that will have, at the receiver coil 800, a direction aligned with the receiver coil 800 based on the information about the prior operation without needing to utilize the feedback process again. In some other embodiments, the wireless power transfer device 10 may have determined the prior magnetic field based on first and second reflected loads (or first and second reflected impedances) in the first and second LC resonant circuits of the wireless power transfer device 10, as described herein.

The information about the prior operation may include, in addition to the information about the prior magnetic field, information about a prior gravity orientation of the first and second transmitting coils 100 and 200. For example, the wireless power transfer device 10 may include the first IMU 17, and the prior gravity orientation of the first and second transmitting coils 100 and 200 may have been measured by the first IMU 17 and stored in the first memory 27. The wireless power transfer device 10 may be configured to determine the magnetic field having the direction at the receiver coil 800 aligned with the receiver coil 800 based on a gravity orientation (e.g., a current gravity orientation) of the first and second transmitting coils 100 and 200 and the information about the prior operation. For example, the wireless power transfer device 10 may be configured to measure, by the first IMU 17, the gravity orientation of the first and second transmitting coils 100 and 200, and to determine a coil angular difference between the gravity orientation of the first and second transmitting coils 100 and 200 and the prior gravity orientation of the first and second transmitting coils 100 and 200. The wireless power transfer device 10 may be configured to then determine that the magnetic field is a magnetic field having a direction at a set position (e.g., at a position above the area of overlap between the first and second transmitting coils 100 and 200) that has an magnetic field angular difference relative to a prior direction of the prior magnetic field at the set position that is equal to the coil angular difference. Accordingly, the wireless power transfer device 10 may be configured to account for angular changes of the wireless power transfer device 10 between the prior and current operations. In some embodiments, determining the coil angular difference may include assuming that the first and second transmitting coils 100 and 200 during the current operation are both parallel to a same reference plane that the first and second transmitting coils 100 and 200 were parallel to during the prior operation.

In some embodiments, the wireless power transfer device 10 may be configured to determine the magnetic field (e.g., the amplitude ratio and the relative phase difference) based on a bodily orientation (e.g., a current bodily orientation) of the first and second transmitting coils 100 and 200 and the information about the prior operation. For example, as explained herein, the wireless power transfer device 10 may be configured to couple to the body in which the electronic device 20 is implanted such that, when the wireless power transfer device 10 is so coupled to the body, the first and second transmitting coils 100 and 200 have a substantially fixed bodily orientation relative to the body. In some other embodiments, the wireless power transfer device 10 may be configured to assume that bodily orientation of the first and second transmitting coils 100 and 200 is a set bodily orientation relative to the body based, for example, on how the wireless power transfer device 10 is configured to be held or positioned and/or oriented relative to the body during operation, or on standard instructions for how the wireless power transfer device 10 should be held or positioned and/or oriented during operation. For example, the wireless power transfer device 10 may have an orientation indicator configured to visually indicate how the wireless power transfer device 10 (and thus, the first and second transmitting coils 100 and 200) should be oriented relative to the body during operation. In some embodiments, the wireless power transfer device 10 may have a disc shape with an orientation indicator at a position around the perimeter of the disc shape to indicate that the wireless power transfer device 10 should be oriented relative to the body such that the orientation indicator is positioned closest to a head of the body.

The wireless power transfer device 10 may thus be configured to determine that the magnetic field that will be aligned with the receiver coil 800 is the same as the prior magnetic field. This can be based on an assumption that the first and second transmitting coils 100 and 200 have a same orientation relative to the receiver coil 800 as they had during the prior operation, which can derive from the assumption that the bodily orientation of each of the receiver coil 800 and of the first and second transmitting coils 100 and 200 is the same as during the prior operation.

In some embodiments, the wireless power transfer device 10 may be configured to determine the magnetic field that will be aligned with the receiver coil 800 based on first and second reflected loads (or first and second reflected impedances) in the first and second LC resonant circuits of the wireless power transfer device 10. As described above, the first LC resonant circuit may include the first transmitting coil 100 (e.g., the first wire 110 of the first transmitting coil 100) and the first capacitor C1, and the second LC resonant circuit may include the second transmitting coil 200 (e.g., the second wire 210 of the second transmitting coil 200). The electronic device 20 may include the third LC resonant circuit including the receiver coil 800 (e.g., the receiver wire 810 of the receiver coil 800) and the fifth capacitor C5.

During driving of the first and second transmitting coils 100 and 200, the amplitude of the first current through the first transmitting coil 100 may be proportional to a first bus voltage provided by the first power modulation electronics 510 to the first driver 410, and the amplitude of the second current through the second transmitting coil 200 may be proportional to a second bus voltage provided by the second power modulation electronics 520 to the second driver 420. The first and second drivers 410 and 420 may respectively provide the first and second currents to the first and second transmitting coils 100 and 200 based, respectively, on the first and second bus voltages.

The amplitudes of the first and second currents respectively in the first and second transmitting coils 100 and 200 may also be affected by a reflected load (or reflected impedance) in each of the first and second LC resonant circuits that respectively results from the receiver coil 800 being coupled with the first and second transmitting coils 100 and 200. When the magnetic field generated by the first and second transmitting coils 100 and 200 has, at the receiver coil 800, a direction aligned with the receiver coil 800, the effect on the first and second currents resulting from the receiver coil 800 can be substantially the same. Accordingly, when the magnetic field generated by the first and second transmitting coils 100 and 200 has, at the receiver coil 800, the direction aligned with the receiver coil 800, a voltage ratio of the first bus voltage to the second bus voltage can be substantially the same as an amplitude ratio of the amplitude of the first current in the first transmitting coil 100 (e.g., as measured by the first current sensor 24) to the amplitude of the second current in the second transmitting coil 200 (e.g., as measured by the second current sensor 25). However, when the magnetic field generated by the first and second transmitting coils 100 and 200 has a direction at the receiver coil 800 that is not aligned with the receiver coil 800, the effect on the first and second currents resulting from the receiver coil 800 may differ, and the voltage ratio may differ from the amplitude ratio.

Accordingly, in some embodiments, the wireless power transfer device 10 may be configured to differentially drive the first and second transmitting coils 100 and 200 to generate a plurality of directionally different preliminary magnetic fields. In some embodiments, the wireless power transfer device 10 is configured to generate the plurality of preliminary magnetic fields to have different directions within a range of directions and at a set position (e.g., at the receiver coil 800 or at a position above an area of overlap between the first and second transmitting coils 100 and 200). For example, the wireless power transfer device 10 may be configured to generate the plurality of preliminary magnetic fields having directions at the set position that form an angle relative to one of the first and second transmitting coils 100 and 200 (e.g., relative to the first transmitting coil 100) that sequentially get larger as the preliminary magnetic fields are sequentially generated. Accordingly, the wireless power transfer device 10 can scan through a range of angles (e.g., 90 degrees or 180 degrees) via step changes in angle.

For each of the preliminary magnetic fields, the wireless power transfer device 10 may be configured to generate a corresponding comparison between a corresponding first reflected load (or first reflected impedance) in the first LC resonant circuit resulting from the receiver coil 800 and a corresponding second reflected load (or second reflected impedance) in the second LC resonant circuit resulting from the receiver coil 800. The wireless power transfer device 10 may be configured to determine the magnetic field (e.g., the amplitude ratio and the relative phase difference) based on the plurality of comparisons.

In some embodiments, for each of the preliminary magnetic fields, the wireless power transfer device may be configured to generate a corresponding comparison between (i) a corresponding preliminary voltage ratio of a corresponding first preliminary bus voltage provided by the first power modulation electronics 510 to a corresponding second preliminary bus voltage provided by the second variable power supply 520, and (ii) a corresponding preliminary amplitude ratio of an amplitude of a corresponding first preliminary current in the first transmitting coil 100 to an amplitude of a corresponding second preliminary current provided in the second transmitting coil 200. The wireless power transfer device 10 (e.g., the controller 600) may be configured to determine the magnetic field (e.g., the amplitude ratio and the relative phase difference) based on the plurality of comparisons.

The controller 600 may be configured to determine the first and second preliminary bus voltages based on the signals transmitted by the controller 600 to the first and second power modulation electronics 510 and 520. In some other embodiments, the controller 600 may be configured to receive feedback voltages (e.g., the first and second preliminary bus voltages) from the first and second power modulation electronics 510 and 520 and to determine the first and second preliminary bus voltages based on the feedback voltages received from the first and second power modulation electronics 510 and 520. In some embodiments, the first and second current sensors 24 and 25 may respectively be configured to measure the first and second preliminary currents in the first and second transmitting coils 100 and 200, and the controller 600 may be configured to receive the first and second preliminary currents from the first and second current sensors 24 and 25.

In some embodiments, the generating the corresponding comparison between the corresponding preliminary voltage ratio and the corresponding preliminary amplitude ratio includes generating a difference between the corresponding preliminary voltage ratio and the corresponding preliminary amplitude ratio. For example, the controller 600 may be configured to subtract a smaller one of the corresponding preliminary voltage ratio and the corresponding preliminary amplitude ratio from a larger one of the corresponding preliminary voltage ratio and the corresponding preliminary amplitude. In some other embodiments, the controller 600 may be configured to generate an absolute value of the difference between the corresponding preliminary voltage ratio and the corresponding preliminary amplitude. The controller 600 may determine that the magnetic field corresponds to (e.g., is the same as) the preliminary magnetic field whose corresponding comparison is smallest (or closest to zero) from among the plurality of comparisons.

In some embodiments, the generating the corresponding comparison between the corresponding preliminary voltage ratio and the corresponding preliminary amplitude ratio includes generating a ratio between the corresponding preliminary voltage ratio and the corresponding preliminary amplitude ratio. For example, the controller 600 may be configured to divide a larger one of the corresponding preliminary voltage ratio and the corresponding preliminary amplitude ratio from a smaller one of the corresponding preliminary voltage ratio and the corresponding preliminary amplitude (or vice versa). In some other embodiments, the controller 600 may be configured to always divide the corresponding preliminary voltage ratio from the corresponding preliminary amplitude ratio (or vice versa). The controller 600 may determine that the magnetic field corresponds to (e.g., is the same as) the preliminary magnetic field whose corresponding comparison is smallest (or closest to one) from among the plurality of comparisons.

The wireless power transfer device 10 may therefore be able to determine the magnetic field (e.g., the amplitude ratio and the relative phase difference) based on the reflected loads (or the reflected impedances) in the first and second LC resonant circuits, for example, without knowing the gravity orientation or the bodily orientation of either the wireless power transfer device 10 (e.g., of the first and second transmitting coils 100 and 200) or the electronic device 20 (e.g., of the receiver coil 800).

For each function, process, or operation that the wireless power transfer device 10 is disclosed herein as being configured to perform, the wireless power transfer device 10 may be configured in some embodiments to perform the function, process, or operation in response to executing (e.g., via the controller 600) computer-readable instructions for performing the function, process, or operation and that are stored in a memory (e.g., the first memory 27). For example, generating determinations, executing algorithms, etc. that the wireless power transfer device 10 is disclosed herein as being configured to do may be done by the wireless power transfer device 10 in response to executing computer-readable instructions that are stored in the memory and are for generating such determinations, executing such algorithms, etc. For each function, process, or operation that the electronic device 20 is disclosed herein as being configured to perform, the electronic device 20 may be configured in some embodiments to perform the function, process, or operation in response to executing (e.g., via a controller of the electronic device 20) computer-readable instructions for performing the function, process, or operation and that are stored in a memory (e.g., the second memory 29).

The system and/or any other relevant devices or components according to embodiments of the present invention described herein may be implemented utilizing any suitable hardware, firmware (e.g. an application-specific integrated circuit), software, or a combination of software, firmware, and hardware. For example, the various components of the system may be formed on one integrated circuit (IC) chip or on separate IC chips. Further, the various components of the system may be implemented on a flexible printed circuit film, a tape carrier package (TCP), a printed circuit board (PCB), or formed on one substrate. Further, the various components of the system may be a process or thread, running on one or more processors, in one or more computing devices, executing computer program instructions and interacting with other system components for performing the various functionalities described herein. The computer program instructions are stored in a memory which may be implemented in a computing device utilizing a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although some embodiments of the present disclosure have disclosed herein, the present disclosure is not limited thereto, and the scope of the present disclosure is defined by the appended claims and equivalents thereof.

What is claimed is:

1. A wireless power transfer system comprising:
   a wireless power transfer device, the wireless power transfer device comprising:
   a first transmitting coil oriented along a first axis,
   a second transmitting coil on the first transmitting coil, oriented along a second axis different from the first axis, and spaced, in an area of overlap between the first and second transmitting coils, from the first transmitting coil along a third direction perpendicular to both the first and second axes,
   a non-magnetic material between the first and second transmitting coils along the third direction and in the area of overlap such that the second transmitting coil is magnetically decoupled from the first transmitting coil in the area of overlap, and
   a controller configured to differentially control driving of the first and second transmitting coils,
   wherein the controller is configured to determine an amplitude ratio such that, in response to the first transmitting coil being driven with a first current having a first amplitude, the second transmitting coil being driven with a second current having a second amplitude, and a ratio of the first amplitude to the second amplitude is the amplitude ratio, the wireless power transfer device generates a magnetic field having a direction, at a receiver coil of an electronic device, that is aligned with the receiver coil.

2. The wireless power transfer system of claim 1, wherein the wireless power transfer device comprises a first inertial measurement unit (IMU) configured to measure a gravity orientation of the first and second transmitting coils relative to a gravity vector, and the controller is configured to determine the amplitude ratio based on the gravity orientation of the first and second transmitting coils.

3. The wireless power transfer system of claim 2, wherein the electronic device comprises:
   a second IMU sensor configured to measure a gravity orientation of the receiver coil relative to a gravity vector; and
   a transmitter configured to transmit information about the gravity orientation of the receiver coil to the wireless power transfer device, and
   wherein the controller is configured to determine the amplitude ratio based on the gravity orientation of the first and second transmitting coils and the gravity orientation of the receiver coil.

4. The wireless power transfer system of claim 2, wherein the electronic device is an implantable medical device, and the controller is configured to determine the amplitude ratio based on the gravity orientation of the first and second transmitting coils and a bodily orientation of the receiver coil relative to a body in which the electronic device is implanted.

5. The wireless power transfer system of claim 4, wherein:
the wireless power transfer device comprises a first memory and is configured to receive, and to store in the first memory, information about the bodily orientation of the receiver coil, or
the electronic device comprises a second memory, is configured to receive, and to store in the second memory, information about the bodily orientation of the receiver coil, and comprises a transmitter configured to transmit the information about the bodily orientation of the receiver coil to the wireless power transfer device.

6. The wireless power transfer system of claim 2, wherein the controller is configured to determine the amplitude ratio based on the gravity orientation of the first and second transmitting coils and information about a prior operation, the information about the prior operation comprising:
Information about a prior gravity orientation of the first and second transmitting coils; and
Information about a prior amplitude ratio of an amplitude of a prior first current to an amplitude of a prior second current, the prior first current and the prior second current being utilized during the prior operation to respectively drive the first and second transmitting coils, while the first and second transmitting coils had the prior gravity orientation, to generate a prior magnetic field having a direction at the receiver coil that was aligned with the receiver coil.

7. The wireless power transfer system of claim 1, wherein the electronic device is an implantable medical device, and
wherein the wireless power transfer device is configured to couple to a body in which the implantable medical device is implanted such that, when the wireless power transfer device is so coupled to the body, the first and second transmitting coils have a substantially fixed bodily orientation relative to the body.

8. The wireless power transfer system of claim 7, wherein the controller is configured to determine the amplitude ratio based on the bodily orientation of the first and second transmitting coils and a bodily orientation of the receiver coil relative to the body.

9. The wireless power transfer system of claim 7, wherein the controller is configured to determine the amplitude ratio based on the bodily orientation of the first and second transmitting coils and information about a prior operation, the information about the prior operation comprising a prior amplitude ratio of an amplitude of a prior first current to an amplitude of a prior second current, the prior first current and the prior second current being utilized during the prior operation to respectively drive the first and second transmitting coils to generate a prior magnetic field having a direction at the receiver coil aligned with the receiver coil.

10. The wireless power transfer system of claim 7, wherein the wireless power transfer device comprises a coil assembly comprising the first and second transmitting coils and an electronics assembly comprising at least one electronics component and being coupled to the coil assembly via a cable, and
wherein the wireless power transfer device is configured to be fitted over a neck of the body so that the coil assembly is positioned over a front or a back of the body with a substantially fixed orientation relative to the body.

11. The wireless power transfer system of claim 1, wherein the controller is configured to determine, together with the amplitude ratio, a relative phase difference such that, in response to the first and second transmitting coils being respectively driven with the first and second currents, and the first and second currents being phase shifted relative to each other by the relative phase difference, the wireless power transfer device generates the magnetic field having the direction, at the receiver coil, that is aligned with the receiver coil.

12. The wireless power transfer system of claim 1, wherein the wireless power transfer device comprises:
a first current sensor configured to measure current in the first transmitting coil;
a first driver configured to provide current to the first transmitting coil based on a first bus voltage;
a first variable power supply configured to provide the first bus voltage to the first driver;
a second current sensor configured to measure current in the second transmitting coil;
a second driver configured to provide current to the second transmitting coil based on a second bus voltage;
a second variable power supply configured to provide the second bus voltage to the second driver; and
wherein the controller is configured to differentially control the driving of the first and second transmitting coils to generate a plurality of directionally different preliminary magnetic fields and to generate, for each of the plurality of preliminary magnetic fields, a corresponding comparison between:
a corresponding preliminary voltage ratio of a corresponding first preliminary bus voltage provided by the first variable power supply to a corresponding second preliminary bus voltage provided by the second variable power supply; and
a corresponding preliminary amplitude ratio of an amplitude of a corresponding first preliminary current provided by the first driver and measured by the first current sensor to an amplitude of a corresponding second preliminary current provided by the second driver and measured by the second current sensor, and
wherein the controller determines the amplitude ratio based on the plurality of corresponding comparisons.

13. The wireless power transfer system of claim 12, wherein each of the plurality of corresponding comparisons comprises an absolute value of a difference between the corresponding preliminary voltage ratio and the corresponding preliminary amplitude ratio, and the controller determines the amplitude ratio based on which of the plurality of corresponding comparisons is smallest.

14. The wireless power transfer system of claim 1, further comprising the electronic device.

15. A wireless power transfer system, comprising:
a wireless power transfer device comprising:
a first transmitting coil oriented along a first axis, and
a second transmitting coil oriented along a second axis different from the first axis, wherein the second transmitting coil is above, and is magnetically decoupled from, the first transmitting coil at an area of overlap between the first and second transmitting coils,
wherein the wireless power transfer device is configured:

to determine a magnetic field, from among a plurality of directionally different potential magnetic fields that the wireless power transfer device is configured to generate, that has, at a receiver coil of an electronic device, a direction aligned with the receiver coil, and to selectively generate the magnetic field.

16. The wireless power transfer system of claim 15, wherein the wireless power transfer device is configured, via a first inertial measurement unit (IMU), to measure a gravity orientation of the wireless power transfer device relative to a gravity vector, and to determine the magnetic field based on the gravity orientation of the wireless power transfer device.

17. The wireless power transfer system of claim 16, wherein the electronic device is configured, via a second IMU, to measure a gravity orientation of the receiver coil relative to a gravity vector, and to transmit information about the gravity orientation of the receiver coil to the wireless power transfer device, and
wherein the wireless power transfer device is configured to determine the magnetic field based on the gravity orientation of the wireless power transfer device and the gravity orientation of the receiver coil.

18. The wireless power transfer system of claim 16, wherein the electronic device is an implantable medical device, and the wireless power transfer device is configured to determine the magnetic field based on the gravity orientation of the wireless power transfer device and a bodily orientation of the receiver coil relative to a body in which the electronic device is implanted.

19. The wireless power transfer system of claim 16, wherein the wireless power transfer device is configured to determine the magnetic field based on the gravity orientation of the wireless power transfer device and information about a prior operation of the wireless power transfer device, the information about the prior operation comprising:
information about a prior gravity orientation of the wireless power transfer device relative to a gravity vector; and
information about a prior magnetic field generated by the wireless power transfer device, while the wireless power transfer device had the prior gravity orientation, and having a direction at the receiver coil aligned with the receiver coil.

20. The wireless power transfer device of claim 15, wherein the electronic device is an implantable medical device,
wherein the wireless power transfer device is configured to couple to a body in which the implantable medical device is implanted such that, when the wireless power transfer device is so coupled to the body, the wireless power transfer device has a substantially fixed bodily orientation relative to the body, and
wherein the wireless power transfer device is configured to determine the magnetic field based on the bodily orientation of the wireless power transfer device.

21. The wireless power transfer device of claim 15, wherein the wireless power transfer device comprises a first LC resonant circuit comprising the first transmitting coil, and a second LC resonant circuit comprising the second transmitting coil,
wherein the wireless power transfer device is configured to differentially drive the first and second transmitting coils to generate a plurality of directionally different preliminary magnetic fields,
wherein, for each of the plurality of preliminary magnetic fields, the wireless power transfer device is configured to generate a corresponding comparison between:
a reflected load in the first LC resonant circuit; and
a reflected load in the second LC resonant circuit, and
wherein the wireless power transfer device is configured to determine the magnetic field based on the plurality of corresponding comparisons.

22. The wireless power transfer device of claim 15, further comprising the electronic device.

23. A method for transferring power from a wireless power transfer device, the method comprising:
determining, by a wireless power transfer device, a magnetic field from among a plurality of directionally different potential magnetic fields that the wireless power transfer device is configured to generate that has, at a receiver coil of an electronic device, a direction aligned with the receiver coil; and
selectively generating, by the wireless power transfer device, the magnetic field to wirelessly transfer power to the electronic device via the magnetic field,
wherein the wireless power transfer device comprises a first transmitting coil oriented along a first axis, and a second transmitting coil oriented along a second axis different from the first axis, and
wherein the second transmitting coil is above, and is magnetically decoupled from, the first transmitting coil at an area of overlap between the first and second transmitting coils.

24. The method of claim 23, further comprising measuring, by a first inertial sensor unit (IMU) of the wireless power transfer device, a gravity orientation of the wireless power transfer device relative to a gravity vector,
wherein the determining the magnetic field is based on the gravity orientation of the wireless power transfer device.

25. The method of claim 24, further comprising:
measuring, by a second IMU of the electronic device, a gravity orientation of the receiver coil relative to a gravity vector; and
transmitting information about the gravity orientation of the receiver coil to the wireless power transfer device,
wherein the determining the magnetic field is based on the gravity orientation of the wireless power transfer device and the gravity orientation of the receiver coil.

26. The method of claim 24, wherein the electronic device is an implantable medical device, and the determining the magnetic field is based on the gravity orientation of the wireless power transfer device and a bodily orientation of the receiver coil relative to a body in which the electronic device is implanted.

27. The method of claim 26, wherein the method further comprises:
inputting, into a first memory of the wireless power transfer device, information about the bodily orientation of the receiver coil; or
inputting, into a second memory of the electronic device, information about the bodily orientation of the receiver coil, and transmitting the information about the bodily orientation of the receiver coil from the electronic device to the wireless power transfer device.

28. The method of claim 24, further comprising:
measuring, by the wireless power transfer device, a first gravity orientation of the wireless power transfer device;
generating, by the wireless power transfer device and while the wireless power transfer device has the first gravity orientation, a first magnetic field having a direction at the receiver coil that is aligned with the receiver coil; and storing, by the wireless power transfer device and in a memory of the wireless power transfer device, information about the first gravity orientation and the first magnetic field, wherein the determining the magnetic field is based on the gravity orientation of the wireless power transfer device, the first gravity orientation of the wireless power transfer device, and the first magnetic field.

29. The method of claim 23, wherein the electronic device is an implantable medical device implanted in a body, the wireless power transfer device is coupled to the body with a substantially fixed bodily orientation relative to the body, and the determining the magnetic field is based on the bodily orientation of the wireless power transfer device.

30. The method of claim 29, wherein the determining the magnetic field is based on:

the bodily orientation of the wireless power transfer device and a bodily orientation of the receiver coil; or the bodily orientation of the wireless power transfer device and information about a prior magnetic field generated by the wireless power transfer device having a direction at the receiver coil aligned with the receiver coil.

31. The method of claim 23, wherein the wireless power transfer device comprises a first resonant circuit comprising the first transmitting coil, and a second resonant circuit comprising the second transmitting coil, wherein the method further comprises:

differentially driving the first and second transmitting coils to generate a plurality of directionally different preliminary magnetic fields; and generating, for each of the plurality of preliminary magnetic fields, a comparison between a reflected load in the first resonant circuit and a reflected load in the second resonant circuit, and wherein the determining the magnetic field is based on the plurality of corresponding comparisons.

32. The method of claim 23, wherein determining the magnetic field comprises determining an amplitude ratio and a relative phase difference such that, when the first transmitting coil is driven with a first current having a first amplitude, the second transmitting coil is driven with a second current having a second amplitude, a ratio of the first amplitude to the second amplitude is the amplitude ratio, and the first and second currents are phase shifted away from each other by the relative phase difference, the wireless power transfer device generates the magnetic field having the direction at the receiver coil aligned with the receiver coil.

* * * * *